US006963296B2

(12) United States Patent
Oki et al.

(10) Patent No.: US 6,963,296 B2
(45) Date of Patent: Nov. 8, 2005

(54) RECORDING METHOD, RECORDING APPARATUS, TRANSMITTING APPARATUS, REPRODUCING METHOD, REPRODUCING APPARATUS, RECEIVING APPARATUS, RECORDING MEDIUM, AND TRANSMISSION MEDIUM

(75) Inventors: Tsuyoshi Oki, Kanagawa-ken (JP); Atsushi Hayami, Kanagawa-ken (JP)

(73) Assignee: Victor Company of Japan, Limited, Yokohama (JP)

( * ) Notice: Subject to any disclaimer, the term of this patent is extended or adjusted under 35 U.S.C. 154(b) by 496 days.

(21) Appl. No.: 10/073,397

(22) Filed: Feb. 12, 2002

(65) Prior Publication Data

US 2002/0110071 A1 Aug. 15, 2002

(30) Foreign Application Priority Data

Feb. 13, 2001 (JP) .................................... P2001-035717
Jun. 25, 2001 (JP) .................................... P2001-191947

(51) Int. Cl.[7] ................................................ H03M 7/00
(52) U.S. Cl. ......................................... 341/106; 341/59
(58) Field of Search ........................... 341/106, 59, 58, 341/102; 369/59.23, 275.3; 714/769, 784, 795

(56) References Cited

U.S. PATENT DOCUMENTS 5,748,119 A * 5/1998 Ko ............................. 341/59
5,912,869 A * 6/1999 Tanaka et al. ........... 369/59.23
6,175,943 B1 * 1/2001 Yim ........................... 714/769
6,266,318 B1 * 7/2001 Honda et al. ............ 369/275.3
6,297,753 B1 * 10/2001 Hayami ....................... 341/59
6,718,510 B2 * 4/2004 Kojima ........................ 714/784
6,732,328 B1 * 5/2004 McEwen et al. ............ 714/795
6,772,386 B2 * 8/2004 Iwata et al. ................. 714/755

FOREIGN PATENT DOCUMENTS

JP 2000-286709 10/2000

* cited by examiner

*Primary Examiner*—Patrick Wamsley
(74) *Attorney, Agent, or Firm*—Nath & Associates PLLC; Gregory B. Kang; Teresa M. Arroyo

(57) ABSTRACT

There is disclosed a recording method for performing a DSV control while recording a recording signal generated by inserting a synchronous signal for decoding reproduction data into every predetermined number of code words in a code word string satisfying a predetermined run length restriction rule and to be outputted into a recording medium, when a plurality of coding tables are used to convert an input data word of p-bits to a code word of q-bits (q>p), and the code word string obtained by directly coupling the code words is recorded and reproduced in a recording medium such as an optical disk and magnetic disk, or transmitted via a transmitting portion, wherein the p-bits are 8 bits, the q-bits are 15 bits, and the predetermined run length restriction rule stipulates that a minimum run length of the signal obtained by NRZI-converting the code word excluding the synchronous signal is 3T, and a maximum run length is any one of 11T, 12T, 13T, and 14T.

3 Claims, 30 Drawing Sheets

STRUCTURE OF DATA SECTOR OF RECORDING MEDIUM 20 ACCORDING TO FIRST EMBODIMENT

FIG.8A
9-ROWS BURST ERROR ON RECORDING MEDIUM 20 OF SECOND EMBODIMENT
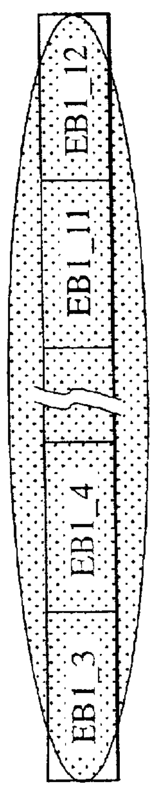
ERROR DISTRIBUTION OF ECC BLOCK AFTER DE-INTERLEAVE WHEN RECORDING MEDIUM OF SECOND EMBODIMENT IS REPRODUCED
ECC BLOCK
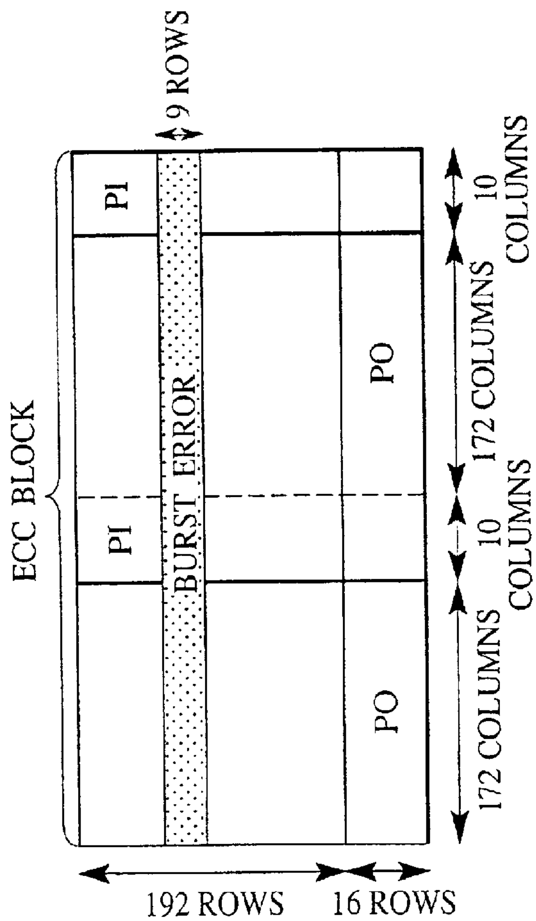
FIG.8B
18-ROWS BURST ERROR ON CONVENTIONAL RECORDING MEDIUM
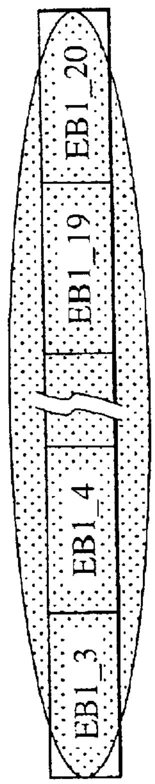
ERROR OF ECC BLOCK AFTER DE-INTERLEAVE WHEN CONVENTIONAL RECORDING MEDIUM IS REPRODUCED
ECC BLOCK
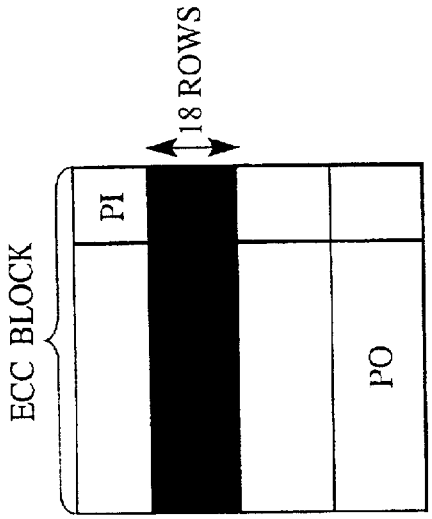

STRUCTURE OF DATA SECTOR OF RECORDING MEDIUM 20 ACCORDING TO SECOND EMBODIMENT 8-15 MODULATOR 12

FIG. 13

CODING TABLE 123

| INPUT WORD | TABLE OF STATUS "0" | | "1" | | "2" | | "3" | | "4" | | "5" | |
|---|---|---|---|---|---|---|---|---|---|---|---|---|
| 0 | 000000000100000 | 4 | 001000010000000 | 4 | 000000000100000 | 4 | 001001000000000 | 4 | 010010001000100 | 4 | 100001000000000 | 4 |
| 1 | 000000000100000 | 5 | 001000010000000 | 3 | 000000000100000 | 5 | 001001000000000 | 5 | 010010001000100 | 5 | 100001000000000 | 5 |
| 2 | 000000000100001 | 0 | 000010000000001 | 0 | 000000000100001 | 0 | 001001001001001 | 0 | 010010010001001 | 0 | 100001000001000 | 1 |
| 3 | 000000000100001 | 1 | 000010000000001 | 1 | 000000000100001 | 1 | 001001001001001 | 1 | 010010010001001 | 1 | 100001000001000 | 3 |
| 4 | 000000000100100 | 1 | 000010000000010 | 1 | 000000000100100 | 1 | 001001000100000 | 1 | 010010010010000 | 1 | 100001000001000 | 4 |
| 5 | 000000000100100 | 3 | 000010000000010 | 2 | 000000000100100 | 3 | 001001000100000 | 3 | 010010010010000 | 3 | 100001000001000 | 5 |
| 6 | 000000000100100 | 4 | 000010000000010 | 3 | 000000000100100 | 4 | 001001000100000 | 4 | 010010010010000 | 4 | 100001000001001 | 0 |
| 7 | 000000000100100 | 5 | 000010000000100 | 1 | 000000000100100 | 5 | 001001000100000 | 5 | 010010010010000 | 5 | 100001000001001 | 1 |
| 8 | 000000001000000 | 1 | 000010000000100 | 3 | 000000001000000 | 1 | 001001001000100 | 1 | 010010001000100 | 1 | 100001000010000 | 1 |
| 9 | 000000001000000 | 3 | 000010000000100 | 4 | 000000001000000 | 3 | 001001001000100 | 3 | 010010001000100 | 3 | 100001000010000 | 3 |
| 10 | 000000001000000 | 4 | 000010000000100 | 5 | 000000001000000 | 4 | 001001001000100 | 4 | 010001000000000 | 4 | 100001000010000 | 4 |
| 11 | 000000001000000 | 5 | 000010000001000 | 1 | 000000001000000 | 5 | 001001001000100 | 5 | 010001000000000 | 5 | 100001000010000 | 5 |
| 12 | 000001001000000 | 1 | 000010000001000 | 3 | 000001001000000 | 1 | 001001001000000 | 1 | 100000000001000 | 1 | 100001000010001 | 0 |
| 13 | 000001001000000 | 3 | 000010000001000 | 4 | 000001001000000 | 3 | 001001001000000 | 3 | 100000000001000 | 3 | 100001000010001 | 1 |
| 14 | 000001001000000 | 4 | 000010000001000 | 5 | 000001001000000 | 4 | 001001001000000 | 4 | 100000000001000 | 4 | 100001000010010 | 1 |
| 15 | 000001001000000 | 5 | 000010000001001 | 0 | 000001001000000 | 5 | 001001001000000 | 5 | 100000000001000 | 5 | 100001000010010 | 2 |
| 16 | 000000001001001 | 0 | 000010000001001 | 1 | 000000001001001 | 0 | 001001000010001 | 0 | 100000000010001 | 0 | 100001000010010 | 3 |
| 17 | 000000001001001 | 1 | 001000000100100 | 1 | 000000001001001 | 1 | 001001000010001 | 1 | 100000000010001 | 1 | 100001000100000 | 1 |
| 18 | 000000100010010 | 1 | 001000000100100 | 3 | 000000100010010 | 1 | 001001000010010 | 1 | 100000000010010 | 1 | 100001000100000 | 3 |
| 19 | 000000100010010 | 2 | 001000000100100 | 4 | 000000100010010 | 2 | 001001000010010 | 2 | 100000000010010 | 2 | 100001000100000 | 4 |
| 20 | 000000100010010 | 3 | 001000000100100 | 5 | 000000100010010 | 3 | 001001000010010 | 3 | 100000000010010 | 3 | 100001000100000 | 5 |
| 21 | 000000010001001 | 0 | 000010000010001 | 0 | 000000010001001 | 0 | 001001000100001 | 0 | 100000000001001 | 0 | 100001000100001 | 0 |
| 22 | 000000010001001 | 1 | 000010000010001 | 1 | 000000010001001 | 1 | 001001000100001 | 1 | 100000000001001 | 1 | 100001000100001 | 1 |
| 23 | 000000010010010 | 1 | 000010000010010 | 1 | 000000010010010 | 1 | 001001000100010 | 1 | 100000000100010 | 1 | 100001000100010 | 1 |
| 24 | 000000010010010 | 2 | 000010000010010 | 2 | 000000010010010 | 2 | 001001000100010 | 2 | 100000000100010 | 2 | 100001000100010 | 2 |
| 25 | 000000010010010 | 3 | 000010000010010 | 3 | 000000010010010 | 3 | 001001000100010 | 3 | 100000000100010 | 3 | 100001000100010 | 3 |
| 26 | 000000100100100 | 1 | 000010000100000 | 1 | 000000100100100 | 1 | 001001000100100 | 1 | 010010010000100 | 1 | 100001000100100 | 1 |
| 27 | 000000100100100 | 3 | 000010000100000 | 3 | 000000100100100 | 3 | 001001000100100 | 3 | 010010010000100 | 3 | 100001000100100 | 3 |
| 28 | 000000100100100 | 4 | 000010000100000 | 4 | 000000100100100 | 4 | 001001000100100 | 4 | 010010010000100 | 4 | 100001000100100 | 4 |
| 29 | 000000100100100 | 5 | 000010000100000 | 5 | 000000100100100 | 5 | 001001000100100 | 5 | 010010010000100 | 5 | 100001000100100 | 5 |
| 30 | 000000010010001 | 0 | 000010000100001 | 0 | 000000010010001 | 0 | 001001001000001 | 0 | 010010010010001 | 0 | 100001001000000 | 1 |
| 31 | 000000010010001 | 1 | 000010000100001 | 1 | 000000010010001 | 1 | 001001001000001 | 1 | 010010010010001 | 1 | 100001001000000 | 3 |
| 32 | 000000100100010 | 1 | 000010000100010 | 1 | 000000100100010 | 1 | 001001001000010 | 1 | 010010010010010 | 1 | 100001001000000 | 4 |
| 33 | 000000100100010 | 2 | 000010000100010 | 2 | 000000100100010 | 2 | 001001001000010 | 2 | 010010010010010 | 2 | 100001001000000 | 5 |
| 34 | 000000100100010 | 3 | 000010000100010 | 3 | 000000100100010 | 3 | 001001001000010 | 3 | 010010010010010 | 3 | 100001001000001 | 0 |
| 35 | 000001000100100 | 1 | 000010000100100 | 1 | 000001000100100 | 1 | 001001001001000 | 1 | 010010010001000 | 1 | 100001001000001 | 1 |
| 36 | 000001000100100 | 3 | 000010000100100 | 3 | 000001000100100 | 3 | 001001001001000 | 3 | 010010010001000 | 3 | 100001001000010 | 1 |
| 37 | 000001000100100 | 4 | 000010000100100 | 4 | 000001000100100 | 4 | 001001001001000 | 4 | 010010010001000 | 4 | 100001001000010 | 2 |
| 38 | 000001000100100 | 5 | 000010000100100 | 5 | 000001000100100 | 5 | 001001001001000 | 5 | 010010010001000 | 5 | 100001001000010 | 3 |

CODE WORD ↑ STATUS INFORMATION ↑

FIG.14

| INPUT WORD | TABLE OF STATUS "0" | | "1" | | "2" | | "3" | | "4" | | "5" | |
|---|---|---|---|---|---|---|---|---|---|---|---|---|
| 39 | 000000001000001 | 0 | 000010001000000 | 1 | 000000001000001 | 0 | 010000000010001 | 0 | 010010010000001 | 0 | 100001001000100 | 1 |
| 40 | 000000001000001 | 1 | 000010001000000 | 3 | 000000001000001 | 1 | 010000000010001 | 1 | 010010010000001 | 1 | 100001001000100 | 3 |
| 41 | 000000001000010 | 1 | 000010001000000 | 4 | 000000001000010 | 1 | 010000000010010 | 1 | 010010010000010 | 1 | 100001001000100 | 4 |
| 42 | 000000001000010 | 2 | 000010001000000 | 5 | 000000001000010 | 2 | 010000000010010 | 2 | 010010010000010 | 2 | 100001001000100 | 5 |
| 43 | 000000001000010 | 3 | 000010001000001 | 0 | 000000001000010 | 3 | 010000000010010 | 3 | 010010010000010 | 3 | 100001001001000 | 1 |
| 44 | 000001001000100 | 1 | 000010001000001 | 1 | 000001001000100 | 1 | 010000000000100 | 1 | 010010001001000 | 1 | 100001001001000 | 3 |
| 45 | 000001001000100 | 3 | 000010001000010 | 1 | 000001001000100 | 3 | 010000000000100 | 3 | 010010001001000 | 3 | 100001001001000 | 4 |
| 46 | 000001001000100 | 4 | 000010001000010 | 2 | 000001001000100 | 4 | 010000000000100 | 4 | 010010001001000 | 4 | 100001001001000 | 5 |
| 47 | 000001001000100 | 5 | 000010001000010 | 3 | 000001001000100 | 5 | 010000000000100 | 5 | 010010001001000 | 5 | 100001001001001 | 0 |
| 48 | 000001001000010 | 1 | 000010001000100 | 1 | 000001001000010 | 1 | 010000010010010 | 1 | 100000001000001 | 0 | 100001001001001 | 1 |
| 49 | 000001001000010 | 2 | 000010001000100 | 3 | 000001001000010 | 2 | 010000010010010 | 2 | 100000001000001 | 1 | 100010000000000 | 5 |
| 50 | 000001001000010 | 3 | 000010001000100 | 4 | 000001001000010 | 3 | 010000010010010 | 3 | 100000001000010 | 1 | 100010000000001 | 0 |
| 51 | 000001001001000 | 1 | 000010001000100 | 5 | 000001001001000 | 1 | 010000000001000 | 1 | 100000001000010 | 2 | 100010000000001 | 1 |
| 52 | 000001001001000 | 3 | 000010001001000 | 1 | 000001001001000 | 3 | 010000000001000 | 3 | 100000001000010 | 3 | 100010000000010 | 1 |
| 53 | 000001001001000 | 4 | 000010001001000 | 3 | 000001001001000 | 4 | 010000000001000 | 4 | 100000001000100 | 1 | 100010000000010 | 2 |
| 54 | 000001001001000 | 5 | 000010001001000 | 4 | 000001001001000 | 5 | 010000000001000 | 5 | 100000001000100 | 3 | 100010000000010 | 3 |
| 55 | 000001001001001 | 0 | 000010001001000 | 5 | 000001001001001 | 0 | 010000000001001 | 0 | 100000001000100 | 4 | 100010000000100 | 1 |
| 56 | 000001001001001 | 1 | 000010001001001 | 0 | 000001001001001 | 1 | 010000000001001 | 1 | 100000001000100 | 5 | 100010000000100 | 3 |
| 57 | 000000000100010 | 1 | 000010001001001 | 1 | 000000000100010 | 1 | 010000010000010 | 1 | 100000010000001 | 0 | 100010000000100 | 4 |
| 58 | 000000000100010 | 2 | 000010010000000 | 3 | 000000000100010 | 2 | 010000010000010 | 2 | 100000010000001 | 1 | 100010000000100 | 5 |
| 59 | 000000000100010 | 3 | 000010010000000 | 5 | 000000000100010 | 3 | 010000010000010 | 3 | 100000010000010 | 1 | 100010000001000 | 1 |
| 60 | 000000010000000 | 3 | 000010010000000 | 4 | 000000010000000 | 3 | 010000010000000 | 3 | 100000010000010 | 2 | 100010000001000 | 3 |
| 61 | 000000010000000 | 5 | 000010010000001 | 0 | 000000010000000 | 5 | 010000010000000 | 5 | 100000010000010 | 3 | 100010000001000 | 4 |
| 62 | 000000010000000 | 4 | 000010010000001 | 1 | 000000010000000 | 4 | 010000010000000 | 4 | 100000000010000 | 1 | 100010000001000 | 5 |
| 63 | 000000010000001 | 0 | 000010010000010 | 1 | 000000010000001 | 0 | 010000001000001 | 0 | 100000000010000 | 3 | 100010000001001 | 0 |
| 64 | 000000010000001 | 1 | 000010010000010 | 2 | 000000010000001 | 1 | 010000001000001 | 1 | 100000000010000 | 4 | 100010000001001 | 1 |
| 65 | 000000010000010 | 1 | 000010010000010 | 3 | 000000010000010 | 1 | 010000001000010 | 1 | 100000000010000 | 5 | 100010000010000 | 1 |
| 66 | 000000010000010 | 2 | 000010010000100 | 1 | 000000010000010 | 2 | 010000001000010 | 2 | 100000000100000 | 1 | 100010000010000 | 3 |
| 67 | 000000010000010 | 3 | 000010010000100 | 3 | 000000010000010 | 3 | 010000001000010 | 3 | 100000000100000 | 3 | 100010000010000 | 4 |
| 68 | 000000010000100 | 1 | 000010010000100 | 4 | 000000010000100 | 1 | 010000000100100 | 1 | 100000000100000 | 4 | 100010000010000 | 5 |
| 69 | 000000010000100 | 3 | 000010010000100 | 5 | 000000010000100 | 3 | 010000000100100 | 3 | 100000000100000 | 5 | 100010000010001 | 0 |
| 70 | 000000010000100 | 4 | 000010010001000 | 1 | 000000010000100 | 4 | 010000000100100 | 4 | 100000010000000 | 3 | 100010000010001 | 1 |
| 71 | 000000010000100 | 5 | 000010010001000 | 3 | 000000010000100 | 5 | 010000000100100 | 5 | 100000010000000 | 5 | 100010000010010 | 1 |
| 72 | 000000010010000 | 1 | 000010010001000 | 4 | 000000010010000 | 1 | 010000001000100 | 1 | 100000010000000 | 4 | 100010000010010 | 2 |
| 73 | 000000010010000 | 3 | 000010010001000 | 5 | 000000010010000 | 3 | 010000001000100 | 3 | 100000000100001 | 0 | 100010000010010 | 3 |
| 74 | 000000010010000 | 4 | 000010010001001 | 0 | 000000010010000 | 4 | 010000001000100 | 4 | 100000000100001 | 1 | 100010000100000 | 1 |
| 75 | 000000010010000 | 5 | 000010010001001 | 1 | 000000010010000 | 5 | 010000001000100 | 5 | 100000010010010 | 1 | 100010000100000 | 3 |
| 76 | 000000100000000 | 3 | 000010010010000 | 1 | 000000100000000 | 3 | 010000100000000 | 3 | 100000010010010 | 2 | 100010000100000 | 4 |
| 77 | 000000100000000 | 5 | 000010010010000 | 3 | 000000100000000 | 5 | 010000100000000 | 5 | 100000010010010 | 3 | 100010000100000 | 5 |
| 78 | 000000100000000 | 4 | 000010010010000 | 4 | 000000100000000 | 4 | 010000100000000 | 4 | 100000000100100 | 1 | 100010000100001 | 0 |

FIG.15

| INPUT WORD | TABLE OF STATUS "0" | "1" | "2" | "3" | "4" | "5" |
|---|---|---|---|---|---|---|
| 79 | 000000100000001 0 | 000010010010000 5 | 000000100000001 0 | 010000010000001 0 | 100000000100100 3 | 100010000100001 1 |
| 80 | 000000100000001 1 | 000010010010001 0 | 000000100000001 1 | 010000010000001 1 | 100000000100100 4 | 100010000100010 1 |
| 81 | 000000100000010 1 | 000010010010001 1 | 000000100000010 1 | 010000000100010 1 | 100000000100100 5 | 100010000100010 2 |
| 82 | 000000100000010 2 | 000010010010010 1 | 000000100000010 2 | 010000000100010 2 | 100000001000000 1 | 100010000100010 3 |
| 83 | 000000100000010 3 | 000010010010010 2 | 000000100000010 3 | 010000000100010 3 | 100000001000000 3 | 100010000100100 1 |
| 84 | 000000100000100 1 | 000010010010010 3 | 000000100000100 1 | 010000001001000 1 | 100000001000000 4 | 100010000100100 3 |
| 85 | 000000100000100 3 | 000100000000001 0 | 000000100000100 3 | 010000001001000 3 | 100000001000000 5 | 100010000100100 4 |
| 86 | 000000100000100 4 | 000100000000001 1 | 000000100000100 4 | 010000001001000 4 | 100000001001000 1 | 100010000100100 5 |
| 87 | 000000100000100 5 | 000100000000010 1 | 000000100000100 5 | 010000001001000 5 | 100000001001000 3 | 100010001000000 1 |
| 88 | 000000100001000 1 | 000100000000010 2 | 000000100001000 1 | 010000010000100 1 | 100000001001000 4 | 100010001000000 3 |
| 89 | 000000100001000 3 | 000100000000010 3 | 000000100001000 3 | 010000010000100 3 | 100000001001000 5 | 100010001000000 4 |
| 90 | 000000100001000 4 | 000100000001001 0 | 000000100001000 4 | 010000010000100 4 | 100000100000000 3 | 100010001000000 5 |
| 91 | 000000100001000 5 | 000100000001001 1 | 000000100001000 5 | 010000010000100 5 | 100000100000000 5 | 100010001000001 0 |
| 92 | 000000100001001 0 | 000100000100001 0 | 000000100001001 0 | 010000001001001 0 | 100000100000000 4 | 100010001000001 1 |
| 93 | 000000100001001 1 | 000100000100001 1 | 000000100001001 1 | 010000001001001 1 | 100000001001001 0 | 100010001000010 1 |
| 94 | 000000100010000 1 | 000100100000010 1 | 000000100010000 1 | 010000010001000 1 | 100000001001001 1 | 100010001000010 2 |
| 95 | 000000100010000 3 | 000100100000010 2 | 000000100010000 3 | 010000010001000 3 | 100000100000010 1 | 100010001000010 3 |
| 96 | 000000100010000 4 | 000100100000010 3 | 000000100010000 4 | 010000010001000 4 | 100000100000010 2 | 100010001000100 1 |
| 97 | 000000100010000 5 | 000100100010000 1 | 000000100010000 5 | 010000010001000 5 | 100000100000010 3 | 100010001000100 3 |
| 98 | 000000100010001 0 | 000100100010000 3 | 000000100010001 0 | 010000010010001 0 | 100000010010000 1 | 100010001000100 4 |
| 99 | 000000100010001 1 | 000100100010000 4 | 000000100010001 1 | 010000010010001 1 | 100000010010000 3 | 100010001000100 5 |
| 100 | 000000100100000 1 | 000100100010000 5 | 000000100100000 1 | 010000010010000 1 | 100000010010000 4 | 100010001001000 1 |
| 101 | 000000100100000 3 | 000100100100000 1 | 000000100100000 3 | 010000010010000 3 | 100000010010000 5 | 100010001001000 3 |
| 102 | 000000100100000 4 | 000100100100000 3 | 000000100100000 4 | 010000010010000 4 | 100000010000100 1 | 100010001001000 4 |
| 103 | 000000100100000 5 | 000100100100000 4 | 000000100100000 5 | 010000010010000 5 | 100000010000100 3 | 100010001001000 5 |
| 104 | 000000100100001 0 | 000100100100000 5 | 000000100100001 0 | 010000010001001 0 | 100000010000100 4 | 100010001001001 0 |
| 105 | 000000100100001 1 | 000100000010010 1 | 000000100100001 1 | 010000010001001 1 | 100000010000100 5 | 100010001001001 1 |
| 106 | 000001000000001 0 | 000100000010010 2 | 000001000000001 0 | 010000100000001 0 | 100000010001001 0 | 100010010000000 3 |
| 107 | 000001000000001 1 | 000100000010010 3 | 000001000000001 1 | 010000100000001 1 | 100000010001001 1 | 100010010000000 5 |
| 108 | 000001000000010 1 | 000100000100010 1 | 000001000000010 1 | 010000100000010 1 | 100000010001000 1 | 100010010000000 4 |
| 109 | 000001000000010 2 | 000100000100010 2 | 000001000000010 2 | 010000100000010 2 | 100000010001000 3 | 100010010000001 0 |
| 110 | 000001000000010 3 | 000100000100010 3 | 000001000000010 3 | 010000100000010 3 | 100000010001000 4 | 100010010000001 1 |
| 111 | 000001000000100 1 | 000100000100100 1 | 000001000000100 1 | 010000100000100 1 | 100000010001000 5 | 100010010000010 1 |
| 112 | 000001000000100 3 | 000100000100100 3 | 000001000000100 3 | 010000100000100 3 | 100000010010001 0 | 100010010000010 2 |
| 113 | 000001000000100 4 | 000100000100100 4 | 000001000000100 4 | 010000100000100 4 | 100000010010001 1 | 100010010000010 3 |
| 114 | 000001000000100 5 | 000100000100100 5 | 000001000000100 5 | 010000100000100 5 | 100000100000100 1 | 100010010000100 1 |
| 115 | 000001000001000 1 | 000100001000100 1 | 000001000001000 1 | 010000100001000 1 | 100000100000100 3 | 100010010000100 3 |
| 116 | 000001000001000 3 | 000100001000100 3 | 000001000001000 3 | 010000100001000 3 | 100000100000100 4 | 100010010000100 4 |
| 117 | 000001000001000 4 | 000100001000100 4 | 000001000001000 4 | 010000100001000 4 | 100000100000100 5 | 100010010000100 5 |
| 118 | 000001000001000 5 | 000100001000100 5 | 000001000001000 5 | 010000100001000 5 | 100000100000001 0 | 100010010001000 1 |

FIG.16

| INPUT WORD | TABLE OF STATUS "0" | | "1" | | "2" | | "3" | | "4" | | "5" | |
|---|---|---|---|---|---|---|---|---|---|---|---|---|
| 119 | 000001000001001 | 0 | 000100001001000 | 1 | 000001000001001 | 0 | 010000100001001 | 0 | 100000100000001 | 1 | 100010010001000 | 3 |
| 120 | 000001000001001 | 1 | 000100001001000 | 3 | 000001000001001 | 1 | 010000100001001 | 1 | 100000100001001 | 0 | 100010010001000 | 4 |
| 121 | 000001000010000 | 1 | 000100001001000 | 4 | 000001000010000 | 1 | 010000100010000 | 1 | 100000100001001 | 1 | 100010010001000 | 5 |
| 122 | 000001000010000 | 3 | 000100001001000 | 5 | 000001000010000 | 3 | 010000100010000 | 3 | 100000100010010 | 1 | 100010010001001 | 0 |
| 123 | 000001000010000 | 4 | 000100001001001 | 0 | 000001000010000 | 4 | 010000100010000 | 4 | 100000100010010 | 2 | 100010010001001 | 1 |
| 124 | 000001000010000 | 5 | 000100001001001 | 1 | 000001000010000 | 5 | 010000100010000 | 5 | 100000100010010 | 3 | 100010010010000 | 1 |
| 125 | 000001000010001 | 0 | 000100010000000 | 3 | 000001000010001 | 0 | 010000100010001 | 0 | 100000100001000 | 1 | 100010010010000 | 3 |
| 126 | 000001000010001 | 1 | 000100010000000 | 5 | 000001000010001 | 1 | 010000100010001 | 1 | 100000100001000 | 3 | 100010010010000 | 4 |
| 127 | 000001000010010 | 1 | 000100010000000 | 4 | 000001000010010 | 1 | 010000100010010 | 1 | 100000100001000 | 4 | 100010010010000 | 5 |
| 128 | 000001000010010 | 2 | 000100010000010 | 1 | 000001000010010 | 2 | 010000100010010 | 2 | 100000100001000 | 5 | 100010010010001 | 0 |
| 129 | 000001000010010 | 3 | 000100010000010 | 2 | 000001000010010 | 3 | 010000100010010 | 3 | 100000100010000 | 1 | 100010010010001 | 1 |
| 130 | 000001000100000 | 1 | 000100010000010 | 3 | 000001000100000 | 1 | 010000100100000 | 1 | 100000100010000 | 3 | 100010010010010 | 1 |
| 131 | 000001000100000 | 3 | 000100010000100 | 1 | 000001000100000 | 3 | 010000100100000 | 3 | 100000100010000 | 4 | 100010010010010 | 2 |
| 132 | 000001000100000 | 4 | 000100010000100 | 3 | 000001000100000 | 4 | 010000100100000 | 4 | 100000100010000 | 5 | 100010010010010 | 3 |
| 133 | 000001000100000 | 5 | 000100010000100 | 4 | 000001000100000 | 5 | 010000100100000 | 5 | 100000100010001 | 0 | 100100000000001 | 0 |
| 134 | 000001000100001 | 0 | 000100010000100 | 5 | 000001000100001 | 0 | 010000100100001 | 0 | 100000100010001 | 1 | 100100000000001 | 1 |
| 135 | 000001000100001 | 1 | 000100010001000 | 1 | 000001000100001 | 1 | 010000100100001 | 1 | 100000100100000 | 1 | 100100000000010 | 1 |
| 136 | 000001000100010 | 1 | 000100010001000 | 3 | 000001000100010 | 1 | 010000100100010 | 1 | 100000100100000 | 3 | 100100000000010 | 2 |
| 137 | 000001000100010 | 2 | 000100010001000 | 4 | 000001000100010 | 2 | 010000100100010 | 2 | 100000100100000 | 4 | 100100000000010 | 3 |
| 138 | 000001000100010 | 3 | 000100010001000 | 5 | 000001000100010 | 3 | 010000100100010 | 3 | 100000100100000 | 5 | 100100000000100 | 1 |
| 139 | 000001001000001 | 0 | 000100010001001 | 0 | 000001001000001 | 0 | 010001001001001 | 0 | 100000100100001 | 0 | 100100000000100 | 3 |
| 140 | 000001001000001 | 1 | 000100010001001 | 1 | 000001001000001 | 1 | 010001001001001 | 1 | 100000100100001 | 1 | 100100000000100 | 4 |
| 141 | 000000001000100 | 1 | 000100100000100 | 1 | 000000001000100 | 1 | 010001000001000 | 1 | 100000100100010 | 1 | 100100000000100 | 5 |
| 142 | 000000001000100 | 3 | 000100100000100 | 3 | 000000001000100 | 3 | 010001000001000 | 3 | 100000100100010 | 2 | 100100000001000 | 1 |
| 143 | 000000001000100 | 4 | 000100100000100 | 4 | 000000001000100 | 4 | 010001000001000 | 4 | 100000100100010 | 3 | 100100000001000 | 3 |
| 144 | 000000001000100 | 5 | 000100100000100 | 5 | 000000001000100 | 5 | 010001000001000 | 5 | 100000100100100 | 1 | 100100000001000 | 4 |
| 145 | 000000001001000 | 1 | 000100100001000 | 1 | 000000001001000 | 1 | 010001000010000 | 1 | 100000100100100 | 3 | 100100000001000 | 5 |
| 146 | 000000001001000 | 3 | 000100100001000 | 3 | 000000001001000 | 3 | 010001000010000 | 3 | 100000100100100 | 4 | 100100000001001 | 0 |
| 147 | 000000001001000 | 4 | 000100100001000 | 4 | 000000001001000 | 4 | 010001000010000 | 4 | 100000100100100 | 5 | 100100000001001 | 1 |
| 148 | 000000001001000 | 5 | 000100100001000 | 5 | 000000001001000 | 5 | 010001000010000 | 5 | 100001000000001 | 0 | 100100000010000 | 1 |
| 149 | 000000010001000 | 1 | 000100000010001 | 0 | 000000010001000 | 1 | 010001000100000 | 1 | 100001000000001 | 1 | 100100000010000 | 3 |
| 150 | 000000010001000 | 3 | 000100000010001 | 1 | 000000010001000 | 3 | 010001000100000 | 3 | 100001000000010 | 1 | 100100000010000 | 4 |
| 151 | 000000010001000 | 4 | 000100001000010 | 1 | 000000010001000 | 4 | 010001000100000 | 4 | 100001000000010 | 2 | 100100000010000 | 5 |
| 152 | 000000010001000 | 5 | 000100001000010 | 2 | 000000010001000 | 5 | 010001000100000 | 5 | 100001000000010 | 3 | 100100000010001 | 0 |
| 153 | 000001000000000 | 4 | 000100001000010 | 3 | 000001000000000 | 4 | 010000100100100 | 4 | 100001000000100 | 1 | 100100000010001 | 1 |
| 154 | 000001000000000 | 5 | 000100010010000 | 1 | 000001000000000 | 5 | 010000100100100 | 5 | 100001000000100 | 3 | 100100000010010 | 1 |
| 155 | 000000000100000 | 1 | 000100010010000 | 3 | 000000000100000 | 1 | 010000100100100 | 1 | 100001000000100 | 4 | 100100000010010 | 2 |
| 156 | 000000000100000 | 3 | 000100010010000 | 4 | 000000000100000 | 3 | 010000100100100 | 3 | 100001000000100 | 5 | 100100000010010 | 3 |
| 157 | 000000000010000 | 1 | 000100010010000 | 5 | 010000000010000 | 1 | 010001000000001 | 0 | 010000000010000 | 1 | 100100000100000 | 1 |
| 158 | 000000000010000 | 3 | 000100010010001 | 0 | 010000000010000 | 3 | 010001000000001 | 1 | 010000000010000 | 3 | 100100000100000 | 3 |

FIG.17

| INPUT WORD | TABLE OF STATUS "0" | | "1" | | "2" | | "3" | | "4" | | "5" | |
|---|---|---|---|---|---|---|---|---|---|---|---|---|
| 159 | 000000000010000 | 4 | 000100010010001 | 1 | 010000000010000 | 4 | 010001000000010 | 1 | 010000000010000 | 4 | 100100000100000 | 4 |
| 160 | 000000000010000 | 5 | 000100010010010 | 1 | 010000000010000 | 5 | 010001000000010 | 2 | 010000000010000 | 5 | 100100000100000 | 5 |
| 161 | 000000000010001 | 0 | 000100010010010 | 2 | 010001000001001 | 0 | 010001000000010 | 3 | 010001000001001 | 0 | 100100000100001 | 0 |
| 162 | 000000000010001 | 1 | 000100010010010 | 3 | 010001000001001 | 1 | 010001000000100 | 1 | 010001000001001 | 1 | 100100000100001 | 1 |
| 163 | 000000000010010 | 1 | 000010000010000 | 1 | 010000000100000 | 1 | 010001000000100 | 3 | 010000000100000 | 1 | 100100000100010 | 1 |
| 164 | 000000000010010 | 2 | 000010000010000 | 3 | 010000000100000 | 3 | 010001000000100 | 4 | 010000000100000 | 3 | 100100000100010 | 2 |
| 165 | 000000000010010 | 3 | 000010000010000 | 4 | 010000000100000 | 4 | 010001000000100 | 5 | 010000000100000 | 4 | 100100000100010 | 3 |
| 166 | 001000001001000 | 1 | 000010000010000 | 5 | 010000000100000 | 5 | 001000001001000 | 1 | 010000000100000 | 5 | 100100000100100 | 1 |
| 167 | 001000001001000 | 3 | 000100000000100 | 1 | 010001000010001 | 0 | 001000001001000 | 3 | 010001000010001 | 0 | 100100000100100 | 3 |
| 168 | 001000001001000 | 4 | 000100000000100 | 3 | 010001000010001 | 1 | 001000001001000 | 4 | 010001000010001 | 1 | 100100000100100 | 4 |
| 169 | 001000001001000 | 5 | 000100000000100 | 4 | 010001000010010 | 1 | 001000001001000 | 5 | 010001000010010 | 1 | 100100000100100 | 5 |
| 170 | 001000001001001 | 0 | 000100000000100 | 5 | 010001000010010 | 2 | 001000001001001 | 0 | 010001000010010 | 2 | 100100001000000 | 1 |
| 171 | 001000001001001 | 1 | 000100001000001 | 0 | 010001000010010 | 3 | 001000001001001 | 1 | 010001000010010 | 3 | 100100001000000 | 3 |
| 172 | 001000010000001 | 0 | 000100001000001 | 1 | 010000001000000 | 1 | 001000010000001 | 0 | 010000001000000 | 1 | 100100001000000 | 4 |
| 173 | 001000010000001 | 1 | 000100100001001 | 0 | 010000001000000 | 3 | 001000010000001 | 1 | 010000001000000 | 3 | 100100001000000 | 5 |
| 174 | 001000010000010 | 1 | 000100100001001 | 1 | 010000001000000 | 4 | 001000010000010 | 1 | 010000001000000 | 4 | 100100001000001 | 0 |
| 175 | 001000010000010 | 2 | 000100100010010 | 1 | 010000001000000 | 5 | 001000010000010 | 2 | 010000001000000 | 5 | 100100001000001 | 1 |
| 176 | 001000010000010 | 3 | 000100100010010 | 2 | 010001000100001 | 0 | 001000010000010 | 3 | 010001000100001 | 0 | 100100001000010 | 1 |
| 177 | 001000010000100 | 1 | 000100100010010 | 3 | 010001000100001 | 1 | 001000010000100 | 1 | 010001000100001 | 1 | 100100001000010 | 2 |
| 178 | 001000010000100 | 3 | 000100000001000 | 1 | 010001000100010 | 1 | 001000010000100 | 3 | 010001000100010 | 1 | 100100001000010 | 3 |
| 179 | 001000010000100 | 4 | 000100000001000 | 3 | 010001000100010 | 2 | 001000010000100 | 4 | 010001000100010 | 2 | 100100001000100 | 1 |
| 180 | 001000010000100 | 5 | 000100000001000 | 4 | 010001000100010 | 3 | 001000010000100 | 5 | 010001000100010 | 3 | 100100001000100 | 3 |
| 181 | 001000010001000 | 1 | 000100000001000 | 5 | 010001000100100 | 1 | 001000010001000 | 1 | 010001000100100 | 1 | 100100001000100 | 4 |
| 182 | 001000010001000 | 3 | 000100000100000 | 1 | 010001000100100 | 3 | 001000010001000 | 3 | 010001000100100 | 3 | 100100001000100 | 5 |
| 183 | 001000010001000 | 4 | 000100000100000 | 3 | 010001000100100 | 4 | 001000010001000 | 4 | 010001000100100 | 4 | 100100001001000 | 1 |
| 184 | 001000010001000 | 5 | 000100000100000 | 4 | 010001000100100 | 5 | 001000010001000 | 5 | 010001000100100 | 5 | 100100001001000 | 3 |
| 185 | 001000010001001 | 0 | 000100000100000 | 5 | 010001001000000 | 1 | 001000010001001 | 0 | 010001001000000 | 1 | 100100001001000 | 4 |
| 186 | 001000010001001 | 1 | 000100010000001 | 0 | 010001001000000 | 3 | 001000010001001 | 1 | 010001001000000 | 3 | 100100001001000 | 5 |
| 187 | 001000010010000 | 1 | 000100010000001 | 1 | 010001001000000 | 4 | 001000010010000 | 1 | 010001001000000 | 4 | 100100001001001 | 0 |
| 188 | 001000010010000 | 3 | 000100000010000 | 1 | 010001001000000 | 5 | 001000010010000 | 3 | 010001001000000 | 5 | 100100001001001 | 1 |
| 189 | 001000010010000 | 4 | 000100000010000 | 3 | 010001001000001 | 0 | 001000010010000 | 4 | 010001001000001 | 0 | 100100010000000 | 3 |
| 190 | 001000010010000 | 5 | 000100000010000 | 4 | 010001001000001 | 1 | 001000010010000 | 5 | 010001001000001 | 1 | 100100010000000 | 5 |
| 191 | 001000010010001 | 0 | 000100000010000 | 5 | 010001001000010 | 1 | 001000010010001 | 0 | 010001001000010 | 1 | 100100010000000 | 4 |
| 192 | 001000010010001 | 1 | 000100100000001 | 0 | 010001001000010 | 2 | 001000010010001 | 1 | 010001001000010 | 2 | 100100010000001 | 0 |
| 193 | 001000010010010 | 1 | 000100100000001 | 1 | 010001001000010 | 3 | 001000010010010 | 1 | 010001001000010 | 3 | 100100010000001 | 1 |
| 194 | 001000010010010 | 2 | 001000000010010 | 1 | 010001001000100 | 1 | 001000010010010 | 2 | 010001001000100 | 1 | 100100010000010 | 1 |
| 195 | 001000010010010 | 3 | 001000000010010 | 2 | 010001001000100 | 3 | 001000010010010 | 3 | 010001001000100 | 3 | 100100010000010 | 2 |
| 196 | 001000100000000 | 3 | 001000000010010 | 3 | 010001001000100 | 4 | 001000100000000 | 3 | 010001001000100 | 4 | 100100010000010 | 3 |
| 197 | 001000100000000 | 5 | 000100100000000 | 3 | 010001001000100 | 5 | 001000100000000 | 5 | 010001001000100 | 5 | 100100010000100 | 1 |
| 198 | 001000100000000 | 4 | 000100100000000 | 5 | 010001001001000 | 1 | 001000100000000 | 4 | 010001001001000 | 1 | 100100010000100 | 3 |

FIG.18

| INPUT WORD | TABLE OF STATUS "0" | | "1" | | "2" | | "3" | | "4" | | "5" | |
|---|---|---|---|---|---|---|---|---|---|---|---|---|
| 199 | 00100010000000l | 0 | 000100100000000 | 4 | 010001001001000 | 3 | 001000100000001 | 0 | 010001001001000 | 3 | 100100010000100 | 4 |
| 200 | 001000100000001 | 1 | 000100100010001 | 0 | 010001001001000 | 4 | 001000100000001 | 1 | 010001001001000 | 4 | 100100010000100 | 5 |
| 201 | 001000100000010 | 1 | 000100100010001 | 1 | 010001001001000 | 5 | 001000100000010 | 1 | 010001001001000 | 5 | 100100010001000 | 1 |
| 202 | 001000100000010 | 2 | 001000000000010 | 1 | 010000000100001 | 0 | 001000100000010 | 2 | 010000000100001 | 0 | 100100010001000 | 3 |
| 203 | 001000100000010 | 3 | 001000000000010 | 2 | 010000000100001 | 1 | 001000100000010 | 3 | 010000000100001 | 1 | 100100010001000 | 4 |
| 204 | 001000100000100 | 1 | 001000000000010 | 3 | 010010000000001 | 0 | 001000100000100 | 1 | 010010000000001 | 0 | 100100010001000 | 5 |
| 205 | 001000100000100 | 3 | 000100001000000 | 1 | 010010000000001 | 1 | 001000100000100 | 3 | 010010000000001 | 1 | 100100010001001 | 0 |
| 206 | 001000100000100 | 4 | 000100001000000 | 3 | 010010000000010 | 1 | 001000100000100 | 4 | 010010000000010 | 1 | 100100010001001 | 1 |
| 207 | 001000100000100 | 5 | 000100001000000 | 4 | 010010000000010 | 2 | 001000100000100 | 5 | 010010000000010 | 2 | 100100010010000 | 1 |
| 208 | 001000100001000 | 1 | 000100001000000 | 5 | 010010000000010 | 3 | 001000100001000 | 1 | 010010000000010 | 3 | 100100010010000 | 3 |
| 209 | 001000100001000 | 3 | 001000000000100 | 1 | 010010000000100 | 1 | 001000100001000 | 3 | 010010000000100 | 1 | 100100010010000 | 4 |
| 210 | 001000100001000 | 4 | 001000000000100 | 3 | 010010000000100 | 3 | 001000100001000 | 4 | 010010000000100 | 3 | 100100010010000 | 5 |
| 211 | 001000100001000 | 5 | 001000000000100 | 4 | 010010000000100 | 4 | 001000100001000 | 5 | 010010000000100 | 4 | 100100010010001 | 0 |
| 212 | 001000100001001 | 0 | 001000000000100 | 5 | 010010000000100 | 5 | 001000100001001 | 0 | 010010000000100 | 5 | 100100010010001 | 1 |
| 213 | 001000100001001 | 1 | 001000000100001 | 0 | 010010000001000 | 1 | 001000100001001 | 1 | 010010000001000 | 1 | 100100010010010 | 1 |
| 214 | 001000100010000 | 1 | 001000000100001 | 1 | 010010000001000 | 3 | 001000100010000 | 1 | 010010000001000 | 3 | 100100010010010 | 2 |
| 215 | 001000100010000 | 3 | 001000000001000 | 1 | 010010000001000 | 4 | 001000100010000 | 3 | 010010000001000 | 4 | 100100010010010 | 3 |
| 216 | 001000100010000 | 4 | 001000000001000 | 3 | 010010000001000 | 5 | 001000100010000 | 4 | 010010000001000 | 5 | 100100100000000 | 3 |
| 217 | 001000100010000 | 5 | 001000000001000 | 4 | 010010000001001 | 0 | 001000100010000 | 5 | 010010000001001 | 0 | 100100100000000 | 5 |
| 218 | 001000100010001 | 0 | 001000000001000 | 5 | 010010000001001 | 1 | 001000100010001 | 0 | 010010000001001 | 1 | 100100100000000 | 4 |
| 219 | 001000100010001 | 1 | 001000000001001 | 0 | 010010000010000 | 1 | 001000100010001 | 1 | 010010000010000 | 1 | 100100100000001 | 0 |
| 220 | 001000100010010 | 1 | 001000000001001 | 1 | 010010000010000 | 3 | 001000100010010 | 1 | 010010000010000 | 3 | 100100100000001 | 1 |
| 221 | 001000100010010 | 2 | 001000000100010 | 1 | 010010000010000 | 4 | 001000100010010 | 2 | 010010000010000 | 4 | 100100100000010 | 1 |
| 222 | 001000100010010 | 3 | 001000000100010 | 2 | 010010000010000 | 5 | 001000100010010 | 3 | 010010000010000 | 5 | 100100100000010 | 2 |
| 223 | 001000100100000 | 1 | 001000000100010 | 3 | 010010000010001 | 0 | 001000100100000 | 1 | 010010000010001 | 0 | 100100100000010 | 3 |
| 224 | 001000100100000 | 3 | 000100100100100 | 1 | 010010000010001 | 1 | 001000100100000 | 3 | 010010000010001 | 1 | 100100100000100 | 1 |
| 225 | 001000100100000 | 4 | 000100100100100 | 3 | 010010000010010 | 1 | 001000100100000 | 4 | 010010000010010 | 1 | 100100100000100 | 3 |
| 226 | 001000100100000 | 5 | 000100100100100 | 4 | 010010000010010 | 2 | 001000100100000 | 5 | 010010000010010 | 2 | 100100100000100 | 4 |
| 227 | 001000100100001 | 0 | 000100100100100 | 5 | 010010000010010 | 3 | 001000100100001 | 0 | 010010000010010 | 3 | 100100100000100 | 5 |
| 228 | 001000100100001 | 1 | 001000000010001 | 0 | 010010000100000 | 1 | 001000100100001 | 1 | 010010000100000 | 1 | 100100100001000 | 1 |
| 229 | 001000100100010 | 1 | 001000000010001 | 1 | 010010000100000 | 3 | 001000100100010 | 1 | 010010000100000 | 3 | 100100100001000 | 3 |
| 230 | 001000100100010 | 2 | 001000001000010 | 1 | 010010000100000 | 4 | 001000100100010 | 2 | 010010000100000 | 4 | 100100100001000 | 4 |
| 231 | 001000100100010 | 3 | 001000001000010 | 2 | 010010000100000 | 5 | 001000100100010 | 3 | 010010000100000 | 5 | 100100100001000 | 5 |
| 232 | 001000100100100 | 1 | 001000001000010 | 3 | 010010000100001 | 0 | 001000100100100 | 1 | 010010000100001 | 0 | 100100100001001 | 0 |
| 233 | 001000100100100 | 3 | 001000001000100 | 1 | 010010000100001 | 1 | 001000100100100 | 3 | 010010000100001 | 1 | 100100100001001 | 1 |
| 234 | 001000100100100 | 4 | 001000001000100 | 3 | 010010000100010 | 1 | 001000100100100 | 4 | 010010000100010 | 1 | 100100100010000 | 1 |
| 235 | 001000100100100 | 5 | 001000001000100 | 4 | 010010000100010 | 2 | 001000100100100 | 5 | 010010000100010 | 2 | 100100100010000 | 3 |
| 236 | 001001000000001 | 0 | 001000001000100 | 5 | 010010000100010 | 3 | 001001000000001 | 0 | 010010000100010 | 3 | 100100100010000 | 4 |
| 237 | 001001000000001 | 1 | 000100100100001 | 0 | 010010000100100 | 1 | 001001000000001 | 1 | 010010000100100 | 1 | 100100100010000 | 5 |
| 238 | 001001000000010 | 1 | 000100100100001 | 1 | 010010000100100 | 3 | 001001000000010 | 1 | 010010000100100 | 3 | 100100100010001 | 0 |

FIG.19

| INPUT WORD | TABLE OF STATUS "0" | "1" | "2" | "3" | "4" | "5" |
|---|---|---|---|---|---|---|
| 239 | 001001000000010 2 | 000100100100010 1 | 010010000100100 4 | 001001000000010 2 | 010010000100100 4 | 100100100010001 1 |
| 240 | 001001000000010 3 | 000100100100010 2 | 010010000100100 5 | 001001000000010 3 | 010010000100100 5 | 100100100010010 1 |
| 241 | 001001000000100 1 | 000100100100010 3 | 010010001000000 1 | 001001000000100 1 | 010010001000000 1 | 100100100010010 2 |
| 242 | 001001000000100 3 | 001000000010000 1 | 010010001000000 3 | 001001000000100 3 | 010010001000000 3 | 100100100010010 3 |
| 243 | 001001000000100 4 | 001000000010000 3 | 010010001000000 4 | 001001000000100 4 | 010010001000000 4 | 100100100100000 1 |
| 244 | 001001000000100 5 | 001000000010000 4 | 010010001000000 5 | 001001000000100 5 | 010010001000000 5 | 100100100100000 3 |
| 245 | 001001000001000 1 | 001000000010000 5 | 010010001000001 0 | 001001000001000 1 | 010010001000001 0 | 100100100100000 4 |
| 246 | 001001000001000 3 | 001000000100000 1 | 010010001000001 1 | 001001000001000 3 | 010010001000001 1 | 100100100100000 5 |
| 247 | 001001000001000 4 | 001000000100000 3 | 010010001000010 1 | 001001000001000 4 | 010010001000010 1 | 100100100100001 0 |
| 248 | 001001000001000 5 | 001000000100000 4 | 010010001000010 2 | 001001000001000 5 | 010010001000010 2 | 100100100100001 1 |
| 249 | 001001000001001 0 | 001000000100000 5 | 010010001000010 3 | 001001000001001 0 | 010010001000010 3 | 100100100100010 1 |
| 250 | 001001000001001 1 | 001000001000001 0 | 010010001001001 0 | 001001000001001 1 | 010010001001001 0 | 100100100100010 2 |
| 251 | 001001000010000 1 | 001000001000001 1 | 010010001001001 1 | 001001000010000 1 | 010010001001001 1 | 100100100100010 3 |
| 252 | 001001000010000 3 | 001000001000000 1 | 010010010000000 3 | 001001000010000 3 | 010010010000000 3 | 100100100100100 1 |
| 253 | 001001000010000 4 | 001000001000000 3 | 010010010000000 5 | 001001000010000 4 | 010010010000000 5 | 100100100100100 3 |
| 254 | 001001000010000 5 | 001000001000000 4 | 010010010000000 4 | 001001000010000 5 | 010010010000000 4 | 100100100100100 4 |
| 255 | 000010000000000 5 | 001000001000000 5 | 010010000000000 5 | #1 | #2 | 100100100100100 5 |

#1 WHEN ZERO RUN LENGTH OF PREVIOUS DATA WORD IS 6 OR LESS 000010000000000 5
MORE THAN 7 010010000000000 5

#2 WHEN ZERO RUN LENGTH OF PREVIOUS DATA WORD IS OTHER THAN 7 OR 8 010010000000000 5
7 OR 8 001000010000000 5

| CASE | ZERO RUN LENGTH ON LSB SIDE | POSSIBLE NEXT STATUS |
|---|---|---|
| 0 | 0 | 0, 1 |
| 1 | 1 | 1, 2, 3 |
| 2 | 2~6 | 1, 3, 4, 5 |
| 3 | 7, 8 | 3, 4, 5 |
| 4 | 9, 10 | 4, 5 |

FIG.22

SYNC SIGNAL TABLE 132

EVEN/ODD RELATION: SYn-1t SIDE | SYn-2t SIDE (ADDITIONALLY, n IS 0 TO 5)

State = 0

| | SYn-1t SIDE 1 bit 13 | SYn-1t SIDE 14 bit 30 | SYn-2t SIDE 1 bit 13 | SYn-2t SIDE 14 bit 30 |
|---|---|---|---|---|
| SY0 | 0000001000100 | 10000000000001000 | 0000000010000 | 10000000000001000 |
| SY1 | 0000000100100 | 10000000000001000 | 0000000100000 | 10000000000001000 |
| SY2 | 0000001001000 | 10000000000001000 | 0000001000000 | 10000000000001000 |
| SY3 | 0000010010000 | 10000000000001000 | 0000010000000 | 10000000000001000 |
| SY4 | 0000010000100 | 10000000000001000 | 0010000100100 | 10000000000001000 |
| SY5 | 0000010001000 | 10000000000001000 | 0010001000100 | 10000000000001000 |

State = 1

| | SYn-1t SIDE 1 bit 13 | SYn-1t SIDE 14 bit 30 | SYn-2t SIDE 1 bit 13 | SYn-2t SIDE 14 bit 30 |
|---|---|---|---|---|
| SY0 | 0000100000100 | 10000000000001000 | 0000100000000 | 10000000000001000 |
| SY1 | 0000100001000 | 10000000000001000 | 0000100100100 | 10000000000001000 |
| SY2 | 0000100010000 | 10000000000001000 | 0001000000000 | 10000000000001000 |
| SY3 | 0000100100000 | 10000000000001000 | 0001000100100 | 10000000000001000 |
| SY4 | 0001000000100 | 10000000000001000 | 0001001000100 | 10000000000001000 |
| SY5 | 0001000001000 | 10000000000001000 | 0001001001000 | 10000000000001000 |

State = 2

| | SYn-1t SIDE 1 bit 13 | SYn-1t SIDE 14 bit 30 | SYn-2t SIDE 1 bit 13 | SYn-2t SIDE 14 bit 30 |
|---|---|---|---|---|
| SY0 | 0000001000100 | 10000000000001000 | 0000000010000 | 10000000000001000 |
| SY1 | 0000000100100 | 10000000000001000 | 0000000100000 | 10000000000001000 |
| SY2 | 0000001001000 | 10000000000001000 | 0000001000000 | 10000000000001000 |
| SY3 | 0000010010000 | 10000000000001000 | 0100010000100 | 10000000000001000 |
| SY4 | 0000010000100 | 10000000000001000 | 0100010001000 | 10000000000001000 |
| SY5 | 0000010001000 | 10000000000001000 | 0100010010000 | 10000000000001000 |

State = 3

| | SYn-1t SIDE 1 bit 13 | SYn-1t SIDE 14 bit 30 | SYn-2t SIDE 1 bit 13 | SYn-2t SIDE 14 bit 30 |
|---|---|---|---|---|
| SY0 | 0100000000100 | 10000000000001000 | 0010010000100 | 10000000000001000 |
| SY1 | 0100000100000 | 10000000000001000 | 0010010001000 | 10000000000001000 |
| SY2 | 0100000010000 | 10000000000001000 | 0010010010000 | 10000000000001000 |
| SY3 | 0100000001000 | 10000000000001000 | 0100000100100 | 10000000000001000 |
| SY4 | 0100001000000 | 10000000000001000 | 0100001000100 | 10000000000001000 |
| SY5 | 0100010000000 | 10000000000001000 | 0100001001000 | 10000000000001000 |

State = 4

| | SYn-1t SIDE 1 bit 13 | SYn-1t SIDE 14 bit 30 | SYn-2t SIDE 1 bit 13 | SYn-2t SIDE 14 bit 30 |
|---|---|---|---|---|
| SY0 | 1000000000100 | 10000000000001000 | 0100100100000 | 10000000000001000 |
| SY1 | 1000000001000 | 10000000000001000 | 1000001000100 | 10000000000001000 |
| SY2 | 1000000010000 | 10000000000001000 | 1000001001000 | 10000000000001000 |
| SY3 | 1000000100000 | 10000000000001000 | 0100010000100 | 10000000000001000 |
| SY4 | 1000001000000 | 10000000000001000 | 0100010001000 | 10000000000001000 |
| SY5 | 1000010000000 | 10000000000001000 | 0100010010000 | 10000000000001000 |

State = 5

| | SYn-1t SIDE 1 bit 13 | SYn-1t SIDE 14 bit 30 | SYn-2t SIDE 1 bit 13 | SYn-2t SIDE 14 bit 30 |
|---|---|---|---|---|
| SY0 | 1000100000000 | 10000000000001000 | 1000010000100 | 10000000000001000 |
| SY1 | 1000100100100 | 10000000000001000 | 1000010001000 | 10000000000001000 |
| SY2 | 1001000000000 | 10000000000001000 | 1000010010000 | 10000000000001000 |
| SY3 | 1001000100100 | 10000000000001000 | 1000100000100 | 10000000000001000 |
| SY4 | 1001001000100 | 10000000000001000 | 1000100001000 | 10000000000001000 |
| SY5 | 1001001001000 | 10000000000001000 | 1000100010000 | 10000000000001000 |

※TOP BIT OF CODE SUBSEQUENT TO SYNCHRONOUS SIGNAL IS SURELY "1"

COLUMN DIRECTION

13 ROWS

| 30 | 1365 | 30 | 1365 | 30 | 1365 | 30 | 1365 |
|---|---|---|---|---|---|---|---|
| SY0 | | SY5 | | SY5 | | SY5 | |
| SY1 | | SY1 | | SY1 | | SY1 | |
| SY2 | | SY2 | | SY2 | | SY2 | |
| SY3 | | SY3 | | SY3 | | SY3 | |
| SY1 | | SY2 | | SY2 | | SY1 | |
| SY2 | | SY3 | | SY3 | | SY2 | |
| SY3 | | SY1 | | SY1 | | SY3 | |
| SY1 | | SY4 | | SY4 | | SY1 | |
| SY2 | | SY1 | | SY1 | | SY2 | |
| SY3 | | SY4 | | SY4 | | SY3 | |
| SY1 | | SY3 | | SY3 | | SY1 | |
| SY2 | | SY4 | | SY4 | | SY2 | |
| SY3 | | SY2 | | SY2 | | SY3 | |
| SB | | SB | | SB | | SB | |

FORMAT FOR 1 SECTOR

PORTION FOR PERFORMING 8-15 DEMODULATION IN REPRODUCTION SIGNAL PROCESSOR 32

FLOW CHART OF 8-15 DEMODULATION

DECODING TABLE 328

FIG.30

| Sk-0 | | Sk-1 | | Sk-2 | | Sk-3 | | Sk-4 | | Sk-5 | |
|---|---|---|---|---|---|---|---|---|---|---|---|
| Ck-1 | Dk-1 | Ck-1 | Dk-1 | Ck-1 | Dk-1 | Ck-1 | Dk-1 | Ck-1 | Dk-1 | Ck-1 | Dk-1 |
| 17 | 161 | 16 | 157 | 18 | 164 | 16 | 158 | 16 | 159 | 16 | 160 |
| 33 | 2 | 17 | 162 | 34 | 58 | 18 | 165 | 32 | 0 | 32 | 1 |
| 65 | 39 | 18 | 163 | 66 | 42 | 32 | 156 | 36 | 6 | 38 | 7 |
| 73 | 16 | 32 | 155 | 130 | 66 | 34 | 59 | 64 | 10 | 64 | 11 |
| 129 | 63 | 33 | 3 | 148 | 24 | 36 | 5 | 68 | 143 | 68 | 144 |
| 137 | 21 | 34 | 57 | 258 | 82 | 64 | 9 | 72 | 147 | 72 | 148 |
| 145 | 30 | 38 | 4 | 274 | 19 | 66 | 43 | 128 | 62 | 128 | 61 |
| 257 | 79 | 64 | 8 | 290 | 33 | 68 | 142 | 132 | 70 | 132 | 71 |
| 285 | 92 | 65 | 40 | 514 | 109 | 72 | 146 | 136 | 151 | 136 | 152 |
| 273 | 98 | 66 | 41 | 530 | 128 | 128 | 60 | 144 | 74 | 144 | 75 |
| 289 | 104 | 68 | 141 | 548 | 137 | 130 | 67 | 256 | 78 | 256 | 77 |
| 513 | 106 | 72 | 145 | 578 | 49 | 132 | 69 | 260 | 88 | 260 | 87 |
| 521 | 119 | 73 | 17 | 1026 | 5 | 136 | 150 | 264 | 90 | 264 | 91 |
| 529 | 125 | 129 | 64 | 1042 | 24 | 144 | 73 | 272 | 96 | 272 | 97 |
| 545 | 134 | 130 | 65 | 1058 | 33 | 146 | 25 | 288 | 102 | 288 | 103 |
| 577 | 139 | 132 | 68 | 1090 | 46 | 256 | 76 | 292 | 28 | 292 | 29 |
| 585 | 55 | 136 | 149 | 1154 | 64 | 258 | 83 | 512 | 153 | 512 | 154 |
| 1025 | 2 | 137 | 22 | 1170 | 83 | 260 | 85 | 516 | 113 | 516 | 114 |
| 1033 | 15 | 144 | 72 | 2050 | 88 | 264 | 89 | 520 | 117 | 520 | 118 |
| 1041 | 21 | 145 | 31 | 2068 | 106 | 272 | 95 | 528 | 123 | 528 | 124 |
| 1057 | 30 | 148 | 23 | 2082 | 109 | 274 | 20 | 544 | 132 | 544 | 133 |
| 1089 | 43 | 257 | 80 | 2114 | 152 | 288 | 101 | 548 | 37 | 548 | 38 |
| 1097 | 56 | 258 | 81 | 2178 | 129 | 290 | 34 | 576 | 14 | 576 | 15 |
| 1153 | 61 | 260 | 84 | 2194 | 161 | 292 | 27 | 580 | 46 | 580 | 47 |
| 1161 | 74 | 264 | 88 | 2306 | 95 | 514 | 110 | 584 | 53 | 584 | 54 |
| 1169 | 80 | 265 | 93 | 2322 | 176 | 516 | 112 | 1028 | 9 | 1024 | 255 |
| 2049 | 85 | 272 | 94 | 2338 | 240 | 520 | 116 | 1032 | 13 | 1025 | 10 |
| 2057 | 90 | 273 | 99 | 4098 | 203 | 528 | 122 | 1040 | 165 | 1032 | 14 |
| 2065 | 149 | 274 | 18 | 4114 | 195 | 530 | 129 | 1056 | 28 | 1040 | 166 |
| 2061 | 92 | 288 | 100 | 4130 | 222 | 544 | 131 | 1060 | 37 | 1058 | 29 |
| 2113 | 171 | 289 | 105 | 4162 | 231 | 546 | 138 | 1088 | 41 | 1060 | 38 |
| 2121 | 123 | 290 | 32 | 4228 | 175 | 548 | 36 | 1092 | 50 | 1066 | 42 |
| 2177 | 186 | 292 | 26 | 4242 | 194 | 576 | 13 | 1096 | 54 | 1092 | 51 |
| 2185 | 139 | 513 | 107 | 4354 | 202 | 578 | 50 | 1152 | 60 | 1096 | 55 |
| 2193 | 158 | 514 | 108 | 4370 | 221 | 580 | 45 | 1156 | 68 | 1152 | 59 |
| 2305 | 192 | 516 | 111 | 4388 | 230 | 584 | 52 | 1160 | 72 | 1156 | 69 |
| 2313 | 173 | 520 | 115 | 4610 | 239 | 1026 | 6 | 1168 | 78 | 1160 | 73 |
| 2321 | 200 | 521 | 120 | 4626 | 19 | 1028 | 8 | 2052 | 169 | 1168 | 79 |
| 2337 | 237 | 528 | 121 | 4642 | 24 | 1032 | 12 | 2056 | 180 | 2052 | 170 |
| 4105 | 219 | 529 | 126 | 4674 | 33 | 1040 | 164 | 2064 | 190 | 2058 | 181 |
| 4113 | 228 | 530 | 127 | 8210 | 42 | 1042 | 25 | 2080 | 184 | 2064 | 191 |
| 4129 | 213 | 544 | 130 | 8226 | 82 | 1056 | 27 | 2084 | 113 | 2060 | 165 |
| 4161 | 250 | 545 | 135 | 8258 | 66 | 1058 | 34 | 2112 | 207 | 2084 | 114 |
| 4169 | 170 | 546 | 136 | 8322 | 58 | 1060 | 36 | 2116 | 117 | 2112 | 208 |
| 4225 | 172 | 548 | 35 | 8338 | 49 | 1088 | 40 | 2120 | 121 | 2118 | 118 |
| 4233 | 185 | 576 | 12 | 8450 | 109 | 1090 | 47 | 2176 | 127 | 2120 | 122 |
| 4241 | 191 | 577 | 140 | 8466 | 128 | 1092 | 49 | 2180 | 133 | 2178 | 126 |
| 4353 | 199 | 578 | 48 | 8482 | 137 | 1096 | 53 | 2184 | 137 | 2180 | 134 |
| 4361 | 212 | 580 | 44 | 8706 | 160 | 1152 | 58 | 2192 | 158 | 2184 | 138 |
| 4369 | 218 | 584 | 51 | 8722 | 170 | 1154 | 65 | 2304 | 199 | 2192 | 157 |
| 4385 | 227 | 585 | 56 | 8738 | 179 | 1156 | 67 | 2308 | 143 | 2304 | 198 |
| 4609 | 236 | 1025 | 3 | 8770 | 192 | 1160 | 71 | 2312 | 147 | 2308 | 144 |
| 4617 | 249 | 1026 | 4 | 9218 | 207 | 1168 | 77 | 2320 | 99 | 2312 | 148 |
| 4625 | 16 | 1028 | 7 | 9234 | 226 | 1170 | 84 | 2336 | 103 | 2320 | 100 |
| 4641 | 21 | 1032 | 11 | 9250 | 235 | 2050 | 89 | 2340 | 226 | 2336 | 104 |
| 4673 | 30 | 1033 | 16 | 9282 | 248 | 2052 | 168 | 4100 | 211 | 2340 | 227 |
| 4881 | 2 | 1040 | 163 | 9346 | 42 | 2056 | 179 | 4104 | 217 | 4100 | 212 |
| 8201 | 55 | 1041 | 22 | 9362 | 33 | 2064 | 189 | 4112 | 244 | 4104 | 218 |
| 8209 | 39 | 1042 | 23 | 16402 | 19 | 2066 | 107 | 4128 | 248 | 4112 | 245 |
| 8225 | 202 | 1056 | 26 | 16418 | 24 | 2080 | 183 | 4132 | 19 | 4128 | 249 |
| 8257 | 63 | 1057 | 31 | 16450 | 51 | 2082 | 110 | 4160 | 254 | 4132 | 20 |
| 8285 | 92 | 1058 | 32 | 16514 | 60 | 2084 | 112 | 4164 | 253 | 4164 | 238 |
| 8321 | 79 | 1060 | 35 | 16530 | 78 | 2112 | 208 | 4168 | 168 | 4168 | 169 |
| 8329 | 104 | 1088 | 38 | 16642 | 96 | 2114 | 153 | 4224 | 0 | 4224 | 255 |
| 8337 | 98 | 1089 | 44 | 16658 | 123 | 2116 | 116 | 4228 | 179 | 4228 | 180 |
| 8449 | 106 | 1090 | 45 | 16674 | 142 | 2120 | 120 | 4232 | 183 | 4232 | 184 |

PORTION FOR PERFORMING PROCESSING OF AND AFTER 8-15 DEMODULATION IN REPRODUCTION SIGNAL PROCESSOR

RECORDING METHOD, RECORDING APPARATUS, TRANSMITTING APPARATUS, REPRODUCING METHOD, REPRODUCING APPARATUS, RECEIVING APPARATUS, RECORDING MEDIUM, AND TRANSMISSION MEDIUM

BACKGROUND OF THE INVENTION

1. Field of the Invention

The present invention relates to a recording method, recording apparatus, transmitting apparatus, reproducing method, reproducing apparatus, receiving apparatus, recording medium, and transmission medium in which a p-bit input data word is converted to a q-bit (q>p) code word using a plurality of coding tables, and when a code word string produced by directly coupling the code words is recorded in a recording medium such as an optical disk and magnetic disk and reproduced, or is transmitted via a transmitting portion, a coding rate is raised, a density for a recording medium or a transmission medium is raised, and at the same time, an ability of correction of a burst error can be enhanced.

2. Description of the Related Art

Generally, a pit length to be recorded in an optical disk has a restriction on a minimum run length (minimum pit or land length) due to optical transmission characteristic for recording and reproducing and physical restraint about pit generation and further, a restriction on a maximum run length (maximum pit or land length) for a reason of facilitation of clock generation. Further for protection of a servo band, and the like, it is necessary to modulate signals to be recorded so that the signals have a suppression characteristic of low-pass components of the signals.

As a conventional modulation method satisfying these restrictions, in which the minimum run length (hereinafter referred to also as a minimum reverse interval) is 3T (T=a period of channel bit), and a maximum run length (hereinafter referred to also as a maximum reverse interval) 11T, an 8 to 14 modulation (EFM) method for use in a compact disk (CD), and EFM+ method for use in a digital versatile disk (DVD) have been well known.

First, in EFM modulation for use in the compact disk (CD), inputted 8-bit (1 byte) digital data is converted to 14-bit run length limited code (hereinafter referred to as a code word) satisfying the run length restriction such that the minimum run length is 3T and the maximum run length is 11T. Furthermore, a 3-bit connection bit for controlling a digital sum value (DSV) and holding a run length restriction rule is attached between the converted code words so that an EFM modulated signal is generated.

In this case, for the minimum run length of 3T, a minimum number of "0" included between logical values "1" and "1" in code words is d=2. On the other hand, for the maximum run length of 11T, a maximum number of "0" included between the logical values "1" and "1" in the code words is k=10. Moreover, the 3-bit connection bit disposed for controlling the DSV and holding the run length restriction rule in order to reduce a DC component and low-pass component of the modulated signal is connected between the 14-bit code words. Thereby, the EFM modulated signal satisfies a run length restriction rule RLL (d, k)=RLL (2, 10) that the minimum run length is 3T and the maximum run length is 11T.

Next, in the EFM+ method used for the digital versatile disk (DVD), the inputted 8-bit digital data is converted to a 16-bit code word, these code words are directly coupled to one another without using any connection bit, and thereby 8 to 16 modulation is executed so as to satisfy the run length restriction rule RLL (2, 10) that the minimum run length is 3T and the maximum run length is 11T. As compared with CD, a DVD has a shorter minimum mark length that is shorter than half of that of a CD and has a higher track density with the track pitch of 0.74 μm that is higher than double of that of CD. A user recording capacity of a single-sided, single-layer disk is 4.7 GB.

Furthermore, as a replacement of a disk in the current generation in which a red laser beam is used, manufacturers are now studying a next-generation super high-density optical disk that uses a violet laser beam (GaN), and the recording capacity of the next-generation optical disk is said to exceed 20 GB. Here, a modulation system by a high coding rate has been studied in order to perform high-density recording with respect to the optical disk. Accordingly, the minimum mark length and track pitch are naturally reduced, and values are said to be reduced to about ½ of those of DVD. Under such circumstances, a defect of the optical disk developed by a defect of a signal surface generated during disk manufacturing or by dust or a scratch during use of the optical disk, if any, would be twice as large as that on the DVD in view of a relative data length, and an error is generated in reproduced data.

On the other hand, in general, in the optical disk, a parity bit is added in order to subject the data to be recorded to an error correction processing. A unit of the error correction is called an ECC block. For example, the ECC block in a conventional recording medium such as DVD is shown in (A) and (B) in FIG. 1.

That is, as shown in (A) in FIG. 1, in the DVD, product coding (product coding is a coding of an error correction such as a product error correction coding) is performed for a set of 192 rows×172 columns data in order to generate 10 columns of PI parity (inner parity) for each row, and 16 rows of PO parity (outer parity) for each column. As a result, a 208×182 error correction code (ECC) block is constituted. Moreover, as shown in (B) in FIG. 1, during recording, one row of PO parity data is inserted every 12 rows of data to interleave data with PO parity data. Moreover, for the ECC block, first to 208-th rows are recorded on the optical disk in order.

In this method, up to 16 rows may be erasure-corrected with the PO parity data. This means that a data error caused by a continuous defect of up to 6 mm on the optical disk may be corrected. Such continuous error is generally called a burst error. When the track linear density is double in this format, the maximum length of the correctable defect will be reduced to 3 mm. Moreover, five symbols (bytes) may usually be corrected with PI parity data and, if there is no random error, the maximum length of a correctable burst error on the DVD is about 10 μm. Therefore, when the track linear density is doubled, the maximum length of the defect correctable with the PI parity data is about 5 μm.

Meanwhile, if there is a random error, the length of the burst error correctable with the PI and PO parity data becomes much shorter in the conventional method and on the recording medium described above. It should be noted that PO rows of the DVD are interleaved with data rows, not to distribute burst errors, but to keep a parity data ratio in a sector to be constant. Therefore, there is no effect of increasing the correction length.

To solve the problem, there is a method of increasing the number of parity data units and increasing the correction length. However, since redundancy of parity data increases with respect to the ECC block, this method is very disadvantageous for the high-density recording to the super high-density optical disk being studied.

SUMMARY OF THE INVENTION

An object of the present invention is to provide a recording method, recording apparatus, transmitting apparatus, reproducing method, reproducing apparatus, receiving apparatus, recording medium, and transmission medium in which a modulation system is used to enable a high-performance DSV control having a high coding rate, a relatively small-sized burst error is dispersed, a maximum burst error correction length is relatively easily increased without increasing redundancy, and a track linear density is raised for densification.

To achieve the object, there is provided a recording method for using a plurality of coding tables to subject an input data word of p-bits to p-q modulation and to thereby obtain a code word of q-bits (q>p), in which the plurality of coding tables store the code words corresponding to the respective input data words, and state information indicating the coding table for use in modulating the next input data word to obtain the next code word satisfying a predetermined run length restriction rule even with the next code word coupled directly with the code word, and the specific coding table and the other specific coding table in the plurality of coding table are allotted to have an even/odd relation such that the number of "1" in each of the code words stored corresponding to respective predetermined input data words is even in the specific coding table and the number of "1" in the code word is odd in the other specific coding table so as to enable a DSV control, the method comprising steps of: referring to the plurality of coding tables during modulation of the predetermined input data word; performing the DSV control; and outputting a recording signal generated by inserting a synchronous signal for decoding reproduction data into every predetermined number of code words in a string of the code words satisfying the run length restriction rule on a recording medium side or a transmission medium side.

In the recording method, the p-bits are 8 bits, the q-bits are 15 bits, and the predetermined run length restriction rule stipulates that a minimum run length of a signal obtained by subjecting the code word to NRZI conversion excluding the synchronous signal is 3T and that a maximum run length is any one of 11T, 12T, 13T, and 14T.

According to the present invention, when the plurality of coding tables are used to subject the input data word of p-bits to the p-q modulation and obtain the code word of q-bits (q>p), the plurality of coding tables store the code words corresponding to the respective input data words, and the state information indicating the coding table for use in modulating the next input data word to obtain the next code word satisfying the predetermined run length restriction rule even with the next code word coupled directly with the code word. Moreover, the specific coding table and the other specific coding table in the plurality of coding table are allotted to have the even/odd relation such that the number of "1" in each of the code words stored corresponding to respective predetermined input data words is even in the specific coding table and the number of "1" in the code word is odd in the other specific coding table so as to enable the DSV control. When the predetermined input data word is modulated, the plurality of coding tables are referred to, while performing the DSV control. Additionally, the recording signal generated by inserting the synchronous signal for decoding the reproduction data into every predetermined number of code words in the string of the code words satisfying the run length restriction rule is outputted on the recording medium side or the transmission medium side. The p-bits are 8 bits, the q-bits are 15 bits, and the predetermined run length restriction rule stipulates that the minimum run length of the signal obtained by subjecting the code word to the NRZI conversion excluding the synchronous signal is 3T and that the maximum run length is any one of 11T, 12T, 13T, and 14T. Therefore, for example, the 8-bit input data word can be converted to the 15-bit code word, while the DSV control is performed. The coding rate is further raised as compared with an EFM+ method for modulating 8-bit data to 16-bit code, and high-density recording can be realized with respect to the recording medium or the transmission medium.

In a preferred embodiment of the present invention, when the predetermined input data word is modulated, the code word having a smaller absolute value is selected from an absolute value of a DSV value obtained from the code word modulated using the specific coding table, and an absolute value of a DSV value obtained from the code word modulated using the other specific coding table, and the DSV control is performed.

Moreover, in order to achieve the object, there is provided a recording method for using a plurality of coding tables to subject an input data word of p-bits to p–q modulation and to thereby obtain a code word of q-bits (q>p), in which the plurality of coding tables store the code words corresponding to the respective input data words, and state information indicating the coding table for use in modulating the next input data word to obtain the next code word satisfying a predetermined run length restriction rule even with the next code word coupled directly with the code word, and a recording signal generated by inserting a synchronous signal for decoding reproduction data into every predetermined number of code words in a string of the code words satisfying the predetermined run length restriction rule and to be outputted is outputted on a recording medium side or a transmission medium side.

The recording method comprises steps of: adding auxiliary information including a sector address and a parity by a product code to the input data word continuously inputted to constitute an ECC block; subjecting the input data word in a format signal formatted in a predetermined format with respect to the ECC block to the p-q modulation to generate a string of code words satisfying the predetermined run length restriction rule; and inserting the synchronous signal including a bit pattern longer than a maximum run length of the predetermined run length restriction rule into every predetermined number of code words to generate the recording signal.

According to the present invention, the plurality of coding tables are used to subject the input data word of p-bits to the p-q modulation in order to obtain the code word of q-bits (q>p), the plurality of coding tables store the code words corresponding to the respective input data words, and the state information indicating the coding table for use in modulating the next input data word to obtain the next code word satisfying the predetermined run length restriction rule even with the next code word coupled directly with the code word. The recording signal generated by inserting the synchronous signal for decoding the reproduction data into every predetermined number of code words in the string of the code words satisfying the predetermined run length restriction rule and to be outputted is outputted on the recording medium side or the transmission medium side. The auxiliary information including the sector address and the parity by the product code is added to the input data word continuously inputted so that the ECC block is constituted. The input data word in the format signal formatted in the predetermined format with respect to the ECC block is p-q modulated so that the string of code words satisfying the predetermined run length restriction rule is generated. Moreover, the synchronous signal including a bit pattern longer than a maximum run length of the predetermined run length restriction rule is inserted into every predetermined number of code words so that the recording signal is generated. Therefore, if there is a defect of a signal surface generated in the recording medium recorded in a high density with a raised coding rate, or an error in reproduced data by dust or a scratch of the recording medium being used, an error correction processing can securely be performed. Moreover, the error correction processing can securely be performed on the transmission medium transmitted in the high density with the raised coding rate, and further the synchronous signal can securely be detected from the code word string.

In a preferred embodiment of the present invention, for the plurality of coding tables, the specific coding table and the other specific coding table in the plurality of coding table are allotted to have an even/odd relation such that the number of "1" in each of the code words stored corresponding to respective predetermined input data words is even in the specific coding table and the number of "1" in the code word is odd in the other specific coding table so as to enable the DSV control. When the predetermined input data word is modulated, the plurality of coding tables are referred to, and the DSV control is performed.

In a preferred embodiment of the present invention, for the plurality of coding tables, the specific coding table and the other specific coding table in the plurality of coding table are allotted to have an even/odd relation such that the number of "1" in each of the code words stored corresponding to respective predetermined input data words is even in the specific coding table and the number of "1" in the code word is odd in the other specific coding table so as to enable the DSV control. When the predetermined input data word is modulated, the code word having a smaller absolute value is selected from an absolute value of a DSV value obtained from the code word modulated using the specific coding table, and an absolute value of the DSV value obtained from the code word modulated using the other specific coding table, and the DSV control is performed.

In a preferred embodiment of the present invention, n ($n \geqq 1$) consecutive ECC blocks are set as a set, a processing is repeated for all rows of the respective ECC blocks, and the processing comprises steps of successively switching and arranging respective r-th rows of the respective ECC blocks and subsequently successively switching and arranging respective (r+1)-th rows in such a manner that respective first rows of the respective ECC blocks of the set are successively arranged on the recording medium or the transmission medium, and respective second rows are successively recorded/arranged.

According to the embodiment, the processing of successively arranging the respective k-th rows of at least two ECC blocks and then successively recording/arranging the respective (r+1)-th rows are repeated for all the rows of the respective ECC blocks. Therefore, when a large burst error is generated over at least two ECC blocks, reproduction data of the recording medium or the transmission medium having the burst error is dispersed in two or more ECC blocks. The errors included in one ECC block can be reduced to a half or less of the errors in the conventional art with two ECC blocks, and can be reduced to 1/n or less of the errors in the conventional art. Moreover, instead of increasing the number of words of the parity, characteristics are brought in the recording arrangement of the parity. Therefore, a maximum burst error correction length can be increased in a simple constitution without increasing redundancy, and this is remarkably effective for increasing the linear density of the data.

In a preferred embodiment of the present invention, two consecutive ECC blocks are set as a set, a processing is repeated for all rows of the two ECC blocks of each set, and the processing comprises steps of alternately switching odd-numbered data of a first row of one ECC block of the set and even-numbered data of a first row of the other ECC block by a data unit and arranging the data on the recording medium or the transmission medium, and subsequently alternately switching even-numbered data of the first row of one ECC block and odd-numbered data of the first row of the other ECC block by the data unit and arranging the data on the recording medium or the transmission medium.

According to the embodiment, the two consecutive ECC blocks are set as a set. The odd-numbered data of the first row of one ECC block of the set and the even-numbered data of the first row of the other ECC block are alternately switched by the data unit and arranged on the recording medium or the transmission medium. Subsequently, the even-numbered data of the first row of one ECC block and the odd-numbered data of the first row of the other ECC block are switched by the data unit and arranged on the recording medium or the transmission medium. This is repeated for all the rows of the two ECC blocks of each set. Thereby, when a relatively small-sized error is generated, the burst error length can be averaged within the row. Therefore, a probability of disabled correction can be reduced as compared with the conventional art. Therefore, the present invention is remarkably effective for increasing the linear density of the data.

In the preferred embodiment of the present invention, a x-rows y-columns data string constituted of the continuously input data word and the auxiliary information is divided into 1/m ($m \geqq 1$) in a row direction and m x-rows y/m-columns sub blocks are formed, a first parity with a predetermined number of bytes is first added to the respective sub blocks in a column direction, subsequently a second parity with the predetermined number of bytes is added to the sub blocks including the first parity in the row direction, and the ECC block is constituted by m sub blocks.

According to the embodiment, the x-rows y-columns data string constituted of the continuously input data word and the auxiliary information is divided into 1/m ($m \geqq 1$) in the row direction and the m x-rows y/m-columns sub blocks are formed, the first parity with the predetermined number of bytes is first added to the respective sub blocks in the column direction, subsequently the second parity with the predetermined number of bytes is added to the sub blocks including the first parity in the row direction, and the ECC block is constituted by the m sub blocks. Therefore, when the ECC block is divided by the m sub blocks in the row direction, the burst errors are reduced to 1/m of those in the conventional art.

Moreover, in order to achieve the object, there is provided a recording apparatus which uses a plurality of coding tables to subject an input data word of p-bits to p-q modulation and to thereby obtain a code word of q-bits (q>p), and in which the plurality of coding tables store the code words corresponding to the respective input data words, and state information indicating the coding table for use in modulating a next input data word to obtain a next code word satisfying a predetermined run length restriction rule even with the next code word coupled directly with the code word, and a recording signal generated by inserting a synchronous signal for decoding reproduction data into every predetermined number of code words in a string of the code words satisfying the predetermined run length restriction rule and to be outputted is recorded in a recording medium.

The apparatus comprises: formatting means for adding auxiliary information including a sector address and a parity by a product code to the continuously inputted data word and constituting an ECC block, and outputting a format signal formatted in a predetermined format to the ECC block; modulation means for subjecting the input data word in the format signal outputted from the formatting means to p-q modulation and generating a code word string satisfying the predetermined run length restriction rule, and inserting the synchronous signal including a bit pattern longer than a maximum run length of the predetermined run length restriction rule into every predetermined number of code words and generating the recording signal; and recording means for recording the recording signal outputted from the modulation means in the recording medium.

In the preferred embodiment of the present invention, for the plurality of coding tables, the specific coding table and the other specific coding table in the plurality of coding table are allotted to have an even/odd relation such that the number of "1" in each of the code words stored corresponding to respective predetermined input data words is even in the specific coding table and the number of "1" in the code word is odd in the other specific coding table so as to enable the DSV control. When the predetermined input data word is modulated, the plurality of coding tables are referred to, and the DSV control is performed.

In the preferred embodiment of the present invention, for the plurality of coding tables, the specific coding table and the other specific coding table in the plurality of coding table are allotted to have the even/odd relation such that the number of "1" in each of the code words stored corresponding to respective predetermined input data words is even in the specific coding table and the number of "1" in the code word is odd in the other specific coding table so as to enable the DSV control. When the predetermined input data word is modulated, the code word having a smaller absolute value is selected from an absolute value of a DSV value obtained from the code word using the specific coding table, and an absolute value of a DSV value obtained from the code word modulated using the other specific coding table, and the DSV control is performed.

Moreover, in order to achieve the object, there is provided a transmitting apparatus which uses a plurality of coding tables to subject an input data word of p-bits to p-q modulation and to thereby obtain a code word of q-bits (q>p), and in which the plurality of coding tables store the code words corresponding to the respective input data words, and state information indicating the coding table for use in modulating a next input data word to obtain a next code word satisfying a predetermined run length restriction rule even with the next code word coupled directly with the code word, and a recording signal generated by inserting a synchronous signal for decoding reproducing data into every predetermined number of code words in a string of the code words satisfying the predetermined run length restriction rule and to be outputted is transmitted via a transmission medium by radio or by a cable.

The apparatus comprises: formatting means for adding auxiliary information including a sector address and a parity by a product code to the continuously inputted data word to constitute an ECC block, and outputting a format signal formatted in a predetermined format to the ECC block; modulation means for subjecting the input data word in the format signal outputted from the formatting means to p-q modulation to generate a code word string satisfying the predetermined run length restriction rule, and inserting the synchronous signal including a bit pattern longer than a maximum run length of the predetermined run length restriction rule into every predetermined number of code words to generate the recording signal; and transmission means for transmitting the recording signal outputted from the modulation means by the transmission medium.

In the preferred embodiment of the present invention, for the plurality of coding tables, the specific coding table and the other specific coding table in the plurality of coding table are allotted to have an even/odd relation such that the number of "1" in each of the code words stored corresponding to respective predetermined input data words is even in the specific coding table and the number of "1" in the code word is odd in the other specific coding table so as to enable the DSV control. When the predetermined input data word is modulated, the plurality of coding tables are referred to, and the DSV control is performed.

In the preferred embodiment of the present invention, for the plurality of coding tables, the specific coding table and the other specific coding table in the plurality of coding table are allotted to have the even/odd relation such that the number of "1" in each of the code words stored corresponding to respective predetermined input data words is even in the specific coding table and the number of "1" in the code word is odd in the other specific coding table so as to enable the DSV control. When the predetermined input data word is modulated, the code word having a smaller absolute value is selected from an absolute value of a DSV value obtained from the code word using the specific coding table, and an absolute value of a DSV value obtained from the code word modulated using the other specific coding table, and the DSV control is performed in the transmitting apparatus.

Moreover, in order to achieve the object, there is provided a reproducing method for reproducing data from a recording medium in which a recording signal generated using the recording method according to the first invention is recorded, or a transmission medium in which the recording signal generated using the recording method according to the first invention is transmitted.

The reproducing method comprises steps of: detecting a synchronous signal including a bit pattern longer than a maximum run length of a predetermined run length restriction rule from a reproduction signal obtained by reproducing data from the recording medium or the transmission medium; detecting case information indicating a possible state of a code word Ck to a plurality of coding tables based on a zero run length on an LSB side of a code word Ck−1 following the code word Ck in a code word string following the synchronous signal; computing state information of the coding table used in coding the code word Ck based on the case information detected from the code word Ck−1; demodulating an output data word Dk−1 corresponding to the code word Ck−1 with the case information detected from the code word Ck−1 and the state information of the code word Ck; repeating these steps in a time series order and obtaining an output data word string; and detecting auxiliary information including a sector address and a parity by a product code from the output data word string based on the synchronous signal to reconstitute an ECC block, and reproducing signals obtained thereby.

Moreover, in order to achieve the object, there is provided a reproducing method for reproducing data from a recording medium in which a recording signal generated using the recording method according to the third invention is recorded, or a transmission medium in which the recording signal generated using the recording method according to the third invention is transmitted.

The reproducing method comprises steps of: detecting a synchronous signal including a bit pattern longer than a maximum run length of a predetermined run length restriction rule from a reproduction signal obtained by reproducing data from the recording medium or the transmission medium; detecting case information indicating a possible state of a code word Ck to a plurality of coding tables based on a zero run length on an LSB side of a code word Ck−1 following the code word Ck in a code word string following the synchronous signal; computing state information of the coding table used in coding the code word Ck based on the case information detected from the code word Ck−1; demodulating an output data word Dk−1 corresponding to the code word Ck−1 with the case information detected from the code word Ck−1 and the state information of the code word Ck; repeating these steps in a time series order and obtaining an output data word string; and detecting auxiliary information including a sector address and a parity by a product code from the output data word string based on the synchronous signal to reconstitute an ECC block, and reproducing signals obtained thereby.

In the preferred embodiment of the present invention, when the synchronous signal is detected, the auxiliary information including the sector address, input data word (main data), and parity are detected based on the synchronous signal, the ECC block is reconstituted, and the input data word is reproduced, a part of a synchronous pattern of the synchronous signal is included in the data reconstituting the ECC block in the reproducing method.

Moreover, in order to achieve the object, there is provided a reproducing apparatus for reproducing data from a recording medium in which a recording signal generated using the recording method according to the first invention is recorded, or a recording medium in which the recording signal generated using the recording apparatus according to the third invention is recorded.

The reproducing apparatus comprises reproduction signal processing means for: detecting a synchronous signal including a bit pattern longer than a maximum run length of a predetermined run length restriction rule from a reproduction signal obtained by reproducing data from the recording medium; detecting case information indicating a possible state of a code word Ck to a plurality of coding tables based on a zero run length on an LSB side of a code word Ck−1 following the code word Ck in a code word string following the synchronous signal; computing state information of the coding table used in coding the code word Ck based on the case information detected from the code word Ck−1; demodulating an output data word Dk−1 corresponding to the code word Ck−1 with the case information detected from the code word Ck−1 and the state information of the code word Ck; repeating these in a time series order and obtaining an output data word string; and detecting auxiliary information including a sector address and a parity by a product code from the output data word string based on the synchronous signal to reconstitute an ECC block, and reproducing signals obtained thereby.

Moreover, in order to achieve the object, there is provided a reproducing apparatus for reproducing data from a recording medium in which a recording signal generated using the recording method according to the second invention is recorded, or a recording medium in which the recording signal generated using the recording apparatus according to the third invention is recorded.

The reproducing apparatus comprises reproduction signal processing means for: detecting a synchronous signal including a bit pattern longer than a maximum run length of a predetermined run length restriction rule from a reproduction signal obtained by reproducing data from the recording medium; detecting case information indicating a possible state of a code word Ck to a plurality of coding tables based on a zero run length on an LSB side of a code word Ck−1 following the code word Ck in a code word string following the synchronous signal; computing state information of the coding table used in coding the code word Ck based on the case information detected from the code word Ck−1; demodulating an output data word Dk−1 corresponding to the code word Ck−1 with the case information detected from the code word Ck−1 and the state information of the code word Ck; repeating these in a time series order and obtaining an output data word string; and detecting auxiliary information including a sector address and a parity by a product code from the output data word string based on the synchronous signal to reconstitute an ECC block, and reproducing signals obtained thereby.

In the preferred embodiment of the present invention, when the synchronous signal is detected, the auxiliary information including the sector address, input data word (main data), and parity are detected based on the synchronous signal, the ECC block is reconstituted, and the input data word is reproduced, a part of a synchronous pattern of the synchronous signal is included in the data reconstituting the ECC block.

Moreover, in order to achieve the object, there is provided a receiving apparatus for receiving a transmission medium in which a recording signal generated using the recording method according to the first invention is transmitted, or a transmission medium in which the recording signal generated using the transmitting apparatus according to the fourth invention is transmitted.

The receiving apparatus comprises reproduction signal processing means for: detecting a synchronous signal including a bit pattern longer than a maximum run length of a predetermined run length restriction rule from a reproduction signal obtained by reproducing data from the transmission medium; detecting case information indicating a possible state of a code word Ck to a plurality of coding tables based on a zero run length on an LSB side of a code word Ck−1 following the code word Ck in a code word string following the synchronous signal; computing state information of the coding table used in coding the code word Ck based on the case information detected from the code word Ck−1; demodulating an output data word Dk−1 corresponding to the code word Ck−1 with the case information detected from the code word Ck−1 and the state information of the code word Ck; repeating these in a time series order and obtaining an output data word string; and detecting auxiliary information including a sector address and a parity by a product code from the output data word string based on the synchronous signal to reconstitute an ECC block, and reproducing signals obtained thereby.

Moreover, in order to achieve the object, there is provided a receiving apparatus for receiving a transmission medium in which a recording signal generated using the recording method according to the second invention is transmitted, or a transmission medium in which the recording signal generated using the transmitting apparatus according to the fourth invention is transmitted.

The receiving apparatus comprises reproduction signal processing means for: detecting a synchronous signal including a bit pattern longer than a maximum run length of a predetermined run length restriction rule from a reproduction signal obtained by reproducing data from the transmission medium; detecting case information indicating a possible state of a code word Ck to a plurality of coding tables based on a zero run length on an LSB side of a code word Ck−1 following the code word Ck in a code word string following the synchronous signal; computing state information of the coding table used in coding the code word Ck based on the case information detected from the code word Ck−1; demodulating an output data word Dk−1 corresponding to the code word Ck−1 with the case information detected from the code word Ck−1 and the state information of the code word Ck; repeating these in a time series order and obtaining an output data word string; and detecting auxiliary information including a sector address and a parity by a product code from the output data word string based on the synchronous signal to reconstitute an ECC block, and reproducing signals obtained thereby.

In the preferred embodiment of the present invention, when the synchronous signal is detected, the auxiliary information including the sector address, input data word (main data), and parity are detected based on the synchronous signal, the ECC block is reconstituted, and the input data word is reproduced, a part of a synchronous pattern of the synchronous signal is included in the data reconstituting the ECC block.

Furthermore, in order to achieve the object, there is provided a recording medium in which a recording signal generated using the recording method according to the first invention or a recording signal generated using the recording apparatus according to the third invention is recorded.

Furthermore, in order to achieve the object, there is provided a recording medium in which a recording signal generated using the recording method according to the second invention or a recording signal generated using the recording apparatus according to the third invention is recorded.

Additionally, in order to achieve the object, there is provided a transmission medium in which a recording signal generated using the recording method according to the first invention or a recording signal generated using the transmitting apparatus according to the fourth invention is transmitted therethrough.

Additionally, in order to achieve the object, there is provided a transmission medium in which a recording signal generated using the recording method according to the second invention or a recording signal generated using the transmitting apparatus according to the fourth invention is transmitted therethrough.

With the recording method, the recording apparatus, transmitting apparatus, reproducing method, reproducing apparatus, receiving apparatus, recording medium, and transmission medium obtain an effect substantially similar to an effect of the recording method. That is, there are effects that the format strong against the burst error can be used by the modulation method having a high coding rate and the system for recording or transmitting the information at a higher density can be realized while holding a high stability. Furthermore, also when the information is transmitted not only by an optical disk but also in air and via a transmission cable, the information can effectively be transmitted with a small data amount and without any error.

The nature, principle and utility of the invention will become more apparent from the following detailed description when read in conjunction with the accompanying drawings.

BRIEF DESCRIPTION OF THE DRAWINGS

In the accompanying drawings:

FIG. 4A shows an example, FIG. 4B shows another example 1, and FIG. 4C shows another example 2;

FIG. 8A is a diagram showing a 9-rows burst error on the recording medium recorded using the recording method of the second embodiment of the present invention, and the error distribution of the ECC block after de-interleaving, when the recording medium is reproduced;

FIG. 8B is a diagram showing a 18-rows burst error on the recording medium recorded using the conventional recording method, and the error distribution of the ECC block after de-interleaving, when the recording medium is reproduced;

FIG. 13 is a diagram (Diagram 1) showing one example of a coding table;

FIG. 14 is a diagram (Diagram 2) showing one example of the coding table;

FIG. 15 is a diagram (Diagram 3) showing one example of the coding table;

FIG. 16 is a diagram (Diagram 4) showing one example of the coding table;

FIG. 17 is a diagram (Diagram 5) showing one example of the coding table;

FIG. 18 is a diagram (Diagram 6) showing one example of the coding table;

FIG. 19 is a diagram (Diagram 7) showing one example of the coding table;

FIG. 22 is a diagram showing one example of a synchronous signal table;

FIG. 30 is a diagram showing one example of a decode table shown in FIG. 28;

DESCRIPTION OF THE PREFERRED EMBODIMENTS

One embodiment of an recording method, recording apparatus, transmitting apparatus, reproducing method, reproducing apparatus, receiving apparatus, recording medium, and transmission medium according to the present invention will be described in detail with reference to FIGS. 2 to 32.

<Recording Method, Recording Apparatus, Recording Medium>

Figure 2:
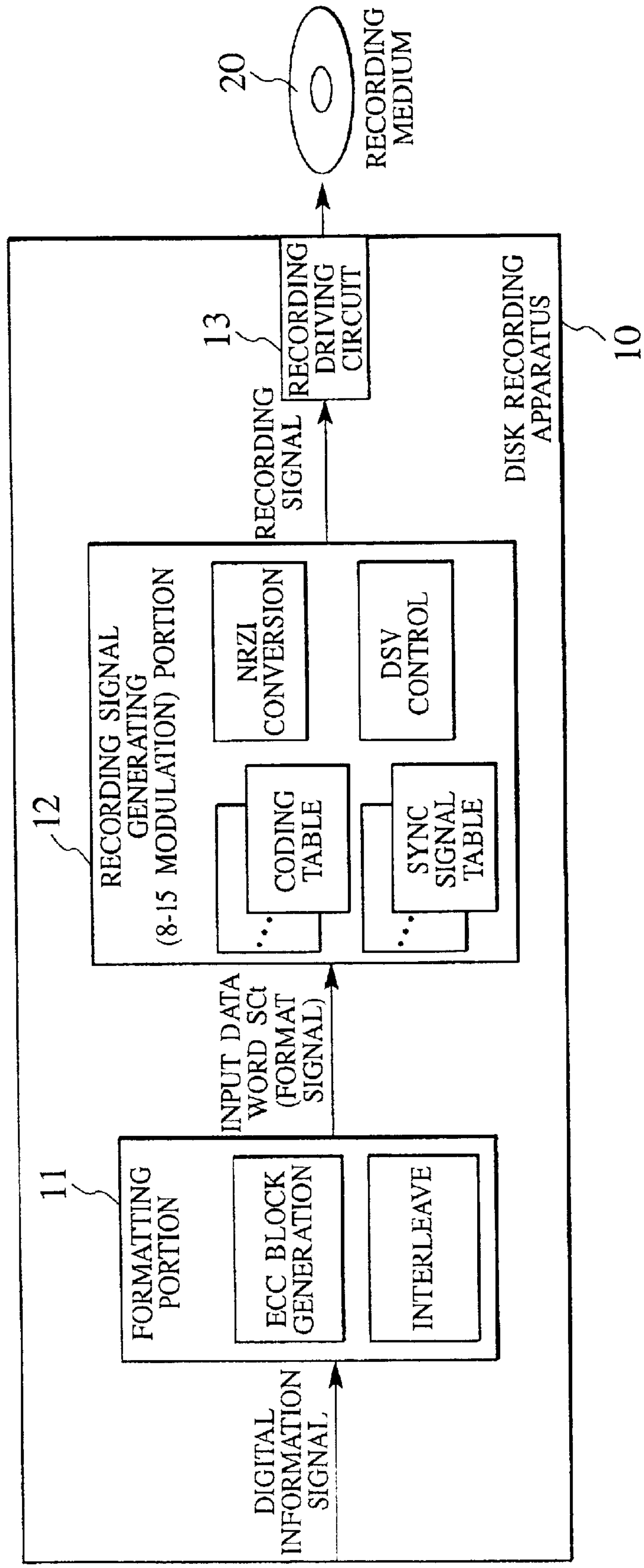
FIG. 2 is a block diagram showing a disk recording apparatus to which one embodiment of the recording apparatus and method according to the present invention are applied.

FIG. 2 is a block diagram showing a disk recording apparatus to which one embodiment of the recording method and apparatus according to the present invention are applied.

As shown in FIG. 2, a disk recording apparatus 10 to which one embodiment of the recording method and apparatus according to the present invention are applied is roughly constituted of a formatting portion 11, 8–15 modulator 12, and recording driving circuit 13. In the apparatus, a digital signal relating to information such as image and sound inputted to the disk recording apparatus 10 is subjected to 8–15 modulation by the 8–15 modulator 12 via the formatting portion 11, and the 8–15 modulated signal is recorded in an optical disk or a magnetic disk by the recording driving circuit 13, so that a recording medium 20 according to the present invention is obtained.

First, the digital signal relating to the information such as the image and sound has a continuation of input data words having a bit number p=8 bits. An input data word SCt is inputted together with a control signal to be recorded together into the formatting portion 11. In the formatting portion, auxiliary information including a sector address to be recorded together is added, and a parity (error correction code) by a product code is then added, so that an ECC block is constituted. The ECC block is subjected to an interleave processing, and a signal (input data word SCt) formatted in accordance with a predetermined recording format of the recording medium 20 is outputted to the 8–15 modulator 12.

Subsequently, in the 8–15 modulator 12, a plurality of coding tables described later are referred to, and the input data word SCt having the bit number p=8 in the formatted signal outputted from the formatting portion 11 is converted (8–15 modulated) to a code word having a bit number q=15. Additionally, a plurality of synchronous signal tables described later are referred to, thereby a synchronous signal is inserted into every predetermined number of code words (e.g., 91 code words). Additionally, a code word string constituted of the synchronous signal and a plurality of code words is subjected to NRZI conversion, subsequently subjected to a digital sum value (DSV) control, and outputted as a recording signal to the recording driving circuit 13. Thereafter, as not shown, the recording signal supplied to the recording driving circuit 13 is subjected to optical modulation by an optical modulator, the recording medium 20 such as the optical disk and magnetic disk is subsequently irradiated with light via an optical system having an objective lens, and the signal is recorded. In this case, the recording signal obtained as described above is a signal having a coding rate raised with densification to the recording medium 20.

Here, an interleave method for allowing coded data ECC-coded by a product coding method to be discrete on the recording medium 20 recorded using a recording method of a first embodiment of the present invention will first be described with reference to FIGS. 4 to 6. The formatting portion 11 and 8–15 modulator 12 as a main part of the present invention will be described later.

Figure 4A:
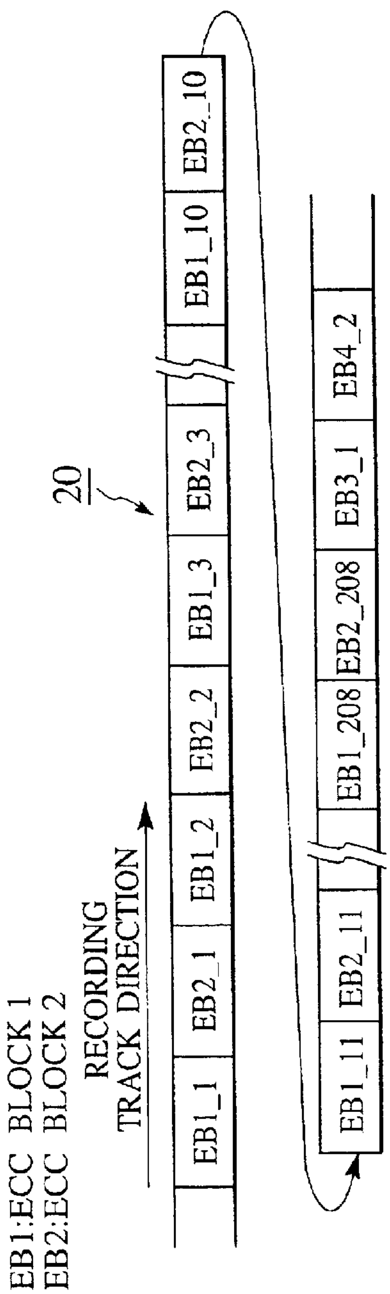
FIGS. 4A to 4C are diagrams showing arrangement of data recorded in a recording medium using the recording method according to a first embodiment of the present invention.
Figure 4B:
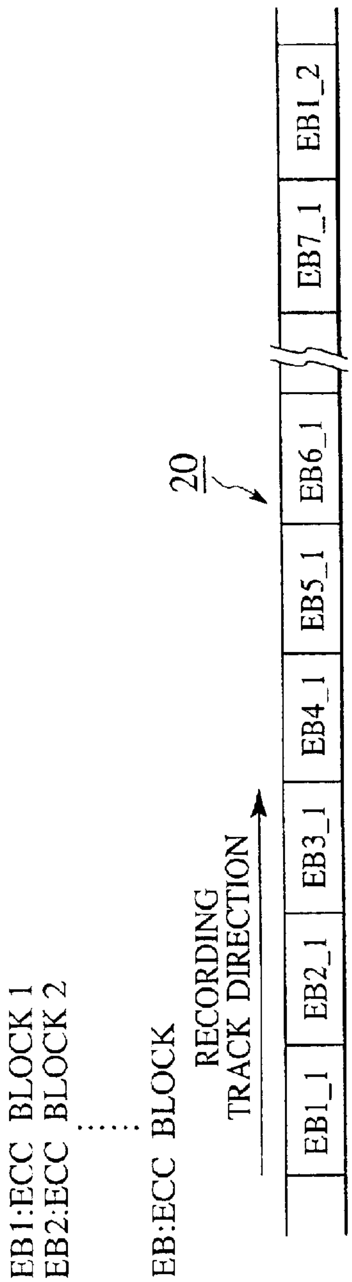
Figure 4C:
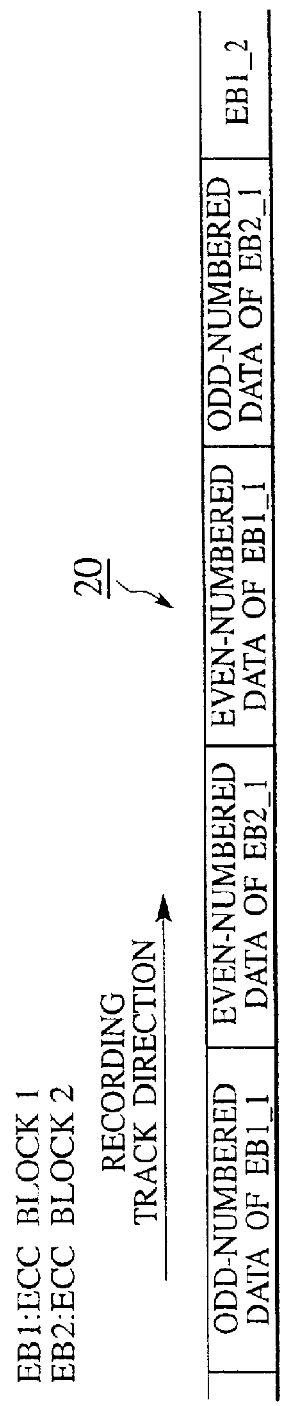

FIGS. 4A to 4C are diagrams showing arrangement of data recorded in the recording medium using the recording method according to the first embodiment of the present invention, FIG. 4A shows an example, FIG. 4B shows another example 1, and FIG. 4C shows another example 2.

Figure 5A:
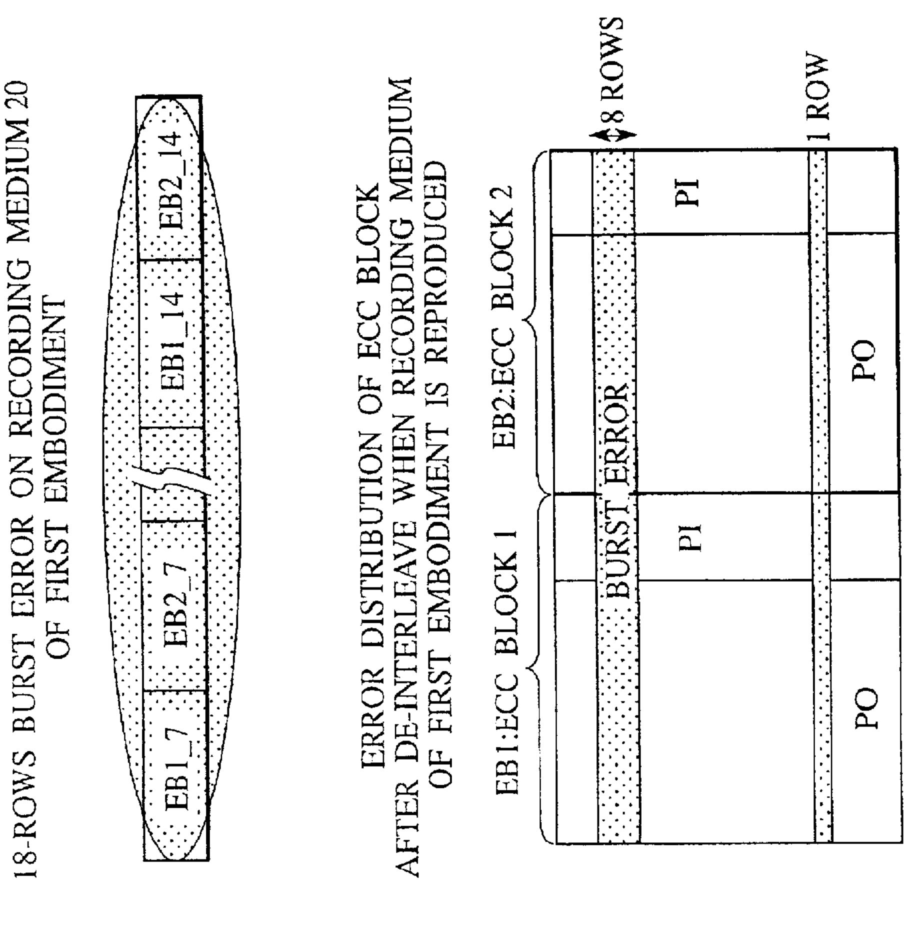
FIG. 5A is a diagram showing a 18-rows burst error on a recording medium recorded using the recording method of the first embodiment of the present invention, and an error distribution of the ECC block after de-interleaving, when the recording medium is reproduced.
Figure 5B:
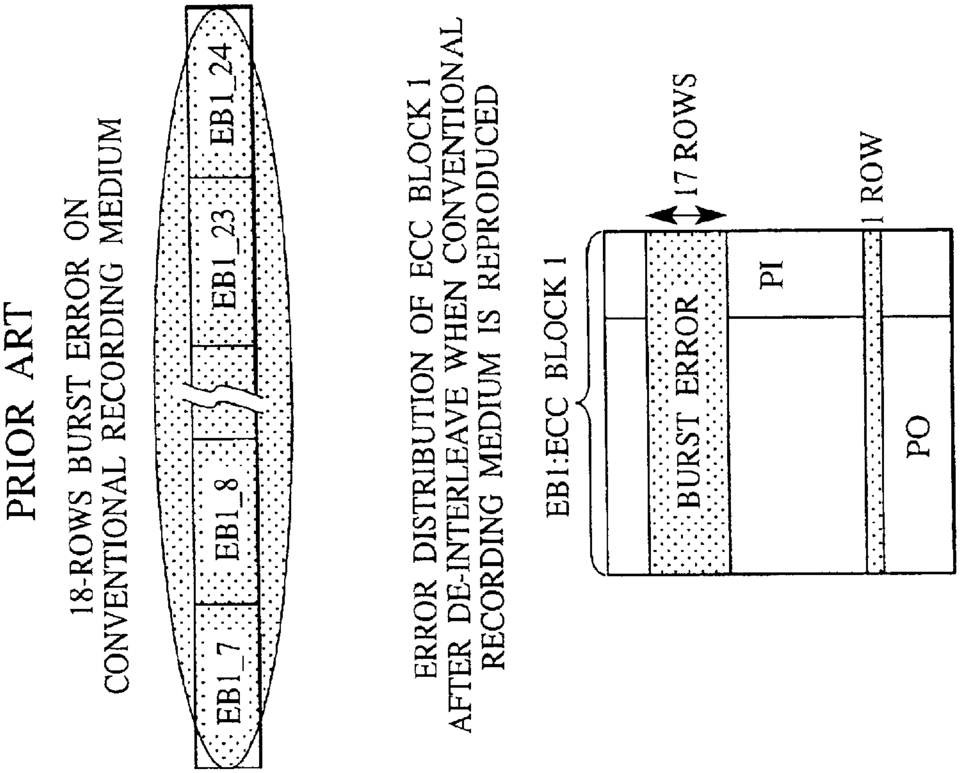
FIG. 5B is a diagram showing a 18-rows burst error on a recording medium recorded using a conventional recording method and the error distribution of the ECC block after de-interleaving, when the recording medium is reproduced.

FIG. 5A showing a 18-rows burst error on the recording medium recorded using the recording method of the first embodiment of the present invention, and an error distribution of the ECC block after de-interleaving, when the recording medium is reproduced. FIG. 5B is a diagram showing the 18-rows burst error on the recording medium recorded using a conventional recording method, and the error distribution of the ECC block after de-interleaving, when the recording medium is reproduced.

Figure 6:
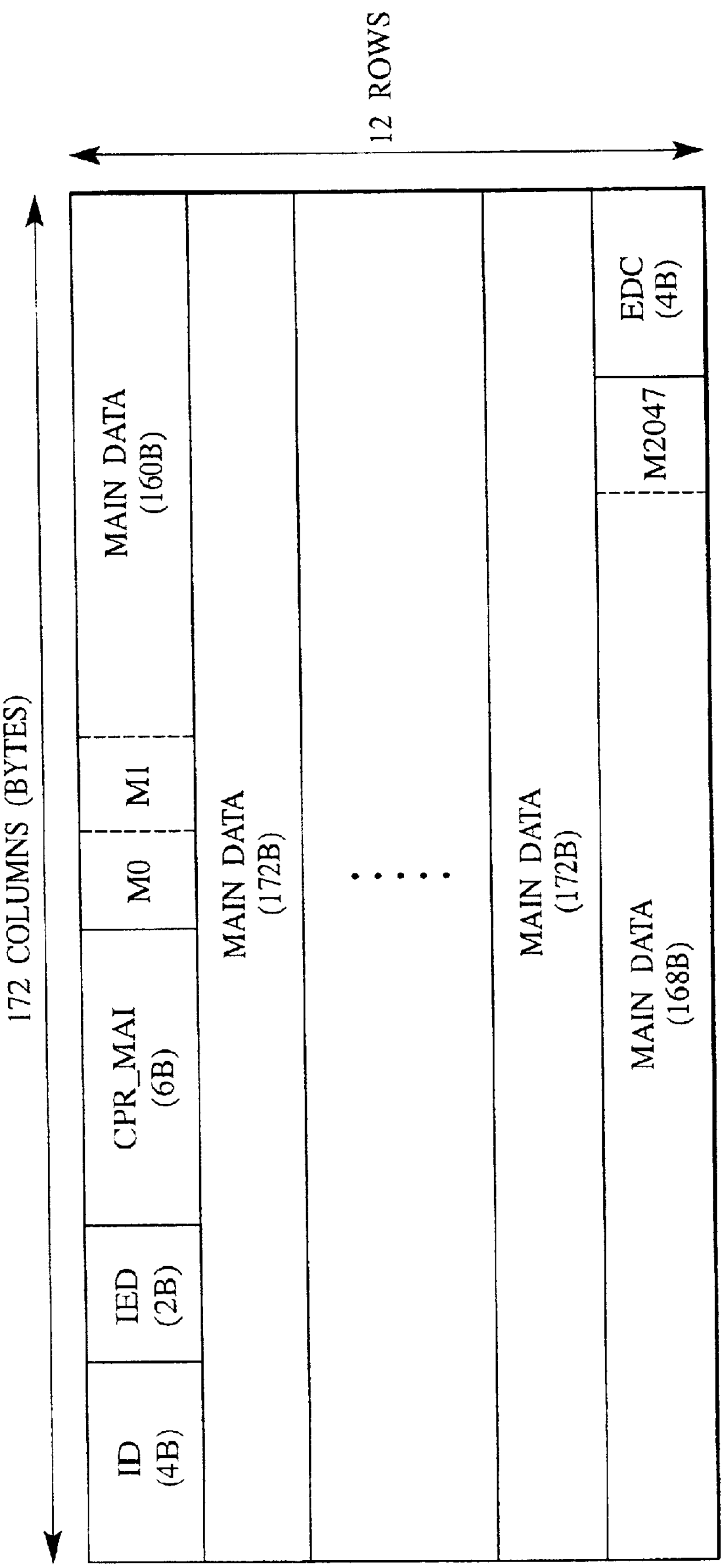
FIG. 6 is a diagram showing a constitution of a data sector of the recording medium according to the first embodiment.

FIG. 6 is a diagram showing a constitution of a data sector of the recording medium according to the first embodiment.

First, as shown in FIG. 4A, in one example of the first embodiment of the present invention, plural sets of two consecutive product-coded ECC blocks EB1 and EB2 are arranged on the recording medium 20 such as the optical disk and the magnetic disk. Specifically, a first row of the first ECC block EB1 is followed by a first row of the second ECC block EB2, then by a second row of the first ECC block EB1, and by a second row of the second ECC block EB2, and so on. That is, respective r-th rows of the first and second ECC blocks EB1, EB2 are successively switched and then respective (r+1)-th rows are successively switched, and accordingly the data is recorded/arranged to be interleaved on a row basis.

Figure 1:
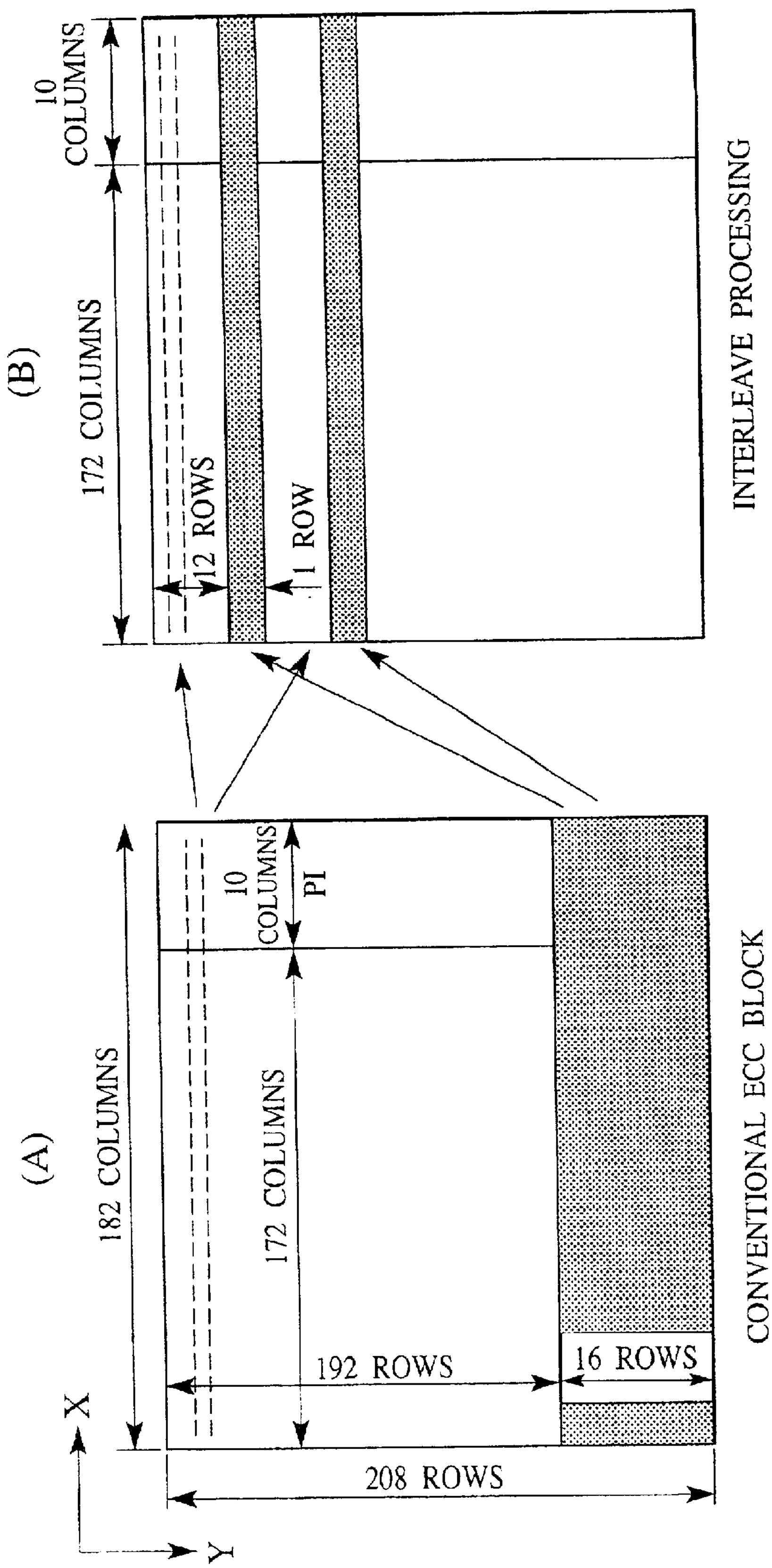
FIG. 1 is an explanatory view of an ECC block in a conventional recording medium such as DVD.

That is, in one example of the first embodiment of the present invention, data of two ECC blocks EB1, EB2 are alternately arranged by the row unit. Additionally, the two ECC blocks EB1, EB2 are constituted as the product-coded blocks described in the related art with reference to FIG. 1. In this case, similarly as DVD, a ratio of a parity in the block having a unit of 13 rows is kept to be constant by inserting one row of a PO parity into 12 rows of data beforehand.

Here, the recording medium 20 in which two ECC blocks EB1, EB2 are regarded as one set and data is recorded as shown in FIG. 4A according to one example of the first embodiment is reproduced. At this time, assume that a large burst error, for example, of 18 rows of the ECC block is generated on the recording medium 20 as shown in an upper part of FIG. 5A. Then, the error distribution included in each de-interleaved ECC block at the reproduction time is as shown in a lower part of FIG. 5A. That is, as described above, the recording medium 20 according to one example of the first embodiment inserts and records one row of PO parity in 12 rows of data. Therefore, when the recording medium 20 is reproduced, the error is dispersed and generated in nine rows in total of eight rows including main data of the respective ECC blocks EB1, EB2 and one row of PO parity.

On the other hand, when a conventional recording medium is reproduced, the same large burst error of 18 rows as described above is generated in the first ECC block EB1 as shown in the upper part of FIG. 5B. Then, for the error distribution included in the ECC block EB1 de-interleaved during reproduction, the error is generated in 18 rows in total of 17 rows of ECC block EB1 including the main data and one row of PO parity as shown in the lower part of FIG. 5B.

Moreover, as seen from comparison between FIGS. 5A and 5B, a dispersion ratio of errors slightly changes with generation start and end positions in the rows of the burst error. Generally, the dispersion ratio in one example of the first embodiment of the present invention shown in FIG. 5A is reduced to ½ as compared with the conventional example shown in FIG. 5B. That is, in one example of the first embodiment of the present invention, the error is not dispersed in each row and thus there is no advantage of lengthening a correction length, but the number of error rows included in each column is reduced to ½ as compared with the conventional example.

In this case, even when an attempt is made to perform erasure correction by the PO parity in the conventional example shown in FIG. 5B, 16 rows of error as a correction limit is exceeded, and the correction is therefore impossible. On the other hand, in one example of the first embodiment of the present invention, as shown in FIG. 5A, the number of error rows of each ECC block is nine in total, 16 rows of error as the correction limit are not exceeded, and correction is possible. Moreover, assuming that a track linear density to the recording medium 20 is set to be twice that of DVD. Then, about 3 mm for 16 rows is a burst error correction limit in the conventional method, but a burst error correction up to about 6 mm is possible in the present method similarly as DVD. When the track linear density is set to be the same as that of DVD, the burst error correction of about 12 mm is possible. That is, the correction length can be doubled without changing redundancy.

Subsequently, as shown in FIG. 4B, another example of the first embodiment of the present invention is a further extension of a technical idea of the example of FIG. 4A in the first embodiment of the present invention. On the recording medium 20 such as the optical disk and magnetic disk, n ($n \geqq 1$) consecutive product code blocks (ECC blocks) are regarded as one set and r-th rows of the respective first to n-th ECC blocks are successively arranged in order. In this case, the large burst error is dispersed in the n ECC blocks, the error included in one ECC block is reduced to about 1/n as compared with the related art, and the long burst error correction length can be n-times. In this case, with n=2, the same results as shown in FIG. 4A.

Furthermore, as shown in FIG. 4C, in further another example of the first embodiment of the present invention, two consecutive ECC blocks EB1, EB2 are arranged as one set, odd-numbered data of the first row of one ECC block EB1 of the set and even-numbered data of the first row of the other ECC block EB2 are alternately switched by a data unit and recorded/arranged on the recording medium 20. Thereafter, even-numbered data of the first row of one ECC block EB1 and odd-numbered data of the first row of the other ECC block EB2 are alternately switched by the data unit and recorded/arranged on the recording medium 20. Then, this is repeated for all the rows of the two ECC blocks EB1, EB2 of each pair. Thereby, when a relatively small error is generated, the burst error lengths can be averaged in the row. Therefore, a probability of correction disabling can be reduced as compared with the conventional example. This is remarkably effective for raising the linear density.

Here, the formatting portion 11 as a main part of the present invention will be described with reference to FIG. 3.

Figure 3:
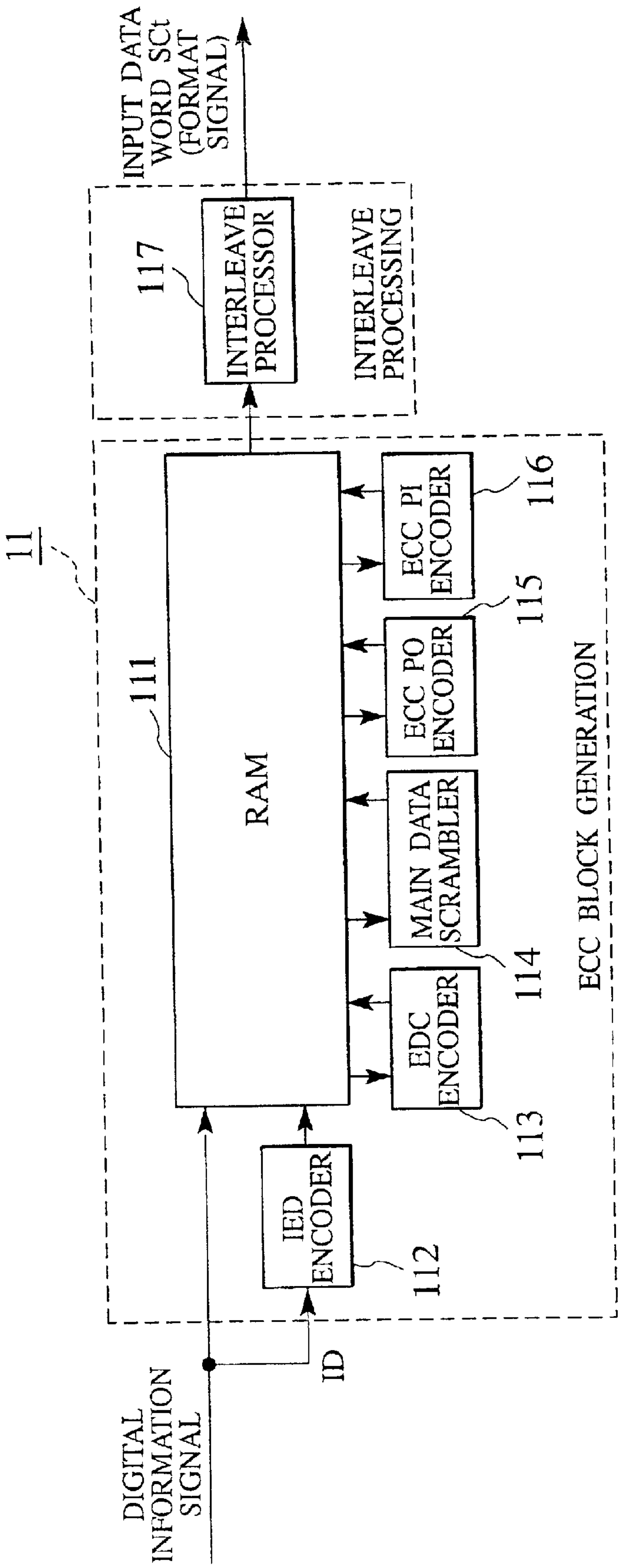
FIG. 3 is a block diagram showing a formatting portion shown in FIG. 2.

FIG. 3 is a block diagram showing the formatting portion shown in FIG. 2.

As shown in FIG. 3, the formatting portion 11 as the main part of the present invention is constituted of a random access memory (RAM) 111, IED encoder 112, EDC encoder 113, main data scrambler 114, ECC PO encoder 115, PI encoder 116, and interleave processor 117.

In the formatting portion 11, the main data by a digital signal relating to the inputted image and sound is supplied to the RAM 111 to generate the ECC block.

Moreover, ID of four bytes in total constituted of lower three bytes of sector address and upper one byte of disk information data is supplied to the IED encoder 112. In the encoder, two bytes of parity IED for correcting ID error is added and the ID is supplied to the RAM 111. The parity IED for correcting the ID error is generated, for example, with RS(a, b, c)=RS(6, 4, 3). In this case, RS(a, b, c) means a Reed Solomon code including a code word length a, number of information pieces b, and minimum code-to-code distance c. In the above example, the code word length a is six bytes, and the number of information pieces b is four bytes of the ID.

Moreover in the RAM 111, the main data, ID of four bytes in total, parity IED for correcting the ID error, and six bytes of copy protect information CP are inputted and once accumulated, and 2060 bytes in total constituted by adding the ID, IED, and CP to 2048 bytes of the main data are read as one unit, and supplied to the EDC encoder 113. In the encoder, an error detection parity EDC (error detection code) is generated. A cyclic redundancy code (CRC) is used in generating the error detection parity EDC. The generated error detection parity EDC is written in the RAM 111.

Moreover, 2064 bytes in total constituted of the error detection parity EDC generated by the EDC encoder 113 and 2060 bytes of data are supplied to the main data scrambler 114, and the sector address is used to random-number only 2048 bytes of main data portion. The random-numbered main data, that is, 2048 bytes of scrambled main data are written into the RAM 111.

The 2064 bytes of data is called a data sector in the recording medium 20 according to the first embodiment, and is constituted of 172 columns (bytes)×12 rows as shown in FIG. 6. Additionally, in FIG. 6, "CPR_MAI" indicates the copy protect information CP. Moreover, "M0", "M1", and "M2047" indicate first, second, and 2048-th bytes of the main data, respectively. Additionally, the number of bytes of ID, IED, CPR_MAI is not limited to this. Even if the length is changed in EDC, the present invention is effective.

When 16 data sectors, that is, 172 columns (bytes)×192 rows of data are accumulated in the RAM 111 in this manner, the data is accessed in a column direction (arrow Y direction) of FIG. 1A described above, and supplied to the ECC PO encoder 115. In the encoder, 16 bytes of PO parity (outer parity) are generated with RS(208, 192, 17), and the generated PO parity is written in a PO parity region of the RAM 111. This is performed for 172 columns, and the parities are accumulated in the PO parity region of FIG. 1A in the RAM 111.

Subsequently, 172 bytes of data are accessed in a row direction (arrow X direction) of FIG. 1A as described above, and supplied to the PI encoder 116. In the encoder, ten bytes of PI parity (inner parity) are generated with RS (182, 172, 11), and the generated PI parity is written in a PI parity region of the RAM 111. This is performed for 208 rows (192 rows+16 rows), and the parities are accumulated in the PI parity region of FIG. 1A in the RAM 111. The 182 columns× 208 rows constitute the ECC block. Additionally, when the product code is used, the PI parity for 192 rows is first generated, and then the PO parity for 182 columns may be generated.

The example of the first embodiment of the present invention shown in FIG. 4A will next be described. When two ECC blocks EB1, EB2 are constituted in the RAM 111, an interleave processing is executed. The interleave processor 117 accesses the data of the RAM 111 in an arrangement order of the data actually recorded in the recording medium 20. That is, while interleaving is performed, the data is read, and a format signal is outputted. That is, the interleave processor 117 reads 182 bytes of the first row of the first ECC block EB1 from the RAM 111, 182 bytes of the first row of the second ECC block EB2, 182 bytes of the second row of the first ECC block EB1, and 182 bytes of the second row of the second ECC block EB2 in order. Thereafter, the respective rows of two ECC blocks EB1, EB2 are alternately read similarly.

Additionally, for the respective rows of the PO parity of two ECC blocks EB1, EB2, one row is read for each sector of the ECC block. For example, after the last row (i.e., twelfth row) of the first sector of the first ECC block EB1 is read, the first row of the PO parity of the first ECC block EB1 is read, the final row (i.e., the twelfth row) of the first sector of the second ECC block EB2 is read, and then the first row of the PO parity of the second ECC block EB2 is read. After each sector is read in this manner, one row of PO parity is successively read from two ECC blocks EB1, EB2.

Thereby the format signal is outputted in the same order as that of the data arrangement on the recording medium 20 shown in FIG. 4A.

Additionally, in the other example shown in FIG. 4B according to the first embodiment of the present invention, the number of ECC blocks is set to n ($n \geqq 1$), and the format signal may be outputted in the same order as that of the data arrangement on the recording medium 20 shown in FIG. 4B as described above. Moreover, also in the further other example shown in FIG. 4C according to the first embodiment of the present invention, the format signal may be outputted in the same order as the data arrangement on the recording medium 20 shown in FIG. 4B.

An interleave method for allowing the encoded data ECC-encoded by the product coding method to be discrete on the recording medium 20 recorded using the recording method according to a second embodiment of the present invention will be described with reference to FIGS. 7 to 11.

Figure 7:
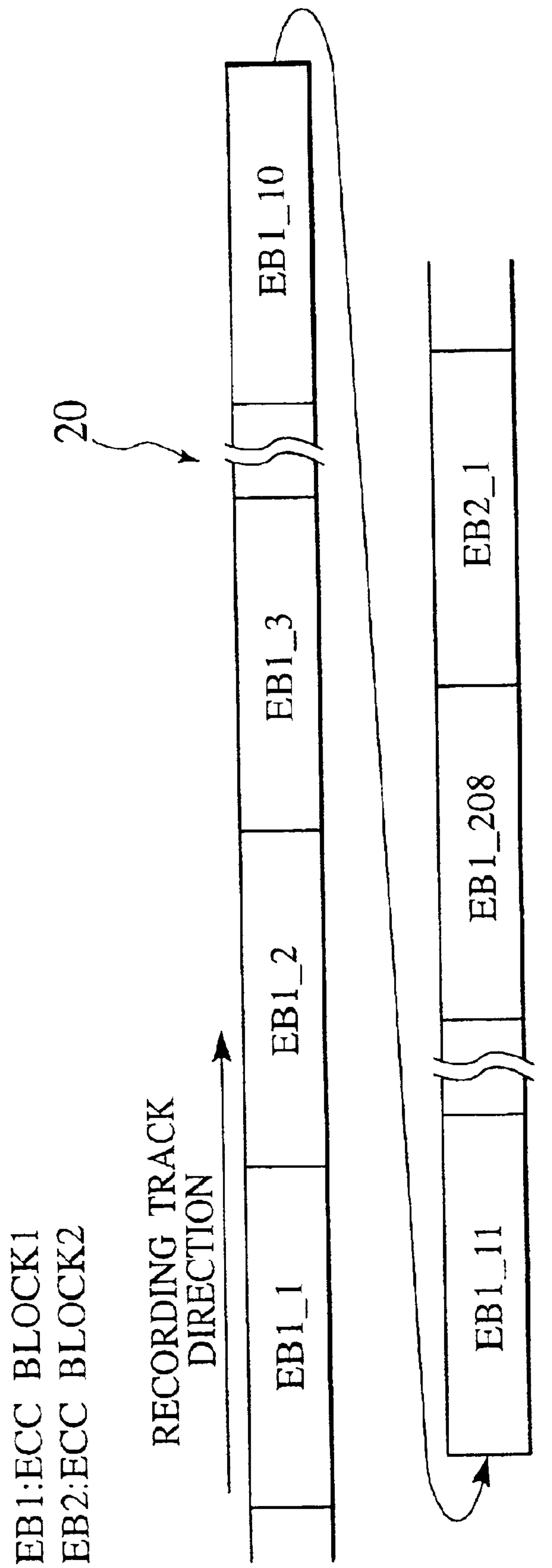
FIG. 7 is a diagram showing the arrangement of the data of the recording medium recorded using the recording method according to a second embodiment of the present invention.

FIG. 7 is a diagram showing the arrangement of the data of the recording medium recorded using the recording method according to the second embodiment of the present invention.

FIG. 8A shows a 9-rows burst error on the recording medium recorded using the recording method of the second embodiment of the present invention, and the error distribution of the ECC block after de-interleaving, when the recording medium is reproduced. FIG. 8B is a diagram showing a 18-rows burst error on the recording medium recorded using the conventional recording method, and the error distribution of the ECC block after de-interleaving, when the recording medium is reproduced.

Figure 9B:
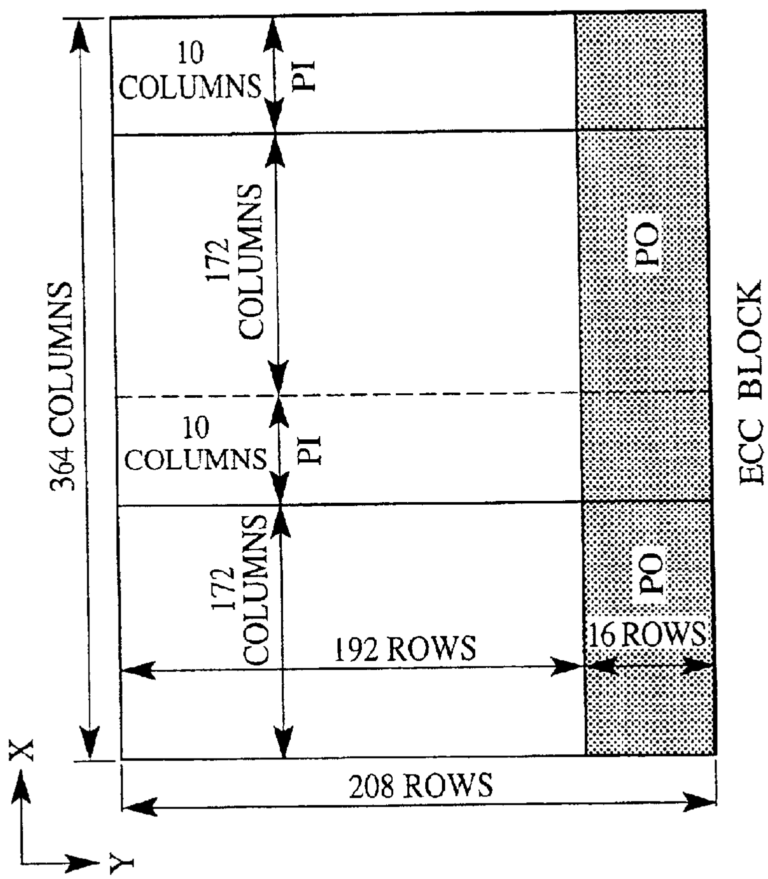
FIGS. 9A and 9B are diagrams (Diagram 1) showing the ECC block in the recording medium recorded using the recording method according to the second embodiment of the present invention.
Figure 9A:
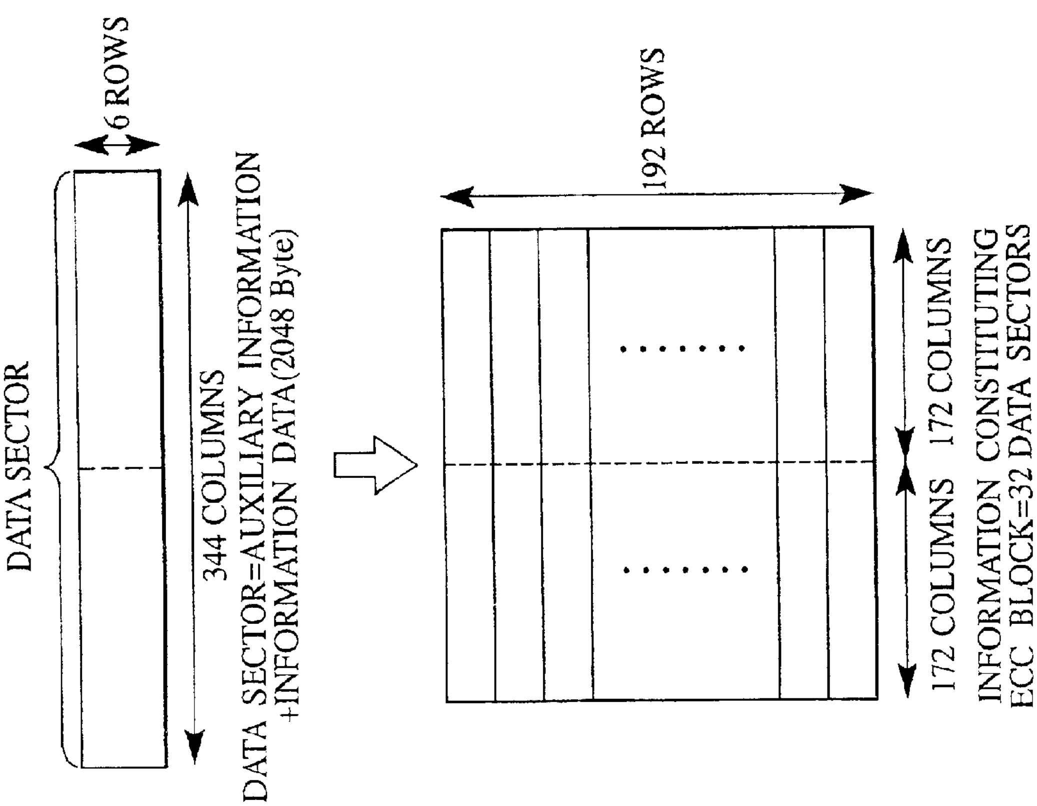
Figure 10:
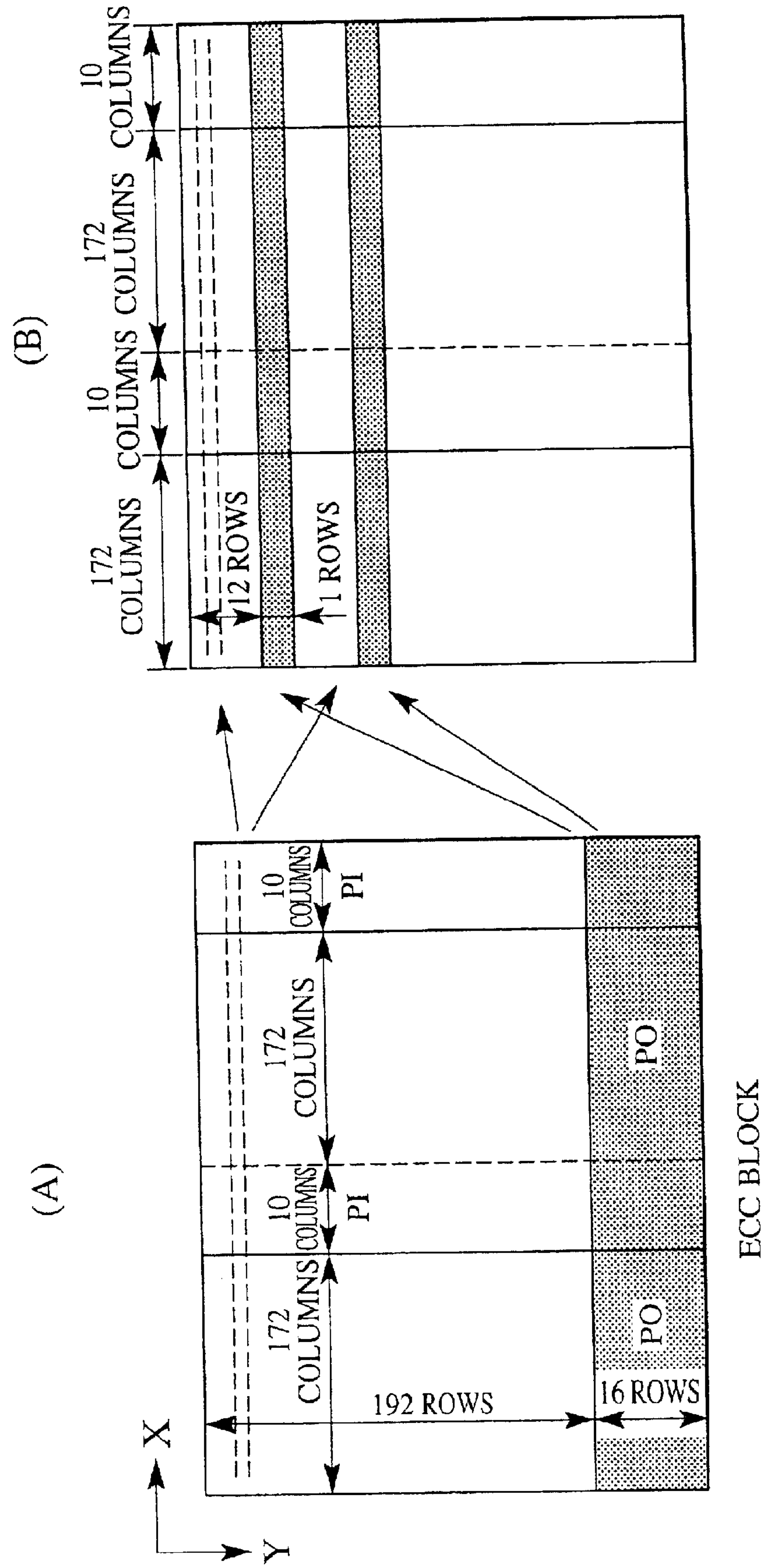
FIG. 10 is a diagram (Diagram 2) showing the ECC block in the recording medium using the recording method according to the second embodiment of the present invention.
Figure 11:
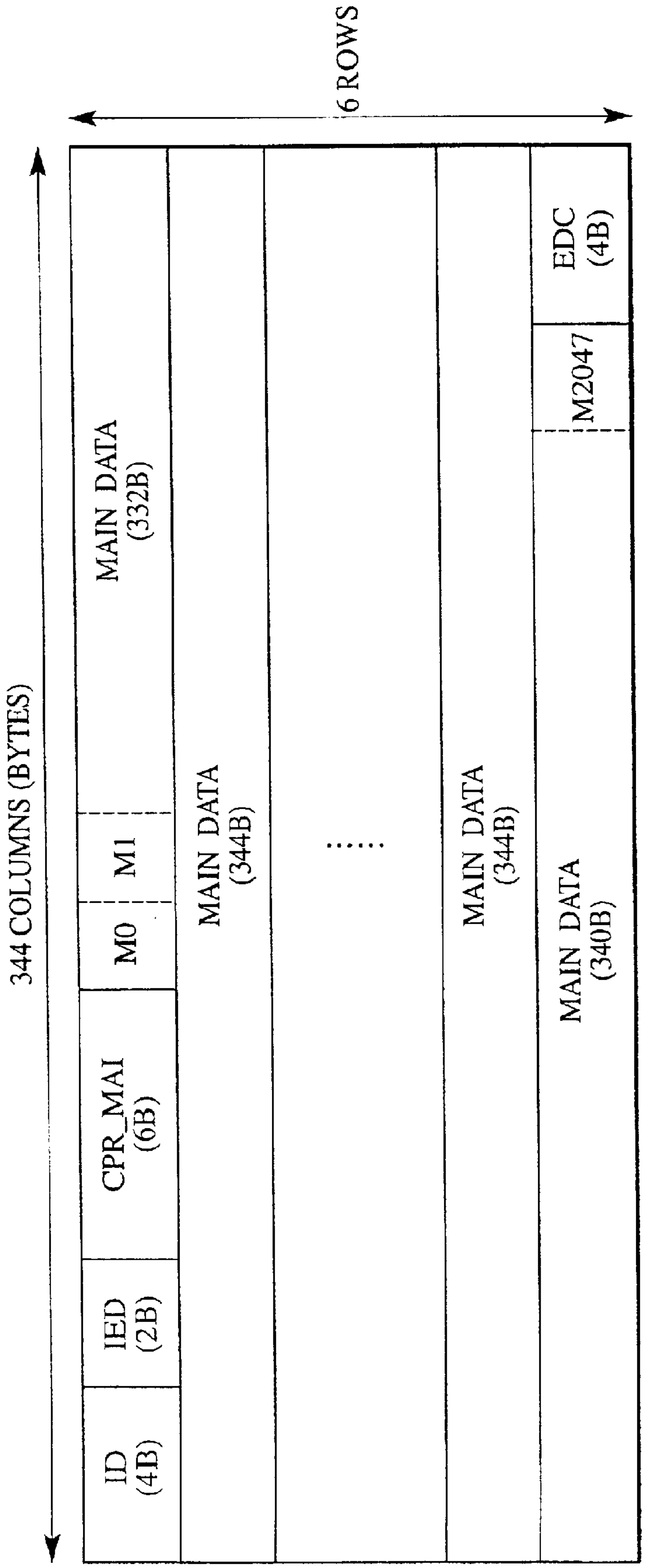
FIG. 11 is a diagram showing the constitution of the data sector of the recording medium according to the second embodiment.

FIGS. 9A and 9B are diagrams (Diagram 1) showing the ECC block in the recording medium recorded using the recording method according to the second embodiment of the present invention. FIG. 10 is a diagram (Diagram 2) showing the ECC block in the recording medium recorded using the recording method according to the second embodiment of the present invention. FIG. 11 is a diagram showing the constitution of the data sector of the recording medium according to the second embodiment.

As shown in FIG. 7, in the second embodiment of the present invention, the respective rows of the product-coded ECC block are recorded in order on the recording medium 20 such as the optical disk and magnetic disk. That is, the first row, second row, third row, . . . , 208-th row of the first ECC block EB1 are recorded in order. Thereafter, the first to 208-th rows of the second ECC block EB2 are similarly recorded in order.

Here, the constitution of the ECC block in the second embodiment of the present invention will be described. FIG. 11 shows the data sector of the recording medium 20 according to the second embodiment. As shown in FIG. 11, the data sector is constituted of 344 columns (bytes)×6 rows, and includes 2064 bytes of main data and "CPR_MAI" indicating ID, IED, and copy protect information CP. In FIG. 11, the "M0", "M1", and "M2047" indicate the first, second, and 2048-th bytes of the main data.

Figure 32:
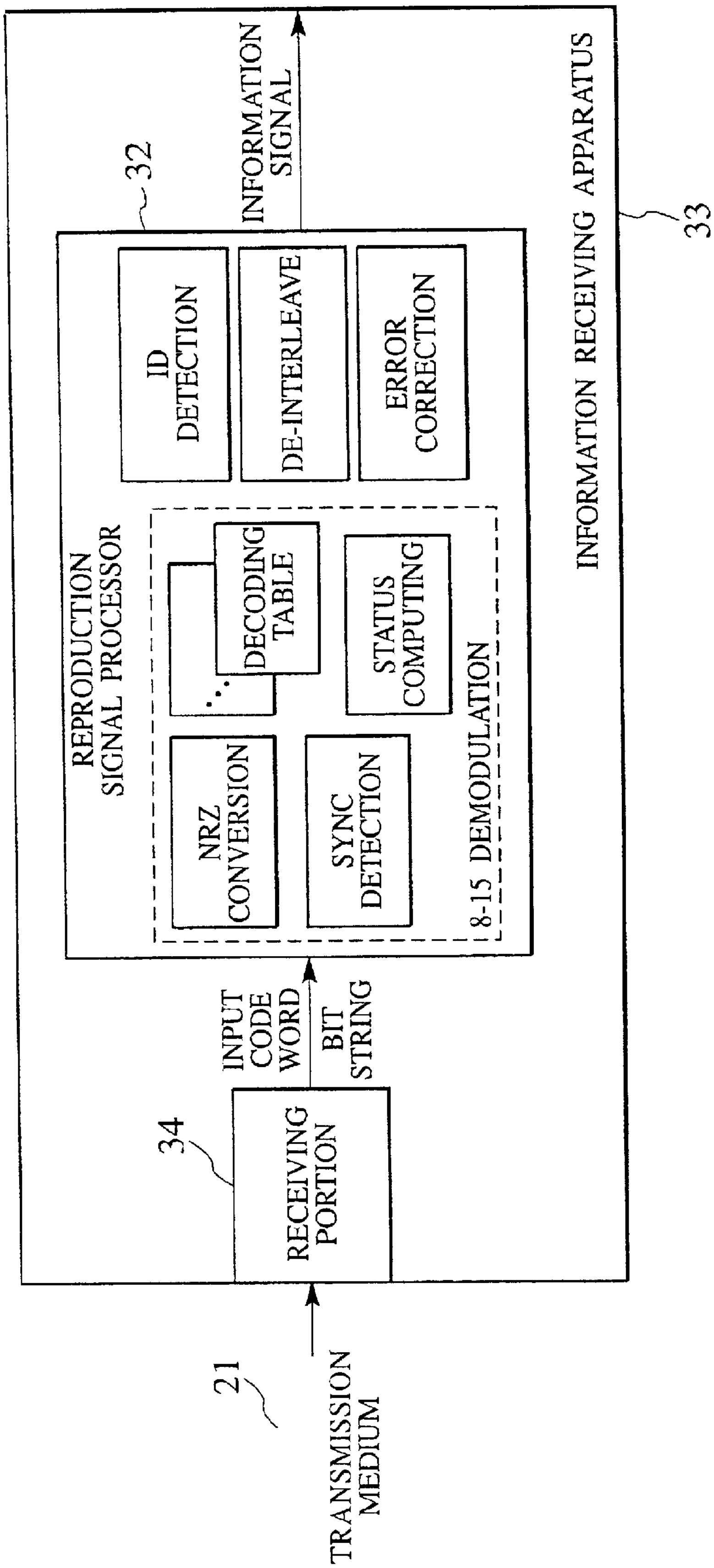
FIG. 32 is a block diagram showing an information receiving apparatus to which one embodiment of the receiving apparatus according to the present invention is applied.

In the second embodiment, 32 data sectors and parity by the product code constitute the ECC block. As shown in FIG. 9A, 32 data sectors of 344 columns×6 rows constitute a data string of 344 columns×192 rows, and are divided into two sub blocks each of 172 columns×192 rows in a row direction (arrow X direction). With respect to the respective sub blocks, 16 bytes of PO parity (outer parity) are first generated with RS (208, 192, 17) in the column direction (arrow Y direction). Subsequently, ten bytes of PI parity (inner parity) are generated with RS (182, 172, 11) in the row direction (arrow X direction) with respect to the respective sub blocks and PO parity. As shown in FIG. 9B, the ECC block of 364 columns×208 rows is constituted.

Moreover, during recording into the recording medium 20, similarly as DVD, one row of PO parity is inserted beforehand into 12 rows of data, and the ratio of the parity in the block having a unit of 13 rows is kept to be constant. Therefore, for the ECC block shown in FIG. 10A, as shown in FIG. 10B, interleaving is performed to insert one row of PO parity into the next row. In the ECC block, the first to 208-th rows are recorded in order.

Here, in the second embodiment, when the recording medium 20 according to the second embodiment recorded as shown in FIG. 7 is reproduced, the large burst error, for example, of nine rows is generated in the ECC block as shown in the upper part of FIG. 8A. Then, the error distribution included in each de-interleaved ECC block during reproduction is shown in the lower part of FIG. 8A.

On the other hand, when the conventional recording medium is reproduced, the sub block of the ECC block of FIG. 8A corresponds in size to the conventional ECC block of FIG. 8B. Therefore, the burst error of nine rows corresponds to the burst error of 18 rows in the conventional example.

Moreover, as seen from comparison between FIGS. 8A and 8B, the dispersion ratio of errors slightly changes with the generation start and end positions in the rows of the burst error. Generally, the dispersion ratio in the second embodiment of the present invention shown in FIG. 8A is reduced to ½ as compared with the conventional example shown in FIG. 8B. That is, in the second embodiment of the present invention, the error is not dispersed in each row, and there is no advantage of lengthening the correction length, but the number of error rows included in each column is reduced to ½ as compared with the conventional example.

In this case, even when an attempt is made to perform the erasure correction by the PO parity in the conventional example shown in FIG. 8B, 16 rows of error as the correction limit is exceeded, and the correction is therefore impossible. On the other hand, in the second embodiment of the present invention, as shown in FIG. 8A, the number of error rows of each ECC block is nine, 16 rows of error as the correction limit are not exceeded, and the correction is possible. Moreover the track linear density to the recording medium 20 is set to be twice that of DVD. Then, about 3 mm for 16 rows is the burst error correction limit in the conventional method, but the burst error correction up to about 6 mm is possible in the present method similarly as DVD. When the track linear density is set to be the same as that of DVD, the burst error correction of about 12 mm is possible. That is, the correction length can be doubled without changing redundancy.

Additionally, the example in which the data string constituting the ECC block is divided into two to form the sub blocks, the parity of the product code is added to each of the sub blocks, and the ECC block is constituted has been described. However, the block may also be constituted by dividing the string into m ($m \geqq 1$) sub blocks in the row direction (arrow X direction). In this case, by the m sub blocks, the burst error is reduced to 1/m as compared with the conventional example.

The 8–15 modulator 12 as another main part of the present invention will next be described with reference to FIGS. 12 to 25.

Figure 12:
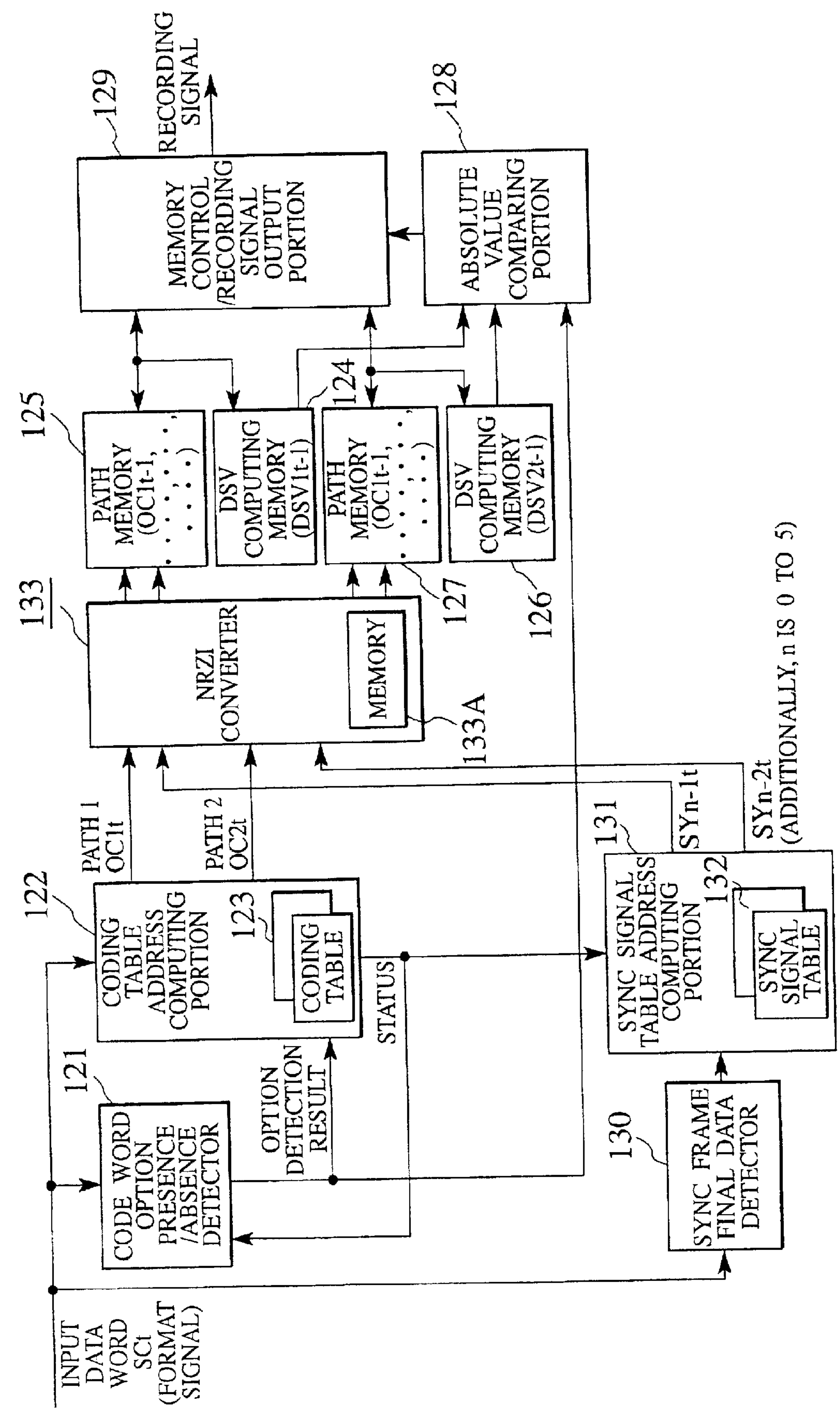
FIG. 12 is a block diagram showing a 8–15 modulator shown in FIG. 1.

FIG. 12 is a block diagram showing the 8–15 modulator shown in FIG. 2.

As shown in FIG. 12, the 8–15 modulator 12 as the main part of the present invention is constituted of a code word option presence/absence detector 121, a coding table address computing portion 122 including a plurality of coding tables 123, a synchronous frame final data detector 130, a synchronous signal table address computing portion 131 including a plurality of synchronous signal tables 132, an NRZI converter 133, first and second path memories 125, 127, first and second DSV computing memories 124, 126, an absolute value comparing portion 128, and a memory control/recording signal output portion 129.

Prior to description of an operation of each constituting member in the 8–15 modulator 12, the plurality of coding tables 123 disposed in the coding table address computing portion 122, and the plurality of synchronous signal tables 132 disposed in the synchronous signal table address computing portion 131 will first be described.

(Coding Table)

Figures 20, 21:
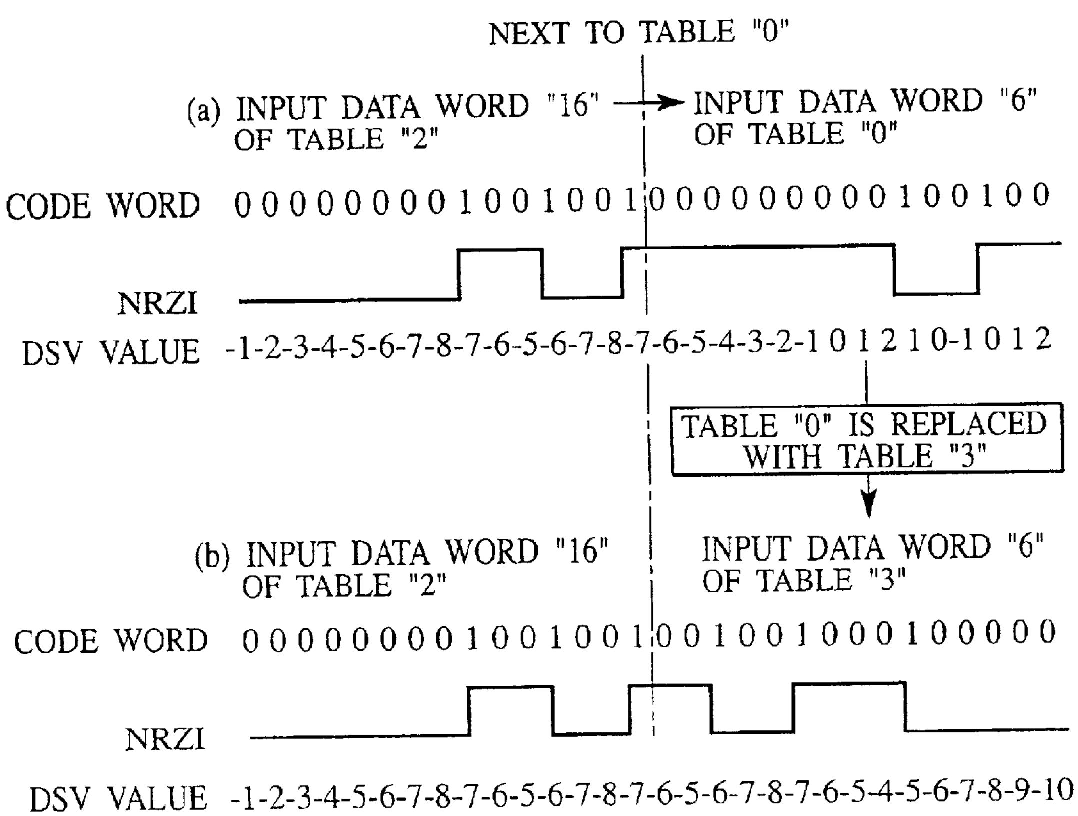
FIG. 20 is a diagram showing a next possible coding table in five classified cases with respect to a plurality of coding tables shown in FIGS. 13 to 19.
FIG. 21 is an explanatory view of replacement between the specific coding table and the other specific coding table among the plurality of coding tables with respect to the input data words.

FIGS. 13 to 19 are diagrams showing one example of the coding table in order of Diagrams 1 to 7. FIG. 20 is a diagram showing a next possible coding table in five classified cases with respect to a plurality of coding tables shown in FIGS. 13 to 19. FIG. 21 is an explanatory view of replacement between the specific coding table and the other specific coding table among the plurality of coding tables with respect to the input data words.

As shown in FIGS. 13 to 19, for the plurality of coding tables 123 disposed in the coding table address computing portion 122, an initial table address for determining the coding table with respect to the input data word to be first inputted, and six coding tables constituted of states "0" to "5" are prepared beforehand.

Moreover, for the six coding tables, the 8-bit input data word SCt is allotted to "0" to "255" in terms of decimal number, and the respective input data words SCt allotted to "0" to "255" are converted to respective 15-bit code words shown in terms of binary number. Additionally, a right-end number of each code word sets state information (next state) indicating the coding table for use in modulating the input data word SCt in order to obtain a next code word satisfying a predetermined run length restriction rule, even when the code words are directly coupled to each other and thus the code word string is generated. This will be described more concretely. For example, the coding table of state "0" shown in FIG. 13 is referred to, and it is then seen that the state information is "4" with input data word "0", the state information is "5" with input data word "1", and the state information is "0" with input data word "2". Therefore, when the coding table of state "0" is used and the input data word "0" is modulated (coded), the coding table of state "4" is used to modulate the next input data word SCt.

Moreover, the six coding tables are set such that each inputted data word SCt is converted to a 15-bit code word (one code word) so as to satisfy the run length restriction rule RLL (2, 10) having a minimum run length of 3T and maximum run length of 11T. In this case, as described in the conventional art, with the minimum run length of 3T, d=2 "0"s at minimum are included between logic values "1" and "1" in the 15-bit code word, and with the maximum run length of 11T, k=10 "0"s at maximum are included between the logic values "1" and "1" in the 15-bit code word, so that the run length restriction rule RLL (d, k)=RLL (2, 10) is satisfied. Additionally, the tables are set so as to satisfy the run length restriction rule RLL (2, 10) even with the code word string constituted by directly coupling the code words to each other.

Furthermore, in the six coding tables, as shown in FIG. 20, a possible state of the coding table transiting to the next can be classified into five cases of cases 0 to 4 by a zero run length on an LSB side (lower bit side) in the outputted 15-bit code word.

Additionally, for the six coding tables, the code words stored corresponding to the predetermined input data words SCt are allotted to have an even/odd relation such that the number of "1" in 15 bits is even (odd) in the code word in the specific coding table and the number is odd (even) in the code word in the other coding table so as to perform the DSV control. Moreover, the code words are allotted such that during the DSV control of each signal obtained by NRZI conversion of each code word, polarities of DSV values are +− reverse polarities.

Furthermore, as described later, as a mode for switching the code word between the code word of the specific coding table corresponding to the predetermined input data word SCt and the code word of the other coding table corresponding to the same predetermined input data word SCt so that the code word having a smaller absolute value of DSV value (equivalent to a direction in which the DSV value approaches 0) can be taken, the three first to third modes are set as described later. Therefore, for the first to third modes described later, it is judged that "there is an option" with respect to the predetermined input data word SCt. In other cases, it is judged that "there is not any option" with respect to the predetermined input data word SCt.

That is, in the first mode, when the specific coding table is the coding table of state "0" and the other specific coding table is the coding table of state "3", the respective signals obtained by NRZI conversion of the respective output code words of the coding tables of states "0" and "3" corresponding to the input data words "0" to "38" have polarities opposite to each other in terms of the DSV value (even/odd parities of the number of "1"s included in the code words are different from each other). However, as shown in a DSV control flowchart at a time of 8–15 modulation of FIG. 25 described later, in consideration of a decoding time, when the state information "0" is detected, the respective output code words of the coding table of state "0" corresponding to the input data words "0" to "38" can be replaced with the respective output code words of the coding table of state "3" corresponding to the input data words "0" to "38". Additionally, even when the code words are replaced, the run length restriction rule can be maintained, and further the decoding is possible.

This respect will more concretely be described with reference to section (a) and (b) in FIG. 21. As shown in (a) of FIG. 21, for example, when the coding table of state "2" is used to convert the input data word "16" to code word {000000001001001}, the coding table of state "0" is designated in accordance with the state information. Thereby, the state information "0" is detected, the coding table of state "0" is used to convert the next inputted data word "6" to code word {000000000100100}, then the number of "1" in the code word {000000000100100} is two and even.

On the other hand, as shown in (b) of FIG. 21, when the coding table of state "2" is used to convert the input data word "16" to code word {000000001001001}, the next coding table of state "0" is designated in accordance with the state information. However, as described above, the table is set so as to be replaceable with the coding table of state "3". Thereby, when the coding table of state "3" is used to convert the input data word "6" to code word {001001000100000}, the number of "1" in the code word {001001000100000} is three and odd. Therefore, the coding table of state "0" and the coding table of state "3" have an even/odd relation of the number of "1" with respect to the input data word "6".

Thereafter, the code word strings in (a), (b) of FIG. 21 is subjected to the NRZI conversion. Here, because the NRZI conversion carries out modulation by inverting the polarity at bit "1" while not converting the polarity at bit "0" as well known, the respective signals are obtained as shown in (a), (b) of FIG. 21.

Thereafter, the DSV values are compared with each other in order to perform a satisfactory DSV control with respect to the respective signals obtained by the NRZI conversion of the code word strings of (a), (b) in FIG. 21, and a smaller absolute value of the DSV value is selected. This DSV value is an accumulated value from a start point of each signal obtained by the NRZI conversion with the value of bit "1" as +1 and the value of bit "0" as −1, as well known. In case of (a) in FIG. 21, the DSV value is +2 while in case of (b) in FIG. 22, the DSV value is −10, so that the polarities of the DSV values of the two cases are opposite. Also, even if the coding tables are replaced, the run length restriction rule can be maintained and further, decoding is possible. Meanwhile, as for the examples of (a), (b) in FIG. 21, because the case of (a) in FIG. 21 provides a smaller absolute value in terms of the DSV value, this case should be selected. Usually, the DSV value changes depending on the status since before.

Next, in the second mode, when the specific coding table is the coding table of state "2" and the other specific coding table is the coding table of state "4", the even/odd relation is disposed for the number of "1" with respect to the input data words "0" to "11" and "26" to "47" of the respective coding tables of states "2" and "4". Also as shown in the DSV control flowchart at the time of 8–15 modulation of FIG. 25, in consideration of the decoding time, when the state information "2" is detected, the respective output code words of the coding table of state "2" corresponding to the input data words "0" to "11" and "26" to "47" can be replaced with the respective output code words of the coding table of state "4" corresponding to the input data words "0" to "11" and "26" to "47". Additionally, even when the code words are replaced, the run length restriction rule can be maintained, and further the decoding is possible.

Subsequently, in the third mode, regarding the coding table of status "3", when the zero run length on the LSB side of a previous output code word is 2 to 6 and the input data word SCt is less than "156", it is also applicable as far as the run length restriction rule is satisfied even if a next code word is replaced with an output code word in the coding table of status "0".

In the plurality of coding tables 123 described above, when the input data word SCt having a bit number p=8 is converted to the code word having a bit number q=15 bits in accordance with respective promises of the aforementioned coding time, the 8–15 modulation is performed to satisfy the run length restriction rule RLL (d, k)=RLL (2, 10) having a minimum run length of 3T and maximum run length of 11T. This is not limited. The six coding tables can be used to change the run length restriction rule to RLL (2, 11), RLL (2, 12), or RLL (2, 13). In this case, when the run length restriction rule is changed in step 407 of an operation flow (FIG. 25) described later, the minimum run length of 3T and maximum run length of 12T, 13T, or 14T are partially possible excluding conditions of steps 403, 405.

Of course, when the input data word SCt of p=8 is converted to the code word of q=15 bits in the same technical idea as that of the coding table without using the six coding tables, it is also possible to newly set the respective code words and state information in the coding table in order to satisfy the minimum run length of 3T and maximum run length of 12T, 13T, or 14T. When the maximum run length is set to 12T, 13T, or 14T longer than 11T, it is possible to further increase opportunities for the DSV control with an increase of the maximum run length. Additionally, the arrangement of the code words with respect to the data word is not limited to that of the present example, and the arrangement can also be changed without disturbing the run length principle.

(Synchronous Signal Table)

Figures 23, 24:
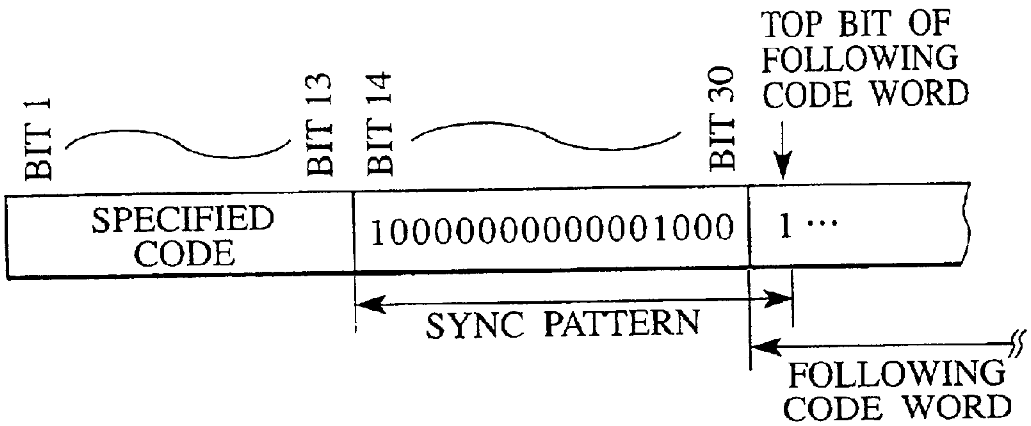
FIG. 23 is a diagram showing a format of the coding table of a synchronous signal.
FIG. 24 is a diagram showing a format of a transmission signal for one sector.

FIG. 22 is a diagram showing one example of the synchronous signal table. FIG. 23 is a diagram showing a format of the coding table of the synchronous signal. FIG. 24 is a diagram showing a format of a transmission signal for one sector.

As shown in FIG. 22, for the plurality of synchronous signal tables 132 disposed in the synchronous signal table address computing portion 131, an initial table for setting an initial value of the option of the synchronous signal table with respect to the synchronous signal to be first inputted, and six synchronous signal tables constituted of states "0" to "5" corresponding to the state information of the coding table 123 described above are prepared beforehand.

Moreover, the respective synchronous signal tables of the states "0" to "5" are prepared in accordance with the state information in order to obtain the next code word SCt of final input data of a synchronous frame. Additionally, the signals are grouped into five synchronous signal bit patterns constituted of SY0 to SY5 in each synchronous signal table.

Furthermore, for the five synchronous signal bit patterns SY0 to SY5, two synchronous signal bit patterns constituted of a synchronous signal bit pattern SYn-1*t* (n is in a range of 0 to 5) of 1 to 30 bits on a left side of the drawing and a synchronous signal bit pattern SYn-2*t* (n is in a range of 0 to 5) of 1 to 30 bits on a right side of the drawing are regarded as one set. For the DSV control, the even/odd relation is disposed such that the number of "1" is even (or odd) in one synchronous signal bit pattern SYn-1*t* and is odd (or even) in the other synchronous signal bit pattern SYn-2*t*. The bit patterns are allotted so that the polarities of the DSV values of the respective DSV controlled signals obtained by the NRZI conversion of the respective synchronous signal bit patterns SYn-1*t*, SYn-2*t* are +− reverse polarities.

Furthermore, as shown in FIG. 23 in an enlarged manner, the synchronous signal bit pattern constituted of 1 to 30 bits is constituted of a specific code of 1 to 13 bits, and a most part of bit strings of a synchronous pattern of 14 to 30 bits following the specific code. Additionally, the synchronous pattern is constituted of 14 to 30 bits in the synchronous signal bit pattern, and a part of the following code word. Moreover, the modulation is performed such that the top bit of the code word SCt following the synchronous signal is set to "1" by setting an uppermost bit as a top bit of the following code word to "1". In this case, for the coding table 123 in which the top bit of the code word is "1", the coding table of state "5" is prepared in the embodiment.

Furthermore, the specific code in the synchronous signal bit pattern is allotted to bits 1 to 13. Therefore, positions in one sector described later can be identified, and DC control is enabled.

Moreover, in the aforementioned synchronous pattern, a first bit pattern having a maximum run length of 13T longer than 11T by 2T in a 8–15 modulation signal is used as a core. The synchronous pattern has a 13T–4T arrangement in which a second bit pattern having a fixed length of 4T is disposed after the first bit pattern of 13T, that is, a bit pattern of {10000000000000010001}, and a fixed pattern common to all the synchronous signals. In this case, the second bit pattern of 4T arranged after the first bit pattern of 13T in the synchronous pattern has a fixed length. This is because disposing the specific code in the upper portion of synchronous pattern enables a degree of freedom to increase and also enables the possible number of patterns of the specific code to be sufficiently secured.

Additionally, in the synchronous signal table 132 of the aforementioned embodiment, a maximum interval of the synchronous pattern constituted of bits 14 to 30 in the synchronous signal bit pattern and a part of the following code word has been described in an example of the first synchronous pattern of 13T longer than the maximum run length 11T of the run length restriction rule of the modulation method by 2T. This is not limited. The maximum run length of the first bit pattern may be longer than the maximum run length restriction by 1T or more. The embodiment is effective, particularly when the first bit pattern is longer than the maximum run length by 3T or 4T.

Moreover, the second bit pattern of 4T after the first bit pattern in the synchronous pattern has been described as an example, but this is not limited, and the second bit pattern of 5T or more may be combined. In the embodiment the combination is 13T–4T in consideration of efficiency of the modulation/demodulation method.

Furthermore, as shown in FIG. 24, for the synchronous signal according to the synchronous signal bit pattern, any one of synchronous signal bit patterns SY0 to SY5 is selected, for example, for every 91 code words constituting the code word string of the input data word SCt, and added to the top of 91 code words so that the recording signal corresponding to one synchronous frame is outputted. In this case, as shown in FIG. 24, for the recording signal format per sector, one sector is constituted of 13 rows, and four synchronous frames are allotted to each row in the column direction. The synchronous signal allotted to each synchronous frame is selected from the synchronous signal bit patterns SY0 to SY5 shown in FIG. 22. For example, the synchronous signal bit pattern allotted to the previous synchronous frame of the first row corresponds to the selected SY0. In and after the first row, the synchronous signal bit pattern allotted to the synchronous frame is structured to cyclically repeat like SY1 to SY3 with a row increase. In this case, a difference among SY1 to SY3 is determined by the aforementioned specific code. That is, one of the respective specific codes of the four synchronous signal bit patterns existing in each row is structured to cyclically repeat in response to the row increase.

Here, turning back to FIG. 12, the operation of the 8–15 modulator 12 will be described.

In the 8–15 modulator 12, the synchronous signal and input data word SCt are subjected to the aforementioned DSV control, and the finally outputted synchronous signal and the code word corresponding to the input data word SCt are determined. To facilitate understanding of the description, the DSV control of the input data word SCt will first be described.

When the 8–15 modulator 12 performs the DSV control of the input data word SCt, first the initial coding table (initial value of option of the coding table 123) is selected for the input data word SCt. Subsequently, the 8-bit input data word SCt is inputted, and then the code word option presence/absence detector 121 detects that the output code word corresponding to the present input data word SCt belongs to any one of the first to third modes and has an option for the DSV control, or that the output code word is other than the first to third modes, has no option, and is uniformly determined, based on the present input data word SCt, and the state information determined by the previous output code word (the selected initial value herein) supplied from the coding table address computing portion 122. The detection result is outputted to the coding table address computing portion 122 and absolute value comparing portion 128. Moreover, the coding table address computing portion 122 calculates an address of the coding table 123 in accordance with the detection result of "presence of the option" or "absence of the option" from the code word option presence/absence detector 121.

That is, in the first mode, when the state information supplied from the coding table address computing portion 122 is the state "0", and the input data word SCt is "0" to "38", the code word option presence/absence detector 121 outputs the detection result of "presence of the option". In this case, since two addresses are calculated by the coding table address computing portion 122, the coding table 123 outputs two types of code words by a time division processing or the like. Moreover, the coding table address computing portion 122 reads an output code word OC1t corresponding to the input data word SCt of the coding table of state "0" in the coding tables 123 for a path 1, and reads an output code word OC2t corresponding to the input data word SCt of the coding table of state "3" for a path 2.

Moreover, in the second mode, when the state information supplied from the coding table address computing portion 122 is the state "2", and also when the input data word SCt is "0" to "11" or "26" to "47", the code word option presence/absence detector 121 outputs the detection result of "presence of the option". In this case, the coding table address computing portion 122 reads the output code word OC1t corresponding to the input data word SCt of the coding table of state "2" in the coding tables 123 for the path 1, and reads the output code word OC2t corresponding to the input data word SCt of the coding table of state "4" for the path 2.

Furthermore, in the third mode, when the stage information supplied from the coding table address computing portion 122 is the state "3", the zero run length of the previous output code word on the LSB side is in a range of 2 to 6, the input data word SCt is "156" or less, and the coding rule is not broken even with replacement of the next output code word with the output code word in the coding table of state "0", the code word option presence/absence detector 121 outputs the detection result of "presence of the option". In this case, the coding table address computing portion 122 reads the output code word OC1t corresponding to the input data word SCt of the coding table of state "3" in the coding tables 123 for the path 1, and reads the output code word OC2t corresponding to the input data word SCt of the coding table of state "0" for the path 2.

On the other hand, the code word option presence/absence detector 121 outputs the detection result of "absence of the option" (uniformly determined) to the coding table address computing portion 122 on conditions other than those of the first to third modes. In this case, the coding table address computing portion 122 calculates only one address, and only the output code word OC1t corresponding to the address is read from the coding table address computing portion 122.

Subsequently, with "the presence of the option" matching the first to third modes, the NRZI converter 133 subjects both the output code words OC1t and OC2t to NRZI conversion. On the other hand, with "the absence of the option" other than the first to third modes, only the output code word OC1t is subjected to the NRZI conversion. In this case, when the each of the code words OC1t, OC2t (with "the presence of the output") or the code word OC1t (with "the absence of the output") outputted from the coding table address computing portion 122 is subjected to the NRZI conversion, either an immediately previous code word OC1t−1 or an immediately previous code word OC2t−1, determined by DSV calculation with respect to the code word (OC1t−1, OC2t−1) immediately before the present word as described later, is stored in an internal memory 133A. Therefore, one immediately previous code word stored in the memory 133A is referred to and thereby to perform the NRZI conversion.

Subsequently, as described later in an operation flow, each of the code words OC1t and OC2t−1, or the code word OC1t subjected to the NRZI conversion in the NRZI converter 133 is not immediately stored in the first and second path memories 125, 127. The code word is stored in the first and second path memories 125, 127, after the immediately previous code word is finally determined in accordance with a comparison result of the absolute value of the DSV value with respect to the previous code words calculated in the first and second DSV computing memories 124, 126.

Here, the first and second DSV computing memories 124, 126 compute the DSV values (accumulated value) with respect to the previous code words, and the absolute values of the DSV values are compared by the absolute value comparing portion 128. This case will be described. In the first path memory 125, the immediately previous code word OC1t−1, and all the code words determined before the immediately previous code word OC1t−1 are stored in a time series order in an NRZI converted state, and the code words stored in the first path memory 125 in the time series order are outputted to the first DSV computing memory 124. Similarly, in the second path memory 127, the immediately previous code word OC2t−1, and all the code words determined before the immediately previous code word OC2t−1 are stored in the time series order in the NRZI converted state, and the code words stored in the second path memory 127 in the time series order are outputted to the second DSV computing memory 126. Additionally, when nothing is stored in the first and second path memories 125, 127, 0 is regarded, the processing is performed, and then the code words may successively be accumulated.

Subsequently, the first DSV computing memory 124 computes the DSV value obtained by adding values over the previous code words and the immediately previous code word OC1t−1, and DSV1t−1 is outputted as the result to the absolute value comparing portion 128. Similarly, the second DSV computing memory 126 computes the DSV value obtained by adding values over the previous code words and the immediately previous code word OC2t−1, and DSV2t−1 is outputted as the result to the absolute value comparing portion 128.

Next, the absolute value comparing portion 128 compares a magnitude of an absolute value $|DSV1t-1|$ of the DSV value up to the immediately previous code word OC1t−1 outputted from the first DSV computing memory 124 with that of an absolute value $|DSV2t-1|$ of the DSV value up to the immediately previous code word OC2t−1 outputted from the DSV computing memory 126, and the comparison result is outputted to the memory control/recording signal output portion 129.

Subsequently, when the comparison result sent from the absolute value comparing portion 128 is $|DSV1t-1|<|DSV2t-1|$, the memory control/recording signal output portion 129 outputs all the previous output code words stored in the first path memory 125, and the immediately previous code word OC1t−1 as the recording signal, and also outputs the signal to the second path memory 127 to rewrite the second path memory 127. Additionally, a storage content of the second DSV computing memory 126 is rewritten into DSV1t−1 which has a smaller absolute value of the DSV value and which is stored in the first DSV computing memory 124.

On the other hand, when the comparison result sent from the absolute value comparing portion 128 is |DSV1t−1|≧|DSV2t−1|, the memory control/recording signal output portion 129 outputs all the previous output code words stored in the second path memory 127, and the immediately previous code word OC2t−1 as the recording signal, and also outputs the signal to the first path memory 125 to rewrite the first path memory 125. Additionally, the storage content of the first DSV computing memory 124 is rewritten into DSV2t−1 which has a smaller absolute value of the DSV value and which is stored in the second DSV computing memory 126.

Therefore the absolute value comparing portion 128 selects the immediately previous code word which has a smaller absolute value of the DSV value, and a code word string in which the previous output code words are combined with the selected immediately previous code word is outputted to the recording driving circuit 13 (FIG. 1) from the memory control/recording signal output portion 129.

Thereafter, with "the presence of the option", the NRZI converter 133 stores the respective signals obtained by the NRZI conversion of the output code words OC1t, OC2t in the first and second path memories 125, 127, respectively. On the other hand, with "the absence of the option", the signal obtained by the NRZI conversion of only the output code word OC1t is stored in both the first and second path memories 125, 127. Accordingly, the respective signals stored in the first and second path memories 125, 127 are immediately before code words OC1t+t, OC2t+1 corresponding to input data word SCt+1 to be coded next during the DSV control. Moreover, when the respective signals stored in the first and second path memories 125, 127 are substantially similarly subjected to DSV computing and stored in the first and second DSV computing memories 124, 126, the signals are used in comparing the absolute values of the DSV values during the next operation.

The aforementioned operation is repeated until the input data word SCt is eliminated. After the NRZI conversion, the recording signal which satisfies the run length restriction rule of 3T to 11T and which is DSV controlled can be outputted as the recording signal to the recording medium 20.

On the other hand, the input data word SCt is also inputted into the synchronous frame final data detector 130. The synchronous frame final data detector 130 counts the number of input data words SCt (the synchronous frame is constituted of 91 code words), judges whether or not the input data word SCt is final data of the synchronous frame, and outputs the detection result for inserting the synchronous signal to the synchronous signal table address computing portion 131.

Moreover, when the input data word SCt is detected to be the final data of the synchronous frame, and the synchronous signal is inserted, the synchronous signal table address computing portion 131 selects any one of five synchronous signal bit patterns SY0 to SY5 in any one of the synchronous signal tables of states "0" to "5" based on the state information determined by the preceding output code word (the initial value of the initial table herein) supplied from the coding table address computing portion 122 and the information indicating any one of five synchronous signal bit patterns SY0 to SY5 held in the synchronous signal table address computing portion 131. Here, the addresses of two synchronous signal bit patterns SYn-1*t*, SYn-2*t* (n is 0 to 5) which correspond to the type selected from SY0 to SY5 and which are different in the even/odd relation from each other are calculated. The synchronous signal table 132 outputs the synchronous signal having two different bit patterns to the NRZI converter 133. Moreover, the NRZI converter 133 subjects two synchronous signals outputted from the synchronous signal table 132 to the NRZI conversion.

Thereafter, by a procedure similar to the procedure with the code word, the absolute values of the DSV values are compared with each other with respect to the immediately previous code word computed by the first and second DSV computing memories 124, 126. After the comparison result of the absolute values of the DSV values is obtained, and the immediately previous code word is determined, two synchronous signals outputted from the NRZI converter 133 are stored in the first and second path memories 125, 127. Moreover, the respective synchronous signals stored in the first and second path memories 125, 127 are subjected to DSV computation and stored in the first and second DSV computing memories 124, 126 similarly as described above, and are used for comparison of the absolute values of the DSV values during the next operation.

In this case, with first insertion of the synchronous signal, it may be assumed that the immediately previous code word is not stored in the first and second path memories 125, 127.

In this case, at the time when the following input data word SCt results in "the presence of the option" after the synchronous signal is inputted, the absolute values of the DSV values immediately before including the synchronous signal are compared, and the synchronous signal relating with the smaller absolute value of the DSV values immediately before including the synchronous signal is determined. Moreover, the synchronous signal is inserted, for example, into every 91 pieces of word data.

Additionally, the first and second path memories are disposed in the 8–15 modulator 12 in order to temporarily store the synchronous signal and code word string, but the present invention can also be applied even if more path memories are disposed.

Figure 25:
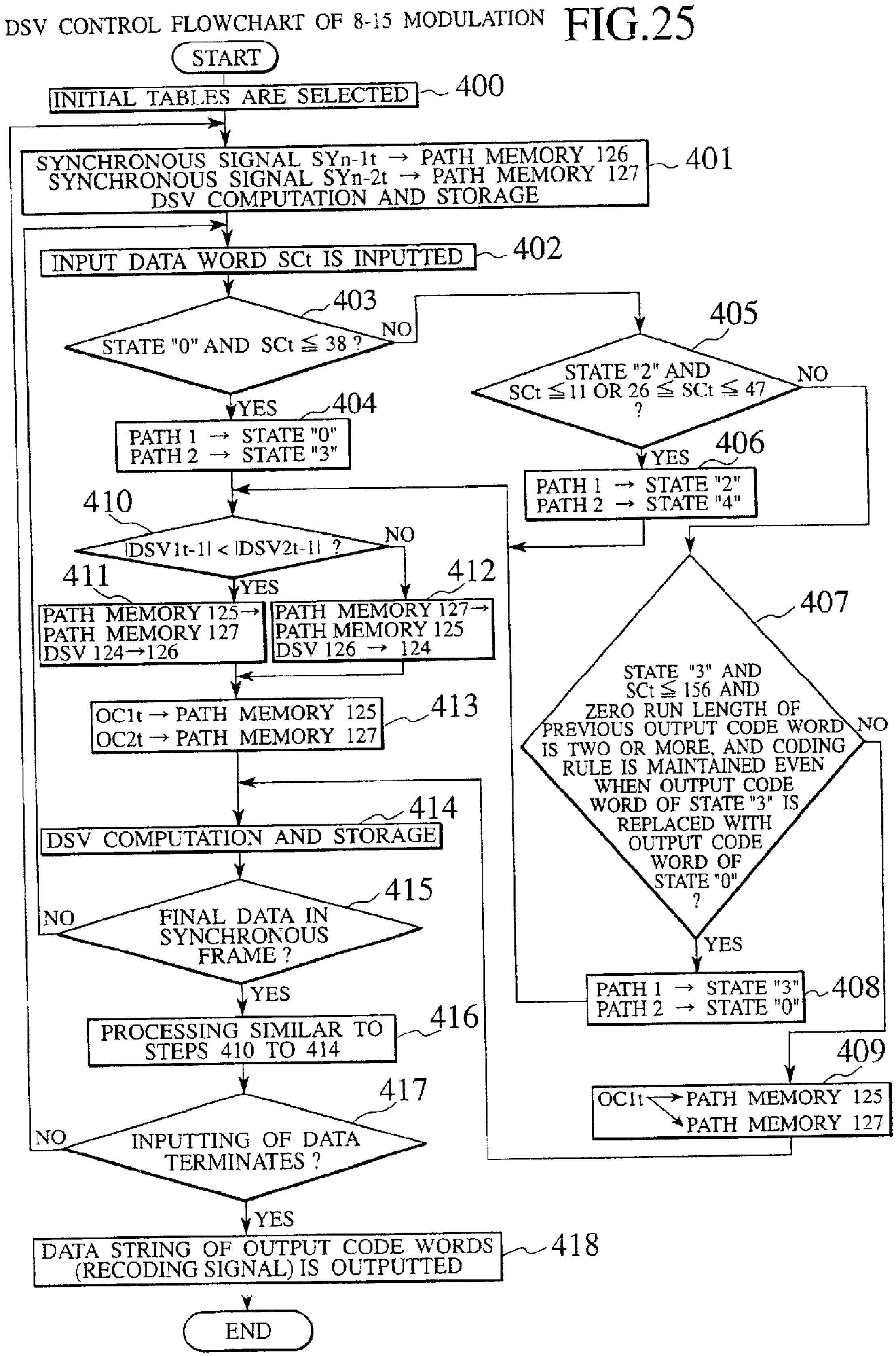
FIG. 25 is a flowchart of DSV control at a time of 8–15 modulation.

A concrete example of the operation will next be described in detail with reference to the DSV control flowchart of the 8–15 modulation time shown in FIG. 25, and FIG. 12.

First in step 400, the initial tables (the initial values of the option of the synchronous signal table 132 and coding table 123) are selected with respect to the synchronous signal and the input data word SCt.

Subsequently, in step 401, the synchronous signal table address computing portion 131 selects any one of SY0 to SY5 in any one of the synchronous signal tables of states "0" to "5" based on the state determined by the preceding output code word (the selected initial value for the first case) supplied from the coding table address computing portion 122 and the information indicating any one of five synchronous signal bit patterns SY0 to SY5 held in the synchronous signal table address computing portion 131. For example the synchronous signal bit pattern SYn (n is 0 to 5) in the synchronous signal table of state "n" (n is 0 to 5) is selected. The synchronous signal bit pattern SYn holds two synchronous signal bit patterns SYn-1*t*, SYn-2*t* (n is 0 to 5) whose polarities differ from each other after the NRZI conversion because of the different even/odd relation with respect to the number of "1". Therefore, the NRZI converter 133 converts the two synchronous signal bit patterns SYn-1*t*, SYn-2*t* into NRZI, respectively. Thereafter, as described above, the absolute values of the DSV values are compared up to both the immediately previous code words (there is no immediately previous code word with a first synchronous signal), and an either immediately previous code word is determined. Thereafter, two synchronous signals SYn-1*t*, SYn-2*t* subjected to the NRZI conversion in the NRZI converter 133 are outputted to the first and second path memories 125, 127, the DSV values including the synchronous signal SYn-1*t* are computed and stored in the first DSV computing memory 124, and the DSV values including the synchronous signal SYn-2*t* are computed and stored in the second DSV computing memory 126.

Next in step 402, following the synchronous signal, the 8-bit input data word SCt is inputted.

Subsequently, in steps 403, 405, 407, the code word option presence/absence detecting circuit 121 judges that the present input data word SCt is univocally determined or that there is an option, based on the present input data word SCt, and the state determined by the preceding output code word (the selected initial value for the first case) supplied from the coding table address computing portion 122. The detection result is outputted to the coding table address computing portion 122 and absolute value comparing portion 128.

That is, in step 403, as described in the coding table shown in FIGS. 13, 19, the coding tables of states "0" and "3" are noted. According to the first mode, even when the respective output code words of the coding table of state "0" corresponding to the input data words "0" to "38" are replaced with the output code words of the coding table of state "3" corresponding to the input data words "0" to "38", the coding rule can be maintained, and the decoding is possible. Therefore, in this step, the code word option presence/absence detecting circuit 121 judges whether or not there is the option according to the first mode.

Moreover, when the state supplied from the coding table address computing portion 122 is "0", and the input data word SCt is "38" or less, namely the condition is matched (Yes), the code word option presence/absence detecting circuit 121 outputs the detection result of "the presence of the option", and the flow shifts to step 404. On the other hand, when the state is not "0", or the input data word SCt is not "38" or less, namely the condition is not matched (No), the flow shifts to step 405.

Subsequently, in step 404, according to the result of "the presence of the option" of step 403, the coding table address computing portion 122 reads the output code word OC1t corresponding to the input data word SCt of the table of state "0" for the path 1 from the coding table 123, and the output code word OC2t corresponding to the input data word SCt of the table of state "3" for the path 2, and the NRZI converter 133 subjects the output code words OC1t, OC2t to the NRZI conversion, respectively.

On the other hand, in step 405, the coding tables of states "2" and "4" are noted from the mismatched result by the step 403. According to the second mode, even when the respective output code words of the coding table of state "2" corresponding to the input data words "0" to "11" and "26" to "47" are replaced with the output code words of the coding table of state "4" corresponding to the input data words "0" to "11" and "26" to "47", the coding rule can be maintained, and the decoding is possible. Therefore, in this step, the code word option presence/absence detecting circuit 121 judges whether or not there is the option according to the second mode.

Moreover, the code word option presence/absence detecting circuit 121 judges whether or not the state supplied from the coding table address computing portion 122 is "2", and the input data word SCt is in a range of "11" or less or "26" to "47". When the condition is matched (Yes), the detection result of "the presence of the option" is outputted, and the flow shifts to step 406. On the other hand, when the condition is not matched (No), the flow shifts to step 407.

Subsequently, in step 406, according to the result of "the presence of the option" of step 405, the coding table address computing portion 122 reads the output code word OC1t corresponding to the input data word SCt of the table of state "2" from the coding table 123, and the output code word OC2t corresponding to the input data word SCt of the table of state "4", and the NRZI converter 133 subjects the output code words OC1t, OC2t to the NRZI conversion, respectively.

Subsequently, in step 407, from the mismatched result by the step 405, according to the third mode, with the coding table of state "3", the zero run length of the previous output code word on the LSB side is in a range of 2 to 6 (2 or more is shown in the flow), and the input data word SCt is "156" or less, and even the next output code word is replaced with the output code word in the coding table of state of "0", the coding rule is not broken. In this case, even when the output code word of state "3" is replaced with the output code word of state "0", the coding rule can be maintained, and the decoding is possible. Therefore, in this step, the code word option presence/absence detecting circuit 121 judges whether or not there is the option according to the third mode.

Accordingly, it is judged whether or not the zero run length of the previous output code word on the LSB side is 2 or more, the input data word SCt is "156" or less, the next output code word is selected from the coding table of state "3", and the coding rule is not broken even with replacement with the output code word in the coding table of state "0". When the condition is matched (Yes), the detection result of "the presence of the option" is outputted, and the flow shifts to step 408. On the other hand, when the condition is not matched (No), "the absence of the option" can be judged up to this step via the steps 403, 405. Therefore, the detection result of "the absence of the option" is outputted, and the flow shifts to step 409. Additionally, upon judging "the absence of the option" in step 407, without comparing the absolute values of the DSV values or selecting the path, only accumulation into the first and second path memories 125, 127 and DSV calculation updating in the first and second DSV computing memories 124, 126 are performed, until "the presence of the option" results.

In this case, in the embodiment, the run length restriction rule RLL (d, k)=RLL (2, 10) is set to be satisfied in the step 407. When the run length restriction rule RLL (d, k) is changed to RLL (2, 11), RLL (2, 12), or RLL (2, 13) in the step 407, the minimum run length of 3T, and the maximum run length of 12T, 13T, or 14T can partially be realized excluding the conditions of the steps 403, 405.

Subsequently, in step 408, according to the result of "the presence of the option" by the step 407, the coding table address computing portion 122 reads the output code word OC1t corresponding to the input data word SCt of the table of state "3" from the coding table 123, and the output code word OC2t corresponding to the input data word SCt of the table of state "0", and the NRZI converter 133 subjects the output code words OC1t, OC2t to the NRZI conversion, respectively.

Next in step 409, since "the absence of the option" is judged in the step 407, without comparing the absolute values of the immediately previous DSV values, according to the result of "the absence of the option", only the output code word OC1t corresponding to the input data word SCt is read from the coding table 123, the NRZI converter 133 subjects only the output code word OC1t to the NRZI conversion, and the signals obtained by converting only the output code word OC1t into NRZI are stored in both the first and second path memories 125, 127. In this case, the output code words OC1t, OC2t of the paths 1, 2 have the same value. Thereafter, the flow shifts to step 414, and a processing of steps 414 and 415 is performed.

Next in step 410, the respective signals obtained by subjecting the output code words OC1t, OC2t to the NRZI conversion by the NRZI converter 133 in the step 404, 406, or 408 are not stored in the first and second path memories 125, 127. In this state, the absolute values |DSV| of the respective DSV values obtained by subjecting up to the immediately previous code word stored in the first and second DSV computing memories 124, 126 to the DSV computation are compared by the absolute value comparing portion 128. Here, with the code word following the synchronous signal, the absolute values of the respective DSV values computed in the step 401 are compared with each other. With the output code words OC1t, OC2t, the absolute values of the respective DSV values computed by considering up to immediately previous values and stored in step 414 described later at the previous loop are compared with each other.

Here, when the absolute value |DSV1t−1| of DSV1t−1 from the first DSV computing memory 124 is smaller than the absolute value |DSV2t−1| of DSV2t−1 from the second DSV computing memory 126 (Yes), the previous output code words accumulated in the first path memory 125 are outputted to the second path memory 127 to rewrite the second path memory 127 in step 411. Additionally, the second DSV computing memory 126 is rewritten with DSV1t−1 stored in the first DSV computing memory 124 (the content of the second DSV computing memory 126 is changed to DSV1t−1). On the other hand, when the absolute value |DSV2t−1| of DSV2t−1 from the second DSV computing memory 126 is smaller or the same (No), the previous output code words accumulated in the second path memory 127 are outputted to the first path memory 125 to rewrite the first path memory 125 in step 412. Additionally, the first DSV computing memory 124 is rewritten with DSV2t−1 stored in the second DSV computing memory 126 (the content of the first DSV computing memory 124 is changed to DSV2t−1).

Subsequently, after the steps 411 and 412, in step 413, the respective signals obtained by subjecting the output code words OC1t, OC2t to the NRZI conversion by the NRZI converter 133, that is, the signal corresponding to the output code word OC1t of the path 1, and the signal corresponding to the output code word OC2t of the path 2 are additionally stored in the first and second path memories 125, 127, respectively.

Subsequently, in step 414, the DSV value including the output code word OC1t of the path 1 is computed and stored in the first DSV computing memory 124, and the DSV value including the output code word OC2t of the path 2 is computed and stored in the second DSV computing memory 126. Here, the respective DSV values stored in the first and second DSV computing memories 124, 126 are used for comparison of the absolute values of the respective DSV values computed by considering up to immediately previous values, in step 410 during the operation steps for the next code word.

Next in step 415, when the synchronous frame final data detector 130 does not judge that the input data word SCt is final data in the synchronous frame (No), then, returning to the step 402, the steps 402 to 415 are repeated. On the other hand, it is judged that the input data word SCt is the final data in the synchronous frame (Yes), and then in step 416 the synchronous signal bit patterns SYn-1*t*, SYn-2*t* are subjected to a processing similar to the processing of the steps 410 to 414.

Next in step 417, when inputting of the next input data word SCt does not terminate (No), the flow returns to the step 401. On the other hand, when inputting of the next input data word SCt terminates (Yes), the data string of the output code words stored in the first path memory 125 (or the second path memory 127) is outputted to the recording driving circuit (FIG. 1) from the memory control/recording signal output portion 129 in step 418.

Moreover, for the 15-bit recording signal coded in this manner, the synchronous signal is inserted into every predetermined number of code words (e.g., every 91 code words). The run length restriction rule in which the minimum run length excluding the synchronous signal is 3T (T=period of channel bit) and the maximum run length is 11T is satisfied. The coding rate is raised, and the recording in the recording medium 20 such as the optical disk and magnetic disk at the high density can be realized.

Additionally, in the present invention, the DSV control method of comparing the magnitude of the DSV absolute value obtained from the code word modulated using the specific coding table with that of the DSV absolute value obtained from the code word modulated using the other specific coding table, and selecting corresponding code word having a smaller absolute value has been described. However, this is not limited, and the present invention is effective even in different DSV control methods. For example, the present invention may be applied to a method of not replacing the codes of the tables even if the coding tables in the present embodiment are used, and inserting a DSV control bit for each specific period to perform the DSV control, or a method of using different parameters such as a maximum amplitude of DSV in a predetermined section to perform the DSV control instead of using the absolute value of the DSV.

Moreover, in the present invention, for the modulation method, the example of 8–15 modulation method with p=8, q=15 has been described, but the present invention is also effective in different modulation methods. For example, as described in Japanese Patent Application Laid-Open No. 2000-332613 previously proposed by the present applicant, a modulation method of p=4, q=6 may also be used.

<Transmitting apparatus and Medium>

Figure 26:
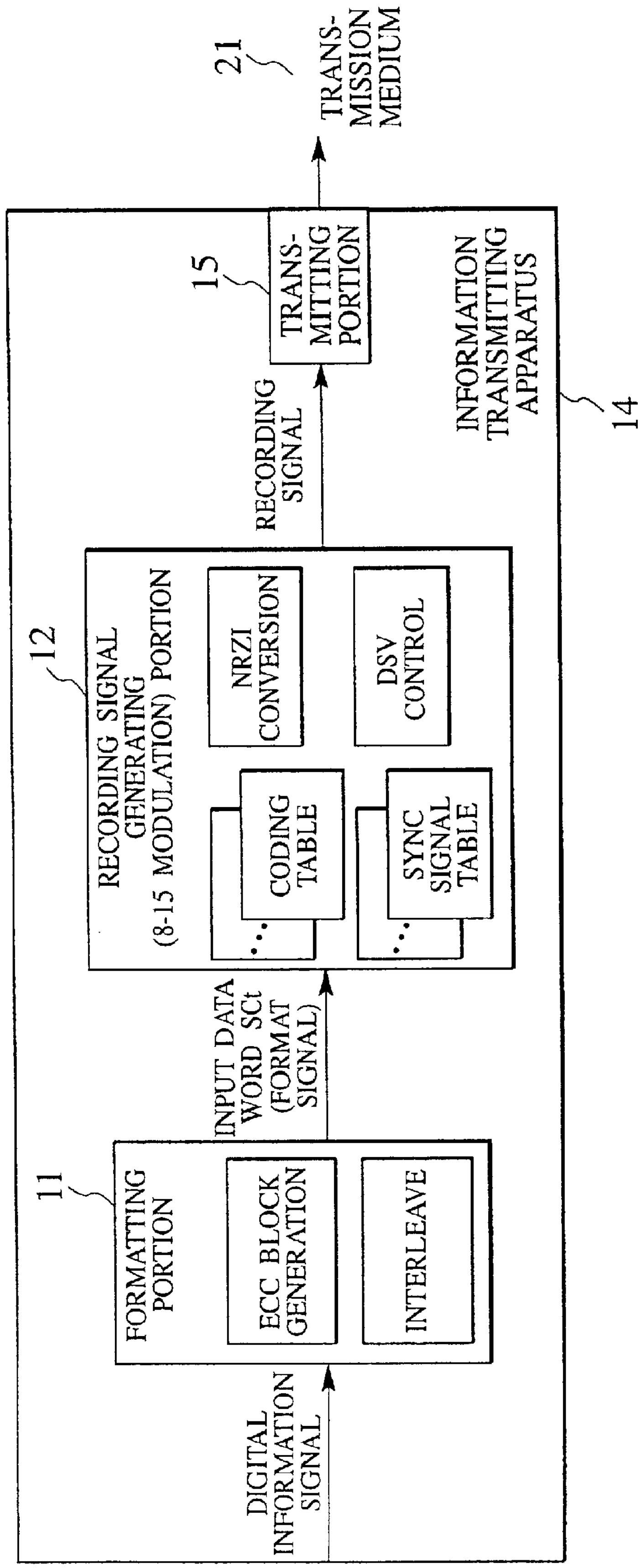
FIG. 26 is a block diagram showing an information transmitting apparatus to which one embodiment of the transmitting apparatus according to the present invention is applied.

FIG. 26 is a block diagram showing an information transmitting apparatus to which one embodiment of a transmitting apparatus according to the present invention is applied.

As shown in FIG. 26, an information transmitting apparatus 14 to which one embodiment of a synchronous signal generating method and transmitting apparatus according to the present invention is applied is generally constituted of a formatting portion 11, 8–15 modulator 12, and transmitting portion 15. The digital signal relating to the information such as an inputted image and sound is 8–15 modulated by the 8–15 modulator 12 via the formatting portion 11, and the 8–15 modulated signal is transmitted via radio or a cable from the transmitting portion 15, so that a transmission medium 21 according to the present invention is obtained.

In this case, the information transmitting apparatus (transmitting apparatus) 14 is the same as the disk recording apparatus (recording apparatus) 10 in the formatting portion 11 and 8–15 modulator 12, and is different only in the transmitting portion 15. Here, during transmission of the signal 8–15 modulated in the 8–15 modulator 12 in air (radio) or via a transmission cable (wire) from the transmitting portion 15, when conversion suitable for transmission is performed in the transmitting portion 15, a small data amount can be transmitted with a raised coding rate and without any error.

<Reproducing Method and Apparatus>

Figure 27:
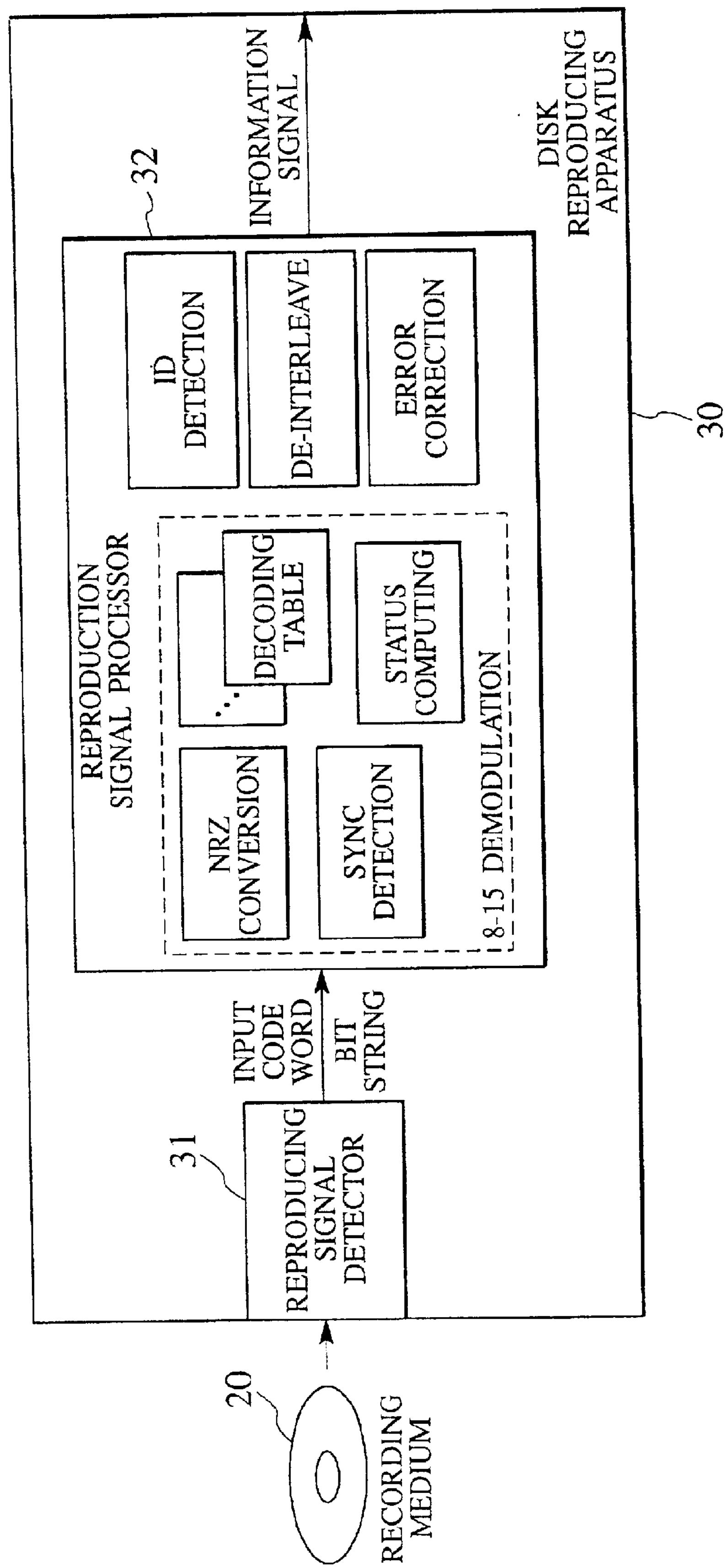
FIG. 27 is a block diagram showing a disk reproducing apparatus to which one embodiment of a reproducing method and apparatus according to the present invention are applied.

FIG. 27 is a block diagram showing a disk reproducing apparatus to which one embodiment of a reproducing method and apparatus according to the present invention are applied.

As shown in FIG. 27, a disk reproducing apparatus 30 to which one embodiment of the reproducing method and apparatus according to the present invention are applied is generally constituted of a reproduction signal detector 31 and reproduction signal processor 32. The apparatus reproduces the digital signal relating to the information such as the image and sound recorded in the recording medium 20 such as the optical disk and magnetic disk using the disk recording apparatus 10 described above with reference to FIG. 2. Therefore, compared with the disk recording apparatus 10 for subjecting the input information such as the image and sound to the 8–15 modulation and recording the information in the recording medium 20, the disk reproducing apparatus 30, upon reproducing signals from the recording medium 20, performs 8–15 demodulation as an operation reverse to the operation of the disk recording apparatus 10 and obtains output information such as the image and sound returned to a state before recording, as described later.

First, in the disk reproducing apparatus 30, the optical disk (recording medium 20) rotated by a spindle motor (not shown) is irradiated with a laser beam having a constant strength from an optical pickup (not shown). Thereby, a reflected light reflected by a signal recording surface of the optical disk 20 is incident upon the optical pickup and photoelectrically converted. The obtained read signal is supplied to the reproduction signal detector 31, subjected to signal processings such as RF amplification, waveform shaping, and bit PLL, and supplied as a binarized input code word bit string into the reproduction signal processor 32. In this case, a bit clock extracted by the bit PLL is also supplied to the reproduction signal processor 32, the input code word bit string is NRZ-converted based on the bit clock, and also a frame sink is detected to find out boundaries betweens respective data bytes (i.e., frame synchronization is accomplished). As described later, during frame synchronization by NRZ conversion and synchronous detection, after the synchronous pattern of the synchronous signal is detected, a frame position in a sector is detected by one or a plurality of specific codes. Thereby, sector synchronization is established after taking the frame synchronization. The reproduction signal subjected to the frame synchronization and the sector synchronization in this manner is 8–15 demodulated in the reproduction signal processor 32. Moreover, the reproduction signal to be 8–15 demodulated is constituted of some of the code words included in the synchronous pattern and the input code word bit string following the synchronous pattern.

Here, an operation of 8–15 demodulation in the reproduction signal processor 32 will be described as another main part of the present invention in detail with reference to FIGS. 28 to 30.

Figure 28:
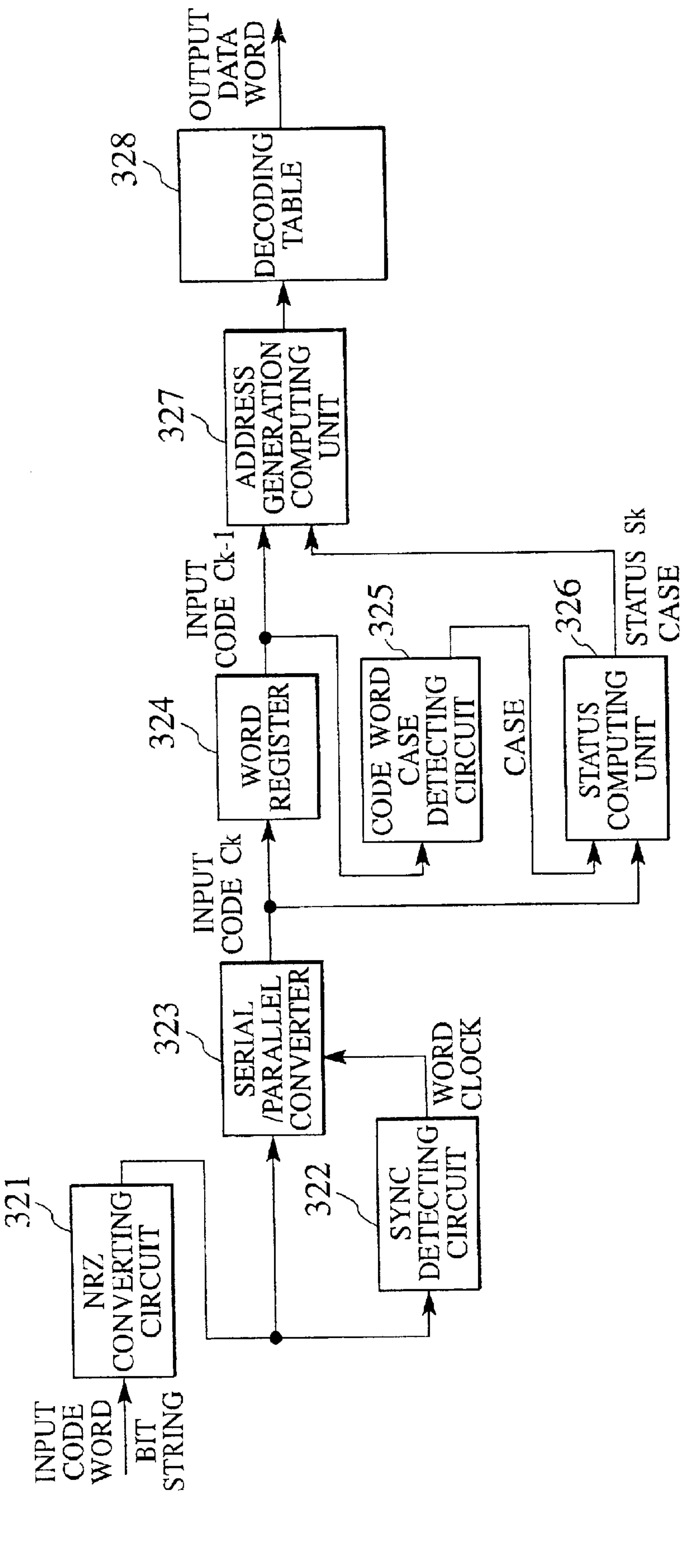
FIG. 28 is a block diagram showing a portion in which 8–15 demodulation is performed in a reproduction signal processor shown in FIG. 27.
Figure 29:
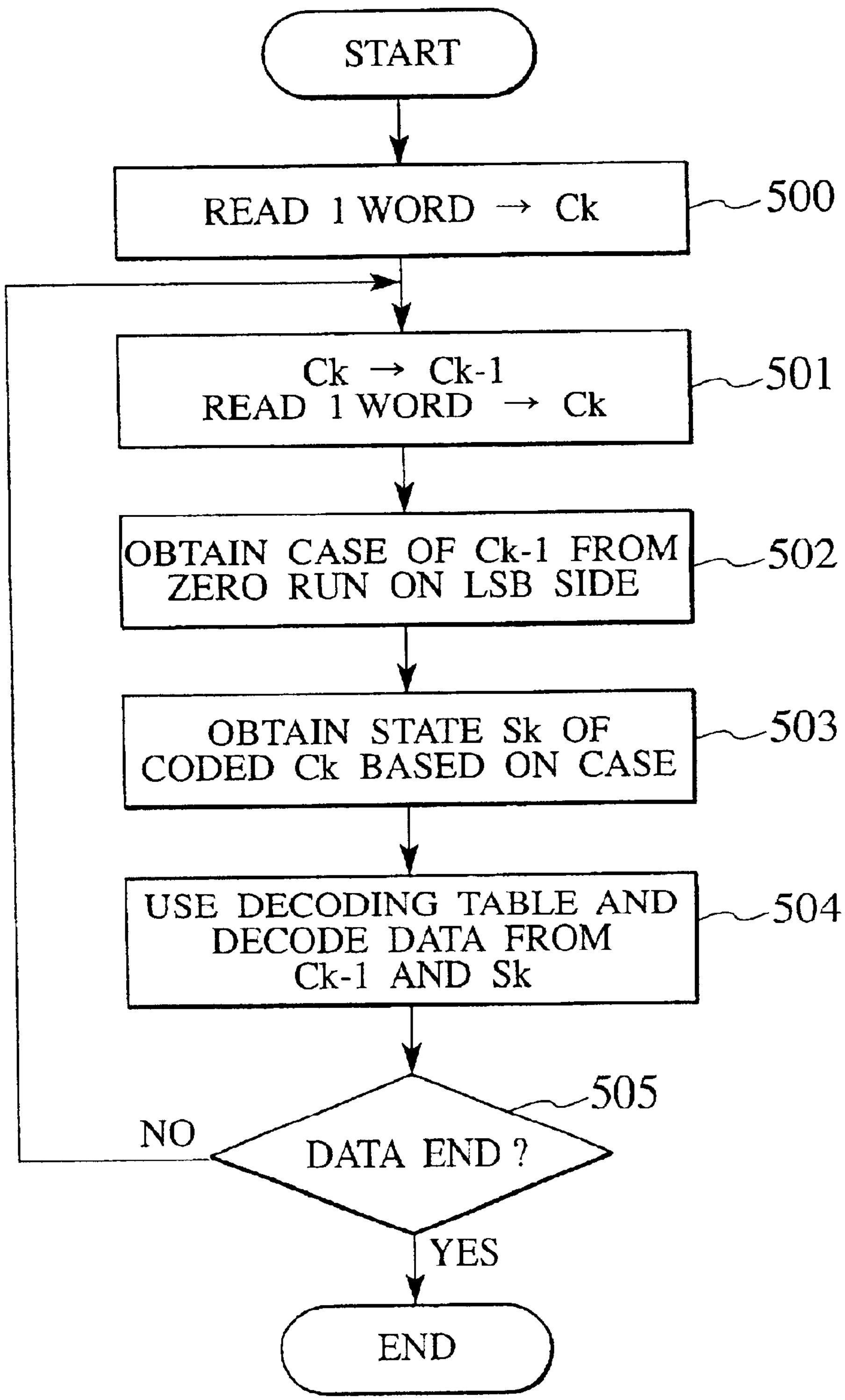
FIG. 29 is a flowchart of a time of 8–15 demodulation.

FIG. 28 is a block diagram showing a portion in which the 8–15 demodulation is performed in the reproduction signal processor shown in FIG. 27. FIG. 29 is a flowchart of a time of 8–15 demodulation. FIG. 30 is a diagram showing one example of a decoding table shown in FIG. 28.

As shown in FIG. 28, the portion in which the 8–15 demodulation is performed in the reproduction signal processor 32 is constituted of an NRZ converting circuit 321, synchronous detecting circuit 322, serial/parallel converter 323, word register 324, code word case detecting circuit 325, state computing unit 326, address generating computing unit 327, and decoding table 328.

In the reproduction signal processor 32, the input code word bit string outputted from the reproduction signal detector 31 (FIG. 27) is converted to an NRZ signal string by the NRZ converting circuit 321, and the converted NRZ signal string is inputted into the serial/parallel converter 323 and synchronous detecting circuit 322. Moreover, the synchronous detecting circuit 322 detects the synchronous pattern of the synchronous signal from the NRZ signal string, finds boundaries between respective words (i.e., the frame synchronization is accomplished), and outputs a word clock to the serial/parallel converter 323. After the synchronous pattern is detected, the frame position in the sector is detected by one or a plurality of specific codes of the synchronous signals so as to specify a top frame in the sector, and thus the sector synchronization is established. Here, as shown in FIG. 23, since the synchronous pattern includes the following code word, the word clock is generated so as to covert the NRZ signal string including a part of the synchronous pattern to a parallel code word. Moreover, the serial/parallel converter 323 converts a serial NRZ signal string to parallel input code words . . . , Ck−1, Ck, Ck+1, Ck+2, . . . based on the word clock, and these input code words . . . , Ck−1, Ck, Ck+1, Ck+2, . . . are inputted into the word register 324 and state computing unit 326 in a time series order. In this case, the input code word Ck of a reproducing time is equivalent to the output code word OC1t or OC2t obtained by modulating the 8-bit input data word SCt into the 15-bit word at a recording time.

Subsequently, the word register 324 inputs the previous input code word Ck−1 based on the word clock to the code word case detecting circuit 325 and address generating computing unit 327, respectively, the code word Ck−1 being delayed by one word (for 15 bits) with respect to a timing of the input code word Ck inputted in the register using an FIFO memory, or the like.

Next, in the code word case detecting circuit 325, case information of a coding time described above with reference to FIG. 20 is detected with respect to the previous input code word Ck−1, and the case information indicating a possible state of the input code word Ck to the plurality of coding tables 123 is inputted to the state computing unit 326.

Subsequently, the state computing unit 326 computes state information Sk with respect to the input code word Ck from the serial/parallel converter 323 based on the case information detected from the previous input code word Ck−1, and inputs the case information detected from the input code word Ck−1 and the state information Sk of the input code word Ck to the address generating computing unit 327. The address generating computing unit 327 outputs an address of the decode table 328 corresponding to the case information detected from the input code word Ck−1 and the state information Sk of the input code word Ck. The decode table 328 outputs an output data word Dk−1 corresponding to the input code word Ck−1 based on the address. Subsequently, this is repeated in the time series order and the output data word string is obtained.

The 8–15 demodulation will additionally be described in more detail.

With the aforementioned coding by the coding table shown in FIGS. 13 to 19, the input code words of the reproducing time Ck−1, Ck, Ck+1, . . . equivalent to the output code word string of the recording time OC1t−1 (or OC2t−1), OC1t (or OC2t), OC1t+1 (or OC2t+1), . . . can be grouped into five cases in accordance with the zero run length on the LSB side similarly as shown in FIG. 20, and the next possible state is determined by the case.

That is, the case information is detected from the input code word Ck−1. When the state information Sk obtained by coding the input code word Ck base on the case information is known, the output data word is univocally determined.

For example, the code word string inputted as the input code word bit string of the reproducing time and NRZ-converted by the NRZ converting circuit 321 is arranged in the time series order as shown in the following.

Ck−1: 000000000100000
Ck: 010010001000100
Ck+1: 100001000001000
Ck+2: 000010000000001

In this case, for the input code word Ck−1 of the bit string, since the zero run length on the LSB side is in a range of 2 to 6 from FIG. 20, the case information is 2. It is seen that the input code word Ck following the input code word Ck−1 is coded in any one of states "1", "3", "4", "5". Then, it is seen that with calculation by an equation using the following C language with respect to the input code word Ck based on the case information detected from the input code word Ck−1, the state information Sk of the input code word Ck is "4".

That is, the state computing unit 326 can compute and output the state information Sk of the input code word Ck following the input code word Ck−1 by the following equation using the C language based on the case information detected from the input code word Ck−1.

Equation Using C Language

```
if((Ck==8208)||(Ck==8224)||(Ck==8225)||(Ck==8256))flag=1;

if((Ck==8712)||(Ck==8720)||(Ck==8736)||(Ck==8777))flag=2;

if (Case==0){/*zero run of Ck-1 on LSB side=0*/

if((Ck&LT;=1024)||(Ck&GT;=4168)&AMP; &AMP;
   (Ck!4224)))Sk=0;

if((1025&LT;=Ck)&AMP; &AMP; (Ck&LT;=4164)||(Ck==
   4224))Sk=1;}

else if(Case==1){/*zero run of Ck-1 on LSB side=1*/

if((1025&LT;=Ck)&AMP; &AMP; (Ck&LT;=4164)||(Ck==
   4224))Sk=1;

if((Ck&LT; 585)||(Ck&GT;=8712)&AMP; &AMP; (flag!2)||(Ck==
   8704)||(flag==1))Sk=2;

if((Ck==1024)||((4168&LT;=Ck)&AMP; &AMP; (Ck&LT;=
   8708)&AMP; &AMP; (Ck!=4224)&AMP; &AMP; (Ck!=
   8704))&AMP; &AMP; (flag!=1)||(flag==2)Sk=3;}

else if(Case==2){/*zero run of Ck-1 on LSB side=2 to 6*/

if((1025&LT=Ck)&AMP; &AMP; (Ck&LT;=4164)||(Ck==
   4224))Sk=1;

if((Ck&LT; 1024)||(4168&LT;=Ck)&AMP; &AMP; (Ck&LT;=
   8708)&AMP; &AMP; (Ck!=4224)&AMP; &AMP; (Ck!=
   8704))||(flag==2)Sk=3;

if((Ck==8704)||(8712&LT;=Ck)&AMP; &AMP; (Ck&LT;=
   16900)&AMP; &AMP; (Ck!=16896)&AMP; &AMP; (flag!=
   2))||(flag==1))Sk=4;

if((Ck==16896)||(Ck&GT;=16904))Sk=5;}

else if(Case==3){/*zero run of Ck-1 on LSB side=7 or 8*/

if((Ck&LT; 1024)||(Ck==9216)||((4168&LT=Ck)&AMP; &AMP;
   (Ck& LT!;=8708)&AMP; &AMP; (Ck!=4224)&AMP; &AMP;
   (Ck!=8704))||(flag==2))Sk=3;

if((Ck==16896)||(Ck&GT;=16904))Sk=5;

if((Ck==8704)||((8712&LT=Ck)&AMP; &AMP; (Ck&LT;=
   16900)&AMP; &AMP; (Ck!=9216)&AMP; &AMP; (Ck!=
   16896)&AMP; &AMP; (flag!=2)) ||(flag==1)||(Ck==4224))Sk=
   4;}

else if(Case==4){/*zero run of Ck-1 on LSB side=9 or 10*/

if((Ck==8704)||((8712&LT=Ck)&AMP; &AMP; (Ck&LT;=
   16900)&AMP; &AMP; (Ck!=16896)&AMP; &AMP; (flag!=
   2))||(flag==1))Sk=4;

if ((Ck==16896)||(Ck&GT;=16904))Sk=5;}return Sk;
```

Thereafter, the output data word Dk−1 corresponding to the input code word Ck−1 from the decode table 328 shown in FIG. 30 is decoded based on the case information detected from the input code word Ck−1 and the state information Sk of the input code word Ck following the input code word Ck−1. In this case, the address generating computing unit 327 generates the address of the decode table 328 of FIG. 30, and can thereby output the output data word Dk−1 corresponding to the input code word Ck−1.

Additionally, in the decode table 328 shown in FIG. 30, the input code word Ck−1 and output data word Dk−1 are shown in the decimal number.

Therefore, the output data word Dk−1 corresponding to the input code word Ck−1: {000000000100000} is decoded as "0" from the state information Sk=4 of the input code word Ck, and input code word Ck−1=32 (decimal number) in the decode table 328 of FIG. 30. Thereafter, this is repeated in the time series order to perform the decoding, the output data word string is obtained. Subsequently, the decoded signal by the 8–15 decoded output data word string is subjected to ID detection and de-interleaving, further error correction is performed, and the formatted information signal is outputted.

The aforementioned 8–15 demodulation will briefly be described with reference to FIG. 28 and the flowchart of the 8–15 demodulation time shown in FIG. 29.

First in step 500, the input code words . . . , Ck−1, Ck, Ck+1, Ck+2, . . . from the serial/parallel converter 323 are taken into the word register 324 for each one word in the time series order.

Next in step 501, at the timing at which the word register 324 takes in the input code word Ck, the previous input code word Ck−1 delayed by one word (for 15 bits) is outputted to the code word case detecting circuit 325 and address generating computing unit 327.

Subsequently, in step 502, the code word case detecting circuit 325 detects the case information of the input code word Ck−1 from the zero run length of the input code word Ck−1 on the LSB side and outputs the information to the state computing unit 326.

Next in step 503, the state computing unit 326 obtains the state information Sk of the input code word Ck inputted therein based on the case information detected from the input code word Ck−1.

Subsequently in step 504, the address generating computing unit 327 uses the decoding table 328 shown in FIG. 30 to decode the output data word Dk−1 corresponding to the input code word Ck−1 with the case information detected from the input code word Ck−1 and the state information Sk of the input code word Ck.

Subsequently, it is judged in step 505 whether or not the data ends. When there is the next data (No), the flow returns to the step 501, and the steps 501 to 505 are repeated. On the other hand, when the data ends (Yes), the flow of the 8–15 demodulation time ends.

The operation for performing the processing in and after the 8–15 demodulation in the reproduction signal processor 32 will next be described in detail with reference to FIG. 31.

Figure 31:
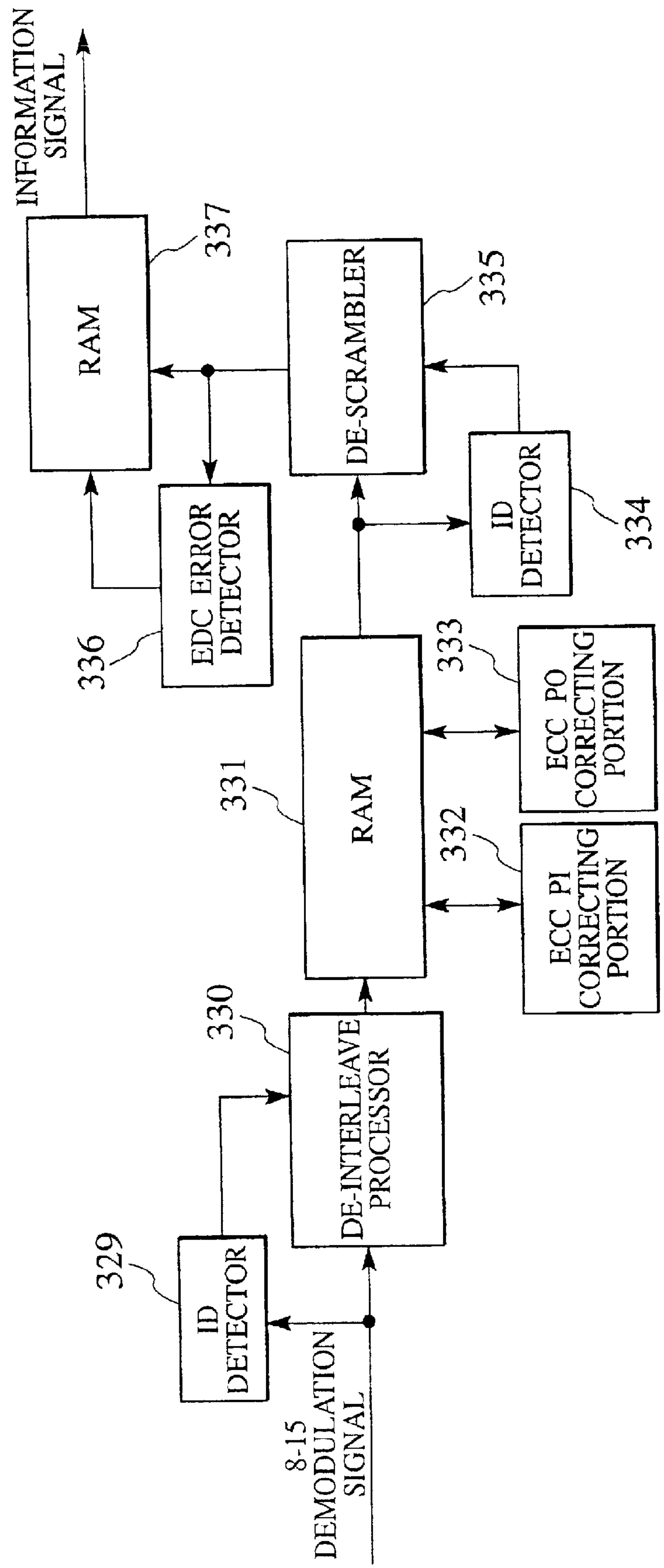
FIG. 31 is a block diagram showing a portion in which the 8–15 modulation and subsequent processing are performed in the reproduction signal processor shown in FIG. 27.

FIG. 31 is a block diagram showing a portion in which the 8–15 modulation and subsequent processing are performed in the reproduction signal processor shown in FIG. 27.

As shown in FIG. 31, the portion in which the 8–15 modulation and subsequent processing are performed in the reproduction signal processor 32 is constituted of a first ID detector 329, de-interleave processor 330, first RAM 331, ECC PI correcting portion 332, ECC PO correcting portion 333, second ID detector 334, de-scrambler 335, EDC error detector 336, and second RAM 337.

First, the demodulated signals constituted of the output data word string 8–15 demodulated by the aforementioned constituting members of FIG. 28 are supplied to the first ID detector 329 and de-interleave processor 330. Here, ID in the demodulated signal includes the sector address of three bits, an address value of the sector address is constituted to increase by one for each sector of the ECC block constituted of 32 sectors, and the address changes by an ECC block unit.

The first ID detector 329 detects the ID from the demodulated signal, and supplies the sector address in the ID to a servo controller (not shown) so that the address is used in a seek operation of an optical disk driving time. In this case, when the demodulated signal is not from the sector address of the optical disk 20 desired by a user, the servo controller performs the seek operation for transporting the optical pickup to the desired sector address position of the optical disk 20 and performing reproduction. When the sector address is desired, the de-interleave processor 330 de-interleaves and writes the reproduced signal into the first RAM 331. In this case, the signal is written into the first RAM 331 from a top sector of the top ECC block of the two ECC blocks. This is because, if the ECC blocks are not matched, the ECC blocks are not completed, and error correction cannot be performed. The top sector of the ECC block can be detected when lower five bits of the sector address is "00000B".

Subsequently, every time the data for at least one line (182 bytes) is accumulated in the first RAM 331, the ECC PI correcting portion 332 read the data from the first RAM 331 in the row direction of a memory map, uses the PI parity to perform the error correction, and writes the corrected data into the first RAM 331.

Next, after PI correction of all the rows of the ECC block is performed, and the corrected data is written into the first RAM 331, the ECC PO correcting portion 333 starts the PO correction. In this case, 208 bytes of data of the ECC block are read from the first RAM 331 in the column direction of the memory map, and the PO parity is used to perform the PO correction. After the PO correction of all the columns, that is, 364 bytes is performed, the second ID detector 334 and de-scrambler 335 successively access first sector data, that is, 2064 bytes including ID, IED, CPR_MAI, main data, and EDC parity, and reads the data from the first RAM 331.

Subsequently, the second ID detector 334 again detects the ID from the data read from the first RAM 331, and supplies the sector address to the de-scrambler 335. Moreover, the de-scrambler 335 uses the sector address inputted from the second ID detector 334, and de-scrambles 2048 bytes of the main data in the data read from the first RAM 331.

Subsequently, the data de-scrambled by the de-scrambler 335 is supplied to the EDC error detector 336, and the EDC error detector 336 judges whether or not there is an error. Here, the EDC error detector 336 inputs a detection result indicating the absence of the error into the second RAM 337 so that the data de-scrambled by the de-scrambler 335 is written in the second RAM 337. When there is an error, a detection result indicating the presence of the error is inputted into the second RAM 337, writing of the second RAM 337 is stopped, a command is sent to the servo controller so as to read the same data from the optical disk 20 again, and the optical pickup is moved in order to access the desired sector address again. Such operation is generally called retry.

In actual, when the EDC error detector 336 detects the error, the de-scrambled data for one sector is already written in the second RAM 337. Therefore, when there is an error, it is necessary to return a writing address pointer of the second RAM 337 by one sector. The data written in the second RAM 337 is constituted by detecting the auxiliary information including the sector address and the parity by the product code from the output data word string and reconstituting the ECC block. After the reconstitution, the data is outputted as information signals such as an image signal and sound signal. Additionally, de-interleaving may be performed after the first RAM 331 is read.

<Receiving Apparatus>

FIG. 32 is a block diagram showing an information receiving apparatus to which one embodiment of the receiving apparatus according to the present invention is applied.

As shown in FIG. 32, an information receiving apparatus 33 to which one embodiment of the receiving apparatus according to the present invention is applied is generally constituted of a receiving portion 34, and reproduction signal processor 32. The apparatus reproduces the digital signal relating to the information such as the image and sound transmitted via the transmission medium 21 by radio or by cable using the information transmitting apparatus 14 described above with reference to FIG. 26.

In this case, the information receiving apparatus 33 is different from the disk reproducing apparatus 30 described above with reference to FIG. 27 only in the receiving portion 34, and the reproduction signal processor 32 is the same. Here, the receiving portion 34 receives the transmission medium 21 transmitted in air or via the transmission cable from the information transmitting apparatus 14 of FIG. 26, and the data received by the receiving portion 34 is converted to a form capable of being demodulated in the reproduction signal processor 32. Thereby, the transmission signal from the transmission medium 21 can be reproduced with a small data amount and without any error.

It should be understood that many modifications and adaptations of the invention will become apparent to those skilled in the art and it is intended to encompass such obvious modifications and changes in the scope of the claims appended hereto.

What is claimed is:

1. A recording method for using a plurality of coding tables to subject an input data word of 8 bits to 8–15 modulation and to thereby obtain a code word of 15 bits, in which said plurality of coding tables store the code words corresponding to the respective input data words, and state information indicating the coding table for use in modulating a next input data word to obtain a next code word satisfying a predetermined run length restriction rule even with the next code word coupled directly with the code word, and a recording signal generated by inserting a synchronous signal for decoding reproduction data into every predetermined number of code words in a string of the code words satisfying said predetermined run length restriction rule and to be outputted is outputted on a recording medium side or a transmission medium side, said method comprising:

adding auxiliary information including a sector address and a parity by a product code to said input data word continuously inputted to constitute an ECC block;

subjecting said input data word in a format signal formatted in a predetermined format with respect to the ECC block to the 8–15 modulation to generate a string of code words satisfying said predetermined run length restriction rule; and inserting the synchronous signal including a bit pattern longer than a maximum run length of said predetermined run length restriction rule into every predetermined number of code words to generate the recording signal.

2. The recording method according to claim 1 further comprising:

setting an n ($n \geqq 1$) consecutive ECC blocks as a set; and repeating a processing for all rows of the respective ECC blocks, said processing comprising successively switching and arranging respective r-th rows of the respective ECC blocks and subsequently successively switching and arranging respective (r+1)-th rows in such a manner that respective first rows of the respective ECC blocks of the set are successively arranged on said recording medium or said transmission medium, and respective second rows are successively recorded/arranged.

3. The recording method according to claim 1, further comprising:

setting two consecutive ECC blocks as a set; and repeating a processing for all rows of said two ECC blocks of each set, said processing comprising alternately switching odd-numbered data of a first row of one ECC block of the set and even-numbered data of a first row of the other ECC block by a data unit and arranging the data on said recording medium or said transmission medium, and subsequently alternately switching even-numbered data of the first row of one ECC block and odd-numbered data of the first row of the other ECC block by the data unit and arranging the data on said recording medium or said transmission medium.

* * * * *